(12) United States Patent
Yamamoto et al.

(10) Patent No.: US 7,932,471 B2
(45) Date of Patent: Apr. 26, 2011

(54) CAPACITOR FOR INCORPORATION IN WIRING BOARD, WIRING BOARD, METHOD OF MANUFACTURING WIRING BOARD, AND CERAMIC CHIP FOR EMBEDMENT

(75) Inventors: Hiroshi Yamamoto, Konan (JP); Toshitake Seki, Komaki (JP); Shinji Yuri, Kasugai (JP); Masaki Muramatsu, Komaki (JP); Motohiko Sato, Konan (JP); Kazuhiro Hayashi, Komaki (JP); Jun Otsuka, Konan (JP); Manabu Sato, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 887 days.

(21) Appl. No.: 11/498,785

(22) Filed: Aug. 4, 2006

(65) Prior Publication Data

US 2007/0030628 A1 Feb. 8, 2007

(30) Foreign Application Priority Data

Aug. 5, 2005 (JP) ................ P.2005-228936
Aug. 5, 2005 (JP) ................ P.2005-228937
Sep. 14, 2005 (JP) ................ P.2005-267592
May 25, 2006 (JP) ................ P.2006-145724
May 25, 2006 (JP) ................ P.2006-145725

(51) Int. Cl.
*H05K 1/16* (2006.01)

(52) U.S. Cl. ..... 174/260; 361/761; 361/763; 361/306.1; 361/330; 361/792

(58) Field of Classification Search .......... 174/255, 174/260; 361/321.2, 761, 763, 766, 792, 361/760, 306.1, 303, 311
See application file for complete search history.

(56) References Cited

U.S. PATENT DOCUMENTS

| | | | | |
|---|---|---|---|---|
| 3,691,628 A | * | 9/1972 | Kim et al. | 29/832 |
| 5,982,033 A | * | 11/1999 | Ohsawa et al. | 257/737 |
| 6,407,907 B1 | | 6/2002 | Ahiko et al. | |
| 6,577,486 B1 | * | 6/2003 | Nishimiya et al. | 361/104 |
| 6,979,890 B2 | | 12/2005 | Kambe et al. | |
| 7,050,288 B2 | * | 5/2006 | Ahiko et al. | 361/303 |
| 7,505,247 B2 | * | 3/2009 | Lee | 361/303 |
| 2002/0031879 A1 | * | 3/2002 | Itoh et al. | 438/183 |
| 2004/0021158 A1 | * | 2/2004 | Mikawa et al. | 257/295 |
| 2004/0055693 A1 | | 3/2004 | Maekawa et al. | |

(Continued)

FOREIGN PATENT DOCUMENTS

JP 7-326536 A 12/1995

(Continued)

*Primary Examiner* — Tuan T Dinh
*Assistant Examiner* — Andargie M Aychillhum
(74) *Attorney, Agent, or Firm* — Sughrue Mion, PLLC

(57) ABSTRACT

A capacitor comprising: a capacitor body including a plurality of laminated dielectric layers, a plurality of inner electrode layers which are respectively disposed between mutually adjacent ones of the dielectric layers, a first main surface located in a laminated direction of the dielectric layers, and a second main surface opposite to the first main surface; a first outer electrode formed on the first main surface of the capacitor body and electrically connected to the inner electrode layers; a second outer electrode formed on the second main surface of the capacitor body and electrically connected to the inner electrode layers; a first dummy electrode formed on the first main surface of the capacitor body; and a second dummy electrode formed on the second main surface of the capacitor body.

44 Claims, 25 Drawing Sheets

U.S. PATENT DOCUMENTS

| | | | |
|---|---|---|---|
| 2004/0160750 A1* | 8/2004 | Masuko | 361/761 |
| 2004/0168824 A1 | 9/2004 | Sekido | |
| 2005/0007724 A1* | 1/2005 | Murakami et al. | 361/321.2 |
| 2005/0012217 A1* | 1/2005 | Mori et al. | 257/758 |
| 2005/0207091 A1 | 9/2005 | Kambe et al. | |
| 2006/0081977 A1* | 4/2006 | Sakai et al. | 257/703 |
| 2007/0095563 A1 | 5/2007 | Sekido | |

FOREIGN PATENT DOCUMENTS

| | | |
|---|---|---|
| JP | 10-112417 A | 4/1998 |
| JP | 2000-022329 A | 1/2000 |
| JP | 2000-077850 A | 3/2000 |
| JP | 2001-189234 A | 7/2001 |
| JP | 2004-48714 A | 2/2004 |
| JP | 2004-228190 A | 8/2004 |
| JP | 2004-0266074 A | 9/2004 |
| JP | 2004-304178 A | 10/2004 |
| JP | 2005-39217 A | 2/2005 |
| JP | 2005-39243 A | 2/2005 |
| JP | 2005-072558 A | 3/2005 |
| JP | 2005-086071 A | 3/2005 |
| JP | 2005-191243 A | 7/2005 |
| JP | 2005-210036 | 8/2005 |

* cited by examiner

CAPACITOR FOR INCORPORATION IN WIRING BOARD, WIRING BOARD, METHOD OF MANUFACTURING WIRING BOARD, AND CERAMIC CHIP FOR EMBEDMENT

BACKGROUND OF THE INVENTION

1. Field of the Invention

The present invention relates to a capacitor for incorporation in a wiring board and a wiring board having the same. Furthermore, the present invention concerns a wiring board having a structure in which a ceramic chip for embedment is embedded in an accommodating hole portion of a board core, and a buildup layer is formed by being laminated on its surface, as well as a method of manufacturing the same, and a ceramic chip for embedment.

2. Description of the Related Art

In recent years, the speed of the operation of semiconductor chips is becoming increasingly higher due to advancement in the integrated circuit technology. In conjunction with this trend, there are cases where noise is superimposed on the power source wiring and the like, possibly resulting in erroneous operation. Accordingly, a capacitor is mounted on an upper surface or a lower surface of a wiring board on which the semiconductor chip is mounted, so as to eliminate the noise.

With the above-described technique, however, since it is necessary to mount the capacitor separately after the completion of the wiring board, the number of processes disadvantageously increases. In addition, there is a need to secure in advance a region where the capacitor is mounted on the wiring board, so that the freedom of the layout of other electronic components declines. Furthermore, because the region where the capacitor is mounted on the wiring board is restricted by other wiring and the like, the wiring distance between the capacitor and the semiconductor chip becomes long, so that the wiring resistance and inductance become disadvantageously large.

For these reasons, a technique for incorporating the capacitor in the wiring board has been proposed. Here, the interior of an insulating layer formed on a core board is considered as one possible place where the capacitor is disposed in this technique, since the wiring resistance and inductance can be reduced further if the capacitor is brought close to the semiconductor chip.

In this case, however, it becomes important to ensure adhesion between the capacitor and the insulating layer, but since a ceramic is exposed in large portions of the obverse surface and the reverse surface of a conventional capacitor, the adhesion between the capacitor and the insulating layer is insufficient. As a result, a gap is created between the capacitor and the insulating layer due to delamination and the like, possibly causing faulty conduction.

It should be noted a technique has been disclosed in which a capacitor is incorporated in the insulating layer formed on a substrate, but there has been no disclosure as to the adhesion between the capacitor and the insulating layer and means for improving the adhesion (e.g., refer to JP-A-2004-228190).

Semiconductor integrated circuit devices (IC chips) used in CPUs of computers in recent years tend to be characterized by increasingly higher speed and higher functions, and the number of terminals tends to increase and the pitch between the terminals tends to become narrower correspondingly. Generally, a multiplicity of terminals are densely arranged in array form on the bottom surface of the IC chip, and such terminal groups are connected to terminal groups on the motherboard side in flip chip form. However, since there is a large difference in the terminal pitch between the terminal groups on the IC chip side and the terminal groups on the motherboard side, it is difficult to directly connect the IC chip onto the motherboard. For this reason, a technique is generally adopted in which the IC chip is mounted on a wiring board for IC chip mounting, and the wiring board for IC chip mounting is mounted on the motherboard. As the wiring board for IC chip mounting of this type, those have hitherto been proposed in which a ceramic chip is embedded in a core board formed of a polymeric material to form a core portion, and buildup layers are respectively formed on the obverse surface and the reverse surface of the core portion (e.g., refer to JP-A-2005-39217 and JP-A-2005-39243).

The above-described conventional wiring board for IC chip mounting is manufactured, for instance, in the following procedure. First, a board core is prepared which is formed of a polymeric material and has accommodating hole portions which are respectively open in both the obverse surface and the reverse surface of the core. Also, a ceramic chip for embedment is prepared in which a plurality of terminal electrodes are projectingly provided on the obverse surface and the reverse surface, respectively, of the chip. Next, a taping step is carried out in which an adhesive tape is attached to the reverse surface side of the core, and the opening on the core reverse surface side of the accommodating hole portion is sealed in advance. Then, an accommodation step for accommodating the ceramic chip for embedment in the accommodating hole portion is carried out, and the reverse surface of the chip is attached to the adhesive surface of the adhesive tape to temporarily fix it. Then, a fixing step is carried out in which a filler is filled in the gaps between inner surfaces of the accommodating hole portion and side surfaces of the ceramic chip for embedment, and is subsequently cured, thereby fixing the ceramic chip for embedment in the board core. Subsequently, the formation of an interlayer insulating layer having a polymeric material as a principal constituent and the formation of a conductor layer are alternately performed on each of the obverse surface and the reverse surface of the core portion which is constituted by the board core and the ceramic chip for embedment, thereby forming the buildup layers. As a result, a desired wiring board for IC chip mounting can be obtained.

3. Problems to be Solved by the Invention

The present invention has been devised to overcome the above-described problems, and an object of the invention is to provide a capacitor for incorporation in a wiring board which makes it possible to reduce faulty conduction in the case where the capacitor is incorporated in the wiring board, as well as a wiring board incorporating this capacitor for incorporation in a wiring board.

In the case of the above-cited JP-A-2005-39217 and JP-A-2005-39243, the obverse surface of the ceramic chip is exposed on the obverse surface of the core portion, while the reverse surface of the ceramic chip is exposed on the reverse surface of the core portion. For this reason, a portion of the interlayer insulating layer constituting the buildup layer is formed on not only the board core but also the ceramic chip. However, in the case of the above-described conventional wiring board for IC chip mounting, it is difficult to ensure high adhesive strength between the interlayer insulating layer and the ceramic chip which constitute the buildup layer. Accordingly, there is a possibility of the occurrence of the lifting up or delamination of the buildup layer, so that there has been a problem in that high reliability cannot be imparted. Particularly in recent years, the amount of heat generated tends to increase in conjunction with trends toward high-speed and high-function IC chips, and therefore the effect of thermal stress imparted to the buildup layer also tends to increase. Hence, the circumstances are such that the lifting up or delamination of the buildup layer is more likely to occur.

In addition, in the case of the above-described conventional technique, since a plurality of terminal electrodes are projectingly provided, irregularities are produced on the obverse surface and the reverse surface of the ceramic chip. However, there has been a problem in that if such irregularities are present, the effect of these irregularities affects the obverse surface of the buildup layer, and the flatness declines, thereby making it difficult to mount the IC chip.

The present invention has also been devised in view of the above-described problem, and another object of the invention is to provide a wiring board excelling in the adhesive strength between the interlayer insulating layer and the ceramic chip for embedment which constitute the buildup layer, as well as a method of manufacturing the same. A still another object of the invention is to provide a ceramic chip for embedment suitable for use in a wiring board.

SUMMARY OF THE INVENTION

In accordance with a first aspect of the invention there is provided a capacitor for incorporation in a wiring board, comprising: a capacitor body including a plurality of laminated dielectric layers, a plurality of inner electrode layers which are respectively disposed between mutually adjacent ones of the dielectric layers, a first main surface located in a laminated direction of the dielectric layers, and a second main surface opposite to the first main surface; a first outer electrode formed on the first main surface of the capacitor body and electrically connected to the inner electrode layers; a second outer electrode formed arbitrarily on the second main surface of the capacitor body and electrically connected to the inner electrode layers; a first dummy electrode formed on the first main surface of the capacitor body; and a second dummy electrode formed on the second main surface of the capacitor body. It should be noted that the second dummy electrode is arbitrarily provided in a case where the second outer electrode is provided.

In accordance with a second aspect of the invention there is provided a capacitor for incorporation in a wiring board, comprising: a capacitor body including a plurality of laminated dielectric layers, a plurality of inner electrode layers which are respectively disposed between mutually adjacent ones of the dielectric layers, a first main surface located in a laminated direction of the dielectric layers, and a second main surface opposite to the first main surface; a first outer electrode formed on the first main surface of the capacitor body and electrically connected to the inner electrode layers, an area of a surface of the first outer electrode being not less than 45% and not more than 90% of an area of the first main surface; and a second outer electrode formed on the second main surface of the capacitor body and electrically connected to the inner electrode layers, an area of a surface of the second outer electrode being not less than 45% and not more than 90% of an area of the second main surface.

In accordance with a third aspect of the invention there is provided a wiring board comprising: a wiring board body; a buildup layer which is formed on the wiring board body and on which a plurality of insulating layers and a plurality of wiring layers are alternately formed; and the capacitor for incorporation in a wiring board according to the first or second aspect of the invention.

According to the capacitor for incorporation in a wiring board in accordance with the first aspect of the invention, since the first dummy electrode is formed on the first main surface of the capacitor for incorporation in a wiring board, and the second dummy electrode is formed on the second main surface thereof, it is possible to reduce faulty conduction and improve the reliability of the wiring board in the case where the dummy electrode is formed on the first main surface of the capacitor for incorporation in a wiring board is incorporated in the wiring board.

According to the capacitor for incorporation in a wiring board in accordance with the second aspect of the invention, since the first outer electrode whose surface area is not less than 45% and not more than 90% of the area of the first main surface is formed on the first main surface of the capacitor body, and the second outer electrode whose surface area is not less than 45% and not more than 90% of the area of the second main surface is formed on the second main surface thereof, it is possible to reduce faulty conduction and improve the reliability of the wiring board in the case where the dummy electrode is formed on the first main surface of the capacitor for incorporation in a wiring board is incorporated in the wiring board.

According to the wiring board in accordance with the third aspect of the invention, since the wiring board has incorporated therein the capacitor for incorporation in a wiring board according to the first or the second aspect of the invention, it is possible to reduce faulty conduction.

As the wiring board (means 1) having incorporated therein the capacitor for incorporation in a wiring board according to the first aspect of the invention, it is possible to cite a wiring board comprising: a board core having a core main surface and an accommodating hole portion which is open at the core main surface; a ceramic chip for embedment including a ceramic sintered body having a chip main surface, inner conductors formed in an interior of the ceramic sintered body, a plurality of terminal electrodes provided projectingly on the chip main surface and constituted by metallized layers conducting with the inner conductors, and a dummy metallized layer provided projectingly on the chip main surface, the ceramic chip for embedment being accommodated in the accommodating hole portion in a state in which the core main surface and the chip main surface are opposed to a same side; and a buildup layer having a structure in which an interlayer insulating layer and a conductor layer are alternately laminated on the core main surface and the chip main surface.

Therefore, according to the wiring board of the means 1, as a result of the fact that the dummy metallized layer in addition to the plurality of terminal electrodes is provided on the chip main surface, the proportion of metal portions at the bonding interface with the interlayer insulating layer constituting the buildup layer becomes large, so that the adhesive strength with respect to the interlayer insulating layer improves. In addition, since irregularities on the chip main surface are overcome to some extent, the flatness of the surface of the buildup layer improves, allowing the semiconductor integrated circuit device to be easily mounted thereon.

The dummy metallized layer for constituting the wiring board is projectingly provided on the chip main surface where the plurality of terminal electrodes are not provided. It should be noted that in the case of a ceramic chip in which the plurality of terminal electrodes are present on the reverse surface of the chip, a similar dummy metallized layer may be projectingly provided on the chip reverse surface where the plurality of terminal electrodes are not provided.

As a metal for constituting the dummy metallized layer, it is possible to use, for instance, nickel, molybdenum, tungsten, titanium, copper, and silver. In particular, it is suitable to use a metal material of the same kind as that of the plurality of terminal electrodes constituted by the metallized layers. If this construction is adopted, it becomes possible to form the plurality of terminal electrodes and the dummy metallized layer simultaneously in the same process, so that the number of processes decreases, making it possible to easily attain low cost.

The thickness of each of the plurality of terminal electrodes and the dummy metallized layer is not particularly limited, but may preferably be set to be not less than 10 µm and not more than 100 µm or thereabouts. Namely, if this thickness is less than 10 µm, the degree of irregularity on the obverse surface and the reverse surface of the ceramic chip becomes small, and the problem of "a decline in the flatness of the surface of the buildup layer," which is one of the problems to be overcome by the invention, becomes difficult to occur. On the other hand, if this thickness exceeds 100 µm, although it is possible to attain improvement in the adhesive strength between the interlayer insulating layer and the ceramic chip for embedment by the adoption of the construction of the invention, there is a possibility that the improvement in the flatness of the surface of the buildup layer cannot be sufficiently attained. Incidentally, a predetermined amount of clearance should preferably be provided between each of the plurality of terminal electrodes and the dummy metallized layer, specifically by 150 µm or more.

The surfaces of the plurality of terminal electrodes and the dummy metallized layer should preferably be coarser than the chip main surface of the ceramic sintered body. Namely, this is because in the case where the construction of the invention is adopted, the proportion of coarse surfaces on the ceramic chip side at the bonding interface with the interlayer insulating layer becomes large, so that the adhesive strength with respect to the interlayer insulating layer can be improved over the conventional construction.

A metal layer constituted of a metal softer than a metal constituting the plurality of terminal electrodes and the dummy metallized layer should desirably be formed on the surface of each of the plurality of terminal electrodes and the dummy metallized layer. The reason is as follows. Namely, since the plurality of terminal electrodes and the dummy metallized layer constituted by the metallized layers are both sintered metal layers and are relatively hard, it is extremely difficult to directly coarsen their surfaces by using an etchant or the like. Accordingly, if a soft metal layer is formed, and its layer is surface-coarsened, a desired coarse surface can be obtained relatively simply and reliably. Here, the surface roughness Ra of the metal layer should preferably be not less than 0.2 µm, more particularly not less than 0.2 µm and not more than 1.0 µm. Unless the surface roughness Ra of the metal layer is in this range, the surface becomes not much different from the roughness of the chip main surface of the ceramic sintered body, and even if the dummy metallized layer is provided, improvement in the adhesive strength cannot be sufficiently attained.

In this case, the material of the metal layer is appropriately selected depending on the kind of the plurality of terminal electrodes and the dummy metallized layer. For example, in a case where the plurality of terminal electrodes and the dummy metallized layer are formed of nickel, it is suitable to select a copper layer (particularly a copper plating layer) as the metal layer. The reason is that if such a combination is adopted, it is possible to form the coarse surface more simply and reliably than in the case where nickel is directly surface-coarsened. The copper plating layer in this case should preferably be formed with a thickness of 5 µm or more for safety's sake by taking into account the removed portion based on coarsening treatment. It should be noted that, as a technique for forming the soft metal layer, the aforementioned plating method is suitable for the reasons of simplicity and low cost. However, apart from the plating method, it is possible to adopt other techniques such as sputtering, CVD, and vacuum deposition.

The distance between adjacent ones of the plurality of terminal electrodes is not particularly limited, but may preferably be not more than 200 µm, for example. If this distance exceeds 200 µm, the area of the exposed portions of the ceramic in the chip main surface increases, so that the proportion of coarse surfaces at the bonding interface unfavorably becomes small. In contrast, if the distance is not more than 200 µm, the proportion of coarse surfaces at the bonding interface does not become small, so that it is possible to contribute to the improvement in the adhesive strength between the ceramic chip and the interlayer insulating layer. However, a predetermined amount of clearance is desirably provided between adjacent ones of the plurality of terminal electrodes to prevent a short-circuiting, specifically this distance is preferably set to 150 µm or more.

In addition, the distance between each of the plurality of terminal electrodes and the dummy metallized layer is not particularly limited, either, but may preferably be not more than 200 µm, for example. If this distance exceeds 200 µm, the area of the exposed portions of the ceramic in the chip main surface increases, so that the proportion of coarse surfaces at the bonding interface unfavorably becomes small. In contrast, if the distance is not more than 200 µm, the proportion of coarse surfaces at the bonding interface does not become very small, so that it is possible to contribute to the improvement in the adhesive strength between the ceramic chip and the interlayer insulating layer. Incidentally, the distance from a chip edge of the ceramic chip for embedment to each of the plurality of dummy metallized layers is not particularly limited, either, but may preferably be, for example, not more than 200 µm for the same reason. Since the smaller this distance, the better, the terminal electrodes may be formed up to the chip edge.

The occupying area of an exposed portion of a ceramic in the chip main surface (i.e., the closely adhered portion between the ceramic and the interlayer insulating layer) is preferably not less than 10% and not more than 55%, more preferably not less than 20% and not more than 45%, of the area of the chip main surface. The reason is that, by setting this area in this range, the improvement in the adhesive strength can be easily attained.

Recessed portions which are respectively formed between the adjacent ones of the plurality of terminal electrodes and between each of the plurality of terminal electrodes and the dummy metallized layer on the chip main surface are preferably filled by the interlayer insulating layer. The reason is that, according to this construction, since the area of contact between the ceramic chip and the interlayer insulating layer increases, the adhesive strength between the ceramic chip and the interlayer insulating layer can be improved.

As a suitable method (means 2) for manufacturing the wiring board according to the means 1, it is possible to cite a method of manufacturing a wiring board, comprising the steps of: preparing the board core having the accommodating hole portion and the ceramic chip for embedment with the metal layer formed on each of the plurality of terminal electrodes and the dummy metallized layer; fixing the ceramic chip for embedment by accommodating the ceramic chip for embedment in the accommodating hole portion and by filling a gap between an inner surface of the accommodating hole portion and a side surface of the ceramic chip for embedment with a filler in this state; coarsening a surface of the metal layer; and forming the buildup layer on the core main surface and the chip main surface after the coarsening step.

Therefore, according to this manufacturing method, the surfaces of the metallized layers provided on the plurality of terminal electrodes and the dummy metallized layer are coarsened by coarsening treatment with respect to the ceramic chip for embedment fixed in the board core. By performing the step of forming the buildup layer after such coarsening, it is possible to form interlayer insulating layers of the buildup layer on the coarsened metal layers, thereby making it possible to obtain high adhesive strength. In addition, since,
instead of directly coarsening the plurality of terminal electrodes and the dummy metallized layer which are constituted of a hard metal, additional metal layers are respectively formed thereon, and these layers are surface-coarsened. Therefore, it is possible to obtain desired coarse surfaces relatively easily and reliably.

Hereafter, a description will be given of the method of manufacturing the wiring board.

In the preparing step, the board core having the accommodating hole portion and the ceramic chip for embedment in which the metal layer has been formed on each of the plurality of terminal electrodes and the dummy metallized layer are respectively fabricated by conventionally known techniques, and are prepared in advance.

In the subsequent fixing step, the ceramic chip for embedment is accommodated in the accommodating hole portion. In this case, if the accommodating hole portion is a through hole portion, the core reverse surface-side opening of the accommodating hole portion may be sealed by an exfoliable pressure sensitive adhesive tape. The ceramic chip for embedment is adhered and temporarily fixed to a pressure sensitive adhesive surface of such a pressure sensitive adhesive tape. In this state, a filler made of a polymeric material is filled into gaps between the inner surfaces of the accommodating hole portion and the side surfaces of the ceramic chip for embedment. A thermosetting resin is suitable as the filler, and in the case where the thermosetting resin is used, heat treatment is carried out after the filling. As a result, the ceramic chip for embedment is fixed in the accommodating hole portion by the cured filler. In the case where the pressure sensitive adhesive tape is used, the tape may be peeled off at this point of time.

In the coarsening step, the coarsening of the surfaces of the metal layers on the outer terminal electrodes and the dummy metallized layer is performed. It should be noted that the coarsening step can be carried out before or after the fixing step, but is preferably carried out after the fixing step. In addition, in the case where the conductor layers are formed on the core main surface of the board core, it is preferable to perform the coarsening of these conductor layers and the coarsening of the metal layers. The reason is that the number of processes decreases and productivity improves as compared with the case in which coarsening is carried out separately.

In addition, as another means (means 3) for overcoming the problems of the invention, it is possible to cite a ceramic chip for embedment which is a ceramic chip for use in a state of being embedded in a board core formed of a polymeric material as a principal constituent, comprising: a plate-like ceramic sintered body having a chip main surface; inner conductors formed in an interior of the ceramic sintered body; a plurality of terminal electrodes provided projectingly on the chip main surface and constituted by metallized layers conducting with the inner conductors; and a dummy metallized layer provided projectingly on the chip main surface.

Therefore, according to the ceramic chip for embedment of the means 3, as a result of the fact that the dummy metallized layer in addition to the plurality of terminal electrodes is provided on the chip main surface, the proportion of metal portions becomes large. Hence, even in the case where an interlayer insulating layer constituting the buildup layer is joined, for example, the adhesive strength with respect to the interlayer insulating layer improves. In addition, since irregularities on the chip main surface are overcome to some extent, the flatness of the surface of the buildup layer improves, allowing the semiconductor integrated circuit device to be easily mounted thereon.

In the ceramic chip of the above-described means 3, surfaces of the plurality of terminal electrodes and the dummy metallized layer may be coarser than the chip main surface of the ceramic sintered body. A metal layer constituted of a metal softer than a metal constituting the plurality of terminal electrodes and the dummy metallized layer may be formed on the surface of each of the plurality of terminal electrodes and the dummy metallized layer, and the surface roughness Ra of the metal layer may be not less than 0.2 µm. In this case, the metal layer may be a copper plating layer. In addition, the ceramic chip may be a ceramic capacitor having a structure in which first inner electrode layers and second inner electrode layers are alternately laminated and arranged via a ceramic dielectric layer. The distance between adjacent ones of the plurality of terminal electrodes and the distance between each of the plurality of terminal electrodes and the dummy metallized layer may be set to not more than 200 µm. In addition, the occupying area of an exposed portion of a ceramic in the chip main surface may be set to not less than 10% and not more than 55% of the area of the chip main surface.

As the wiring board (means 4) having incorporated therein the capacitor for incorporation in a wiring board according to the second aspect of the invention, it is possible to cite a wiring board comprising: a board core having a core main surface and an accommodating hole portion which is open at the core main surface; a ceramic chip for embedment including a ceramic sintered body having a chip main surface, inner conductors formed in an interior of the ceramic sintered body, and a plurality of terminal electrodes provided projectingly on the chip main surface and constituted by metallized layers conducting with the inner conductors, the ceramic chip for embedment being accommodated in the accommodating hole portion in a state in which the core main surface and the chip main surface are opposed to a same side; and a buildup layer in which an interlayer insulating layer and a conductor layer are alternately laminated on the core main surface and the chip main surface, wherein an occupying area of the plurality of terminal electrodes which are present on the chip main surface is not less than 45% and not more than 90% of an area of the chip main surface.

Therefore, according to the wiring board of the means 4, as a result of the fact that the occupying area of the plurality of terminal electrodes is set to not less than 45% and not more than 90% of the area of the chip main surface, the proportion of metal portions at the bonding interface with the interlayer insulating layer constituting the buildup layer becomes large, so that the adhesive strength with respect to the interlayer insulating layer improves. If the aforementioned area is less than 50%, the proportion of the metal portions at the aforementioned bonding interface does not become very large, so that the adhesive strength cannot be improved sufficiently. On the other hand, if this area is greater than 90%, the clearance between the terminal electrodes becomes too small, so that the possibility of a short-circuiting between the adjacent terminal electrodes becomes high. In addition, since irregularities on the chip main surface are overcome to some extent, the flatness of the surface of the buildup layer improves, allowing the semiconductor integrated circuit device to be easily mounted thereon.

The board core constituting the wiring board in the above-described means 1 and means 4 forms a portion of the core portion in the wiring board, and is formed into the shape of a plate having, for example, the core main surface and the core reverse surface located on its opposite side. Such a board core has one or two or more accommodating hole portions for accommodating the ceramic chip(s) for embedment. This accommodating hole portion may be non-through hole which is open only at the core main surface, or a through hole which is open at both the core main surface and the core reverse surface. It should be noted that the ceramic chip for embedment may be accommodated in such a manner as to be embedded completely in the accommodating hole portion, or may be accommodated in a state in which it projects partially.

The material for forming the board core is not particularly limited, but a preferred board core is formed of a polymeric material as a principal constituent. As specific examples of the polymeric material for forming the board core, it is possible to cite, for example, EP resin (epoxy resin), PI resin (polyimide resin), BT resin (bismaleimide-triazine resin), PPE resin (polyphenylene ether resin), and the like. In addition, it is possible to use a composite material made of these resins and glass fibers (a glass woven fabrics and a glass nonwoven fabric) or organic fibers such as polyamide fibers.

The ceramic chip for embedment constituting the wiring board in the above-described means 1 and means 4 is a ceramic sintered body having a chip main surface, and is preferably a plate-like ceramic sintered body having the core main surface and the core reverse surface located on its opposite side. The ceramic chip for embedment is accommodated in the accommodating hole portion in a state in which the core main surface and the chip main surface are opposed to the same side. In addition, in such an accommodated state, the ceramic chip for embedment is fixed by a filler made of such as a polymeric material. As the ceramic sintered body, sintered bodies of high-temperature sintered ceramics, such as alumina, aluminum nitride, boron nitride, silicon carbide, and silicon nitride, are suitably used. In addition, sintered bodies of low-temperature sintered ceramics, such as a glass ceramic in which an inorganic ceramic filler of such as alumina is added to borosilicate glass or borosilicate lead glass, are suitably used. In this case, it is also preferable to use a sintered body of a dielectric ceramic such as barium titanate, lead titanate, and strontium titanate, depending on the application. In the case where the sintered body of a dielectric ceramic is used, a ceramic capacitor having a large electrostatic capacity becomes easily realizable.

Inner conductors are formed in the interior of the ceramic sintered body. The material for forming these inner conductors are not particularly limited, but the use of a metal which can be sintered simultaneously with the ceramic, e.g., nickel, molybdenum, tungsten, and titanium, is suitable. It should be noted that in the case where a sintered body of a low-temperature sintered ceramic is selected, the use of copper and silver becomes further possible as the material for forming the inner conductors. The inner conductors may be via conductors extending in the thicknesswise direction of the ceramic sintered body, or may be inner conductor layers extending in the planar direction of the ceramic sintered body.

A plurality of terminal electrodes constituted by metallized layers conducting with the inner conductors are projectingly provided on the chip main surface of the ceramic sintered body. Similarly, a plurality of terminal electrodes constituted by metallized layers conducting with the inner conductors may also be projectingly provided on the chip reverse surface of the ceramic sintered body. These pluralities of terminal electrodes are formed by using a metal material suitable for metallization, such as nickel, molybdenum, tungsten, and titanium.

Here, the ceramic chip for embedment may be a ceramic capacitor having a structure in which first inner electrode layers and second inner electrode layers are alternately laminated and arranged via a ceramic dielectric layer. In the case where the ceramic chip for embedment to which the function of a capacitor is thus imparted is used, it is possible to reliably lower the stray inductance since the ceramic chip for embedment is disposed in the vicinity of the semiconductor integrated circuit device, for example. Therefore, the semiconductor integrated circuit device can be operated stably. The ceramic capacitor referred to herein includes a capacitor in which a thin film is formed on a substrate (a substrate not limited to a ceramic) by a ceramic material.

The buildup layer for constituting the wiring board of the above-described means 1 and means 4 has a structure in which interlayer insulating layers formed of a polymeric material as a principal constituent and conductor layers are alternately connected. The buildup layer may be formed only on one surface of the core portion (i.e., only on the core main surface and the chip main surface), or may be formed on both surfaces of the core portion (i.e., on the core main surface and the chip main surface and on the core reverse surface and the chip reverse surface). It should be noted that as for the buildup layer formed on the core main surface and the chip main surface, a semiconductor device mounting portion is provided on its obverse surface in a region corresponding to the ceramic chip. Since a semiconductor device can be mounted on such a semiconductor device mounting portion, it is possible to make small a difference in the coefficient of thermal expansion with respect to the semiconductor device as compared with the case where the semiconductor device mounting portion is provided on the board core. Accordingly, the structure provided is such that the effect of thermal stress acting on the semiconductor device can be easily alleviated.

The thickness of each of the plurality of terminal electrodes is not particularly limited, but may preferably be set to be not less than 10 μm and not more than 100 μm or thereabouts. Namely, if this thickness is less than 10 μm, the degree of irregularity on the obverse surface and the reverse surface of the ceramic chip becomes small, and the problem of "a decline in the flatness of the surface of the buildup layer," which is one of the problems to be overcome by the invention, becomes difficult to occur. On the other hand, if this thickness exceeds 100 μm, although it is possible to attain improvement in the adhesive strength between the interlayer insulating layer and the ceramic chip for embedment by the adoption of the construction of the invention, there is a possibility that the improvement in the flatness of the surface of the buildup layer cannot be sufficiently attained.

The surfaces of the plurality of terminal electrodes should preferably be coarser than the chip main surface of the ceramic sintered body. Namely, this is because in the case where the construction of the invention is adopted, the proportion of coarse surfaces on the ceramic chip side at the bonding interface with the interlayer insulating layer becomes large, so that the adhesive strength with respect to the interlayer insulating layer can be improved over the conventional construction.

In addition, the outer shape of each of the plurality of terminal electrodes, as viewed in the direction toward the chip main surface, may be any one of a substantially rectangular shape, a substantially circular shape, and a substantially triangular shape, but should preferably be a substantially rectangular shape, for example. If such a construction is provided, the clearance between the terminal electrodes becomes small when the plurality of terminal electrodes are disposed in close proximity to each other, so that the occupying area of the plurality of terminal electrodes can be easily made large relative to the area of the chip main surface. Hence, the proportion of the metal portions at the bonding interface with the interlayer insulating layer constituting the buildup layer becomes far larger, thereby further improving the adhesive strength with respect to the interlayer insulating layer.

A metal layer constituted of a metal softer than a metal constituting the plurality of terminal electrodes should desirably be formed on the surface of each of the plurality of terminal electrodes. The reason is as follows. Namely, since the plurality of terminal electrodes constituted by the metallized layers are sintered metal layers and are relatively hard, it is extremely difficult to directly coarsen their surfaces by using an etchant or the like. Accordingly, if a soft metal layer is formed, and its layer is surface-coarsened, a desired coarse surface can be obtained relatively simply and reliably. Here, the surface roughness Ra of the metal layer should preferably be not less than 0.2 µm, more particularly not less than 0.2 µm and not more than 1.0 µm. Unless the surface roughness Ra of the metal layer is in this range, the surface becomes not much different from the roughness of the chip main surface of the ceramic sintered body, and even if the occupying area of the plurality of terminal electrodes is set to not less than 45% and not more than 90% of the area of the chip main surface, improvement in the adhesive strength cannot be sufficiently attained.

In this case, the material of the metal layer is appropriately selected depending on the kind of the plurality of terminal electrodes. For example, in a case where the plurality of terminal electrodes are formed of nickel, it is suitable to select a copper layer (particularly a copper plating layer) as the metal layer. The reason is that if such a combination is adopted, it is possible to form the coarse surface more simply and reliably than in the case where nickel is directly surface-coarsened. The copper plating layer in this case should preferably be formed with a thickness of 5 µm or more for safety's sake by taking into account the removed portion based on coarsening treatment. It should be noted that, as a technique for forming the soft metal layer, the aforementioned plating method is suitable for the reasons of simplicity and low cost. However, apart from the plating method, it is possible to adopt other techniques such as sputtering, CVD, and vacuum deposition.

The distance from a chip edge to each of the plurality of terminal electrodes is not particularly limited, but may preferably be not more than 200 µm, for example. If this distance exceeds 200 µm, the area of the exposed portions of the ceramic in the chip main surface increases, so that the proportion of coarse surfaces at the bonding interface unfavorably becomes small. In contrast, if the distance is not more than 200 µm, the proportion of coarse surfaces at the bonding interface does not become very small, so that it is possible to contribute to the improvement in the adhesive strength between the ceramic chip and the interlayer insulating layer. Since the smaller this distance, the better, the terminal electrodes may be formed up to the chip edge.

The distance between adjacent ones of the plurality of terminal electrodes is not particularly limited, but may preferably be not more than 200 µm, for example. If this distance exceeds 200 µm, the area of the exposed portions of the ceramic in the chip main surface increases, so that the proportion of coarse surfaces at the bonding interface unfavorably becomes small. In contrast, if the distance is not more than 200 µm, the proportion of coarse surfaces at the bonding interface does not become small, so that it is possible to contribute to the improvement in the adhesive strength between the ceramic chip and the interlayer insulating layer. However, a predetermined amount of clearance is desirably provided between adjacent ones of the plurality of terminal electrodes to prevent a short-circuiting, specifically this distance is preferably set to 150 µm or more.

The occupying area of an exposed portion of a ceramic in the chip main surface (i.e., the closely adhered portion between the ceramic and the interlayer insulating layer) is preferably not less than 10% and not more than 55%, more preferably not less than 20% and not more than 45%, of the area of the chip main surface. The reason is that, by setting this area in this range, the improvement in the adhesive strength can be easily attained.

Recessed portions which are respectively formed between the adjacent ones of the plurality of terminal electrodes on the chip main surface are preferably filled by the interlayer insulating layer. The reason is that, according to this construction, since the area of contact between the ceramic chip and the interlayer insulating layer increases, the adhesive strength between the ceramic chip and the interlayer insulating layer can be improved.

As a suitable method (means 5) for manufacturing the wiring board according to the means 4, it is possible to cite a method of manufacturing the wiring board according to the means 5, comprising the steps of: preparing the board core having the accommodating hole portion and the ceramic chip for embedment with the metal layer formed on each of the plurality of terminal electrodes which are set such that an occupying area thereof becomes not less than 45% and not more than 90% of the area of the chip main surface; fixing the ceramic chip for embedment by accommodating the ceramic chip for embedment in the accommodating hole portion and by filling a gap between an inner surface of the accommodating hole portion and a side surface of the ceramic chip for embedment with a filler in this state; coarsening a surface of the metal layer; and forming the buildup layer on the core main surface and the chip main surface after the coarsening step.

Therefore, according to this manufacturing method, the surfaces of the metallized layers provided on the plurality of terminal electrodes are coarsened by coarsening treatment with respect to the ceramic chip for embedment fixed in the board core. By performing the step of forming the buildup layer after such coarsening, it is possible to form interlayer insulating layers of the buildup layer on the coarsened metal layers, thereby making it possible to obtain high adhesive strength. In addition, since, instead of directly coarsening the plurality of terminal electrodes which are constituted of a hard metal, additional metal layers are respectively formed thereon, and these layers are surface-coarsened. Therefore, it is possible to obtain desired coarse surfaces relatively easily and reliably.

Hereafter, a description will be given of the method of manufacturing the wiring board.

In the preparing step, the board core having the accommodating hole portion and the ceramic chip for embedment in which the metal layer has been formed on each of the plurality of terminal electrodes are respectively fabricated by conventionally known techniques, and are prepared in advance.

In the subsequent fixing step, the ceramic chip for embedment is accommodated in the accommodating hole portion. In this case, if the accommodating hole portion is a through hole portion, the core reverse surface-side opening of the accommodating hole portion may be sealed by an exfoliable pressure sensitive adhesive tape. The ceramic chip for embedment is adhered and temporarily fixed to a pressure sensitive adhesive surface of such a pressure sensitive adhesive tape. In this state, a filler made of a polymeric material is filled into gaps between the inner surfaces of the accommodating hole portion and the side surfaces of the ceramic chip for embedment. A thermosetting resin is suitable as the filler, and in the case where the thermosetting resin is used, heat treatment is carried out after the filling. As a result, the ceramic chip for embedment is fixed in the accommodating hole portion by the cured filler. In the case where the pressure sensitive adhesive tape is used, the tape may be peeled off at this point of time.

In the coarsening step, the coarsening of the surfaces of the metal layers on the outer terminal electrodes is performed. It should be noted that the coarsening step can be carried out before or after the fixing step, but is preferably carried out after the fixing step. In addition, in the case where the conductor layers are formed on the core main surface of the board core, it is preferable to perform the coarsening of these conductor layers and the coarsening of the metal layers. The reason is that the number of processes decreases and productivity improves as compared with the case in which coarsening is carried out separately.

In addition, as another means (means 6) for overcoming the problems of the invention, it is possible to cite a ceramic chip for embedment which is a ceramic chip for use in a state of being embedded in a board core formed of a polymeric material as a principal constituent, comprising: a plate-like ceramic sintered body having a chip main surface; inner conductors formed in an interior of the ceramic sintered body; and a plurality of terminal electrodes provided projectingly on the chip main surface and constituted by metallized layers conducting with the inner conductors, wherein an occupying area of the plurality of terminal electrodes which are present on the chip main surface is not less than 45% and not more than 90% of an area of the chip main surface.

Therefore, according to the ceramic chip for embedment of the means 6, as a result of the fact that the occupying area of the plurality of terminal electrodes is set to be not less than 45% and not more than 90% of the area of the chip main surface, the proportion of metal portions becomes large. Hence, even in the case where an interlayer insulating layer constituting the buildup layer is joined, for example, the adhesive strength with respect to the interlayer insulating layer improves. In addition, since irregularities on the chip main surface are overcome to some extent, the flatness of the surface of the buildup layer improves, allowing the semiconductor integrated circuit device to be easily mounted thereon.

In the ceramic chip of the above-described means 6, surfaces of the plurality of terminal electrodes may be coarser than the chip main surface of the ceramic sintered body. A metal layer constituted of a metal softer than a metal constituting the plurality of terminal electrodes may be formed on the surface of each of the plurality of terminal electrodes, and the surface roughness Ra of the metal layer may be not less than 0.2 μm. In particular, the metal layer may preferably be a copper plating layer. In addition, the outer shape of each of the plurality of terminal electrodes, as viewed in the direction toward the chip main surface, may be a substantially rectangular shape. The ceramic chip of the above-described means 6 may be a ceramic capacitor having a structure in which first inner electrode layers and second inner electrode layers are alternately laminated and arranged via a ceramic dielectric layer. Furthermore, the distance from the chip edge to each of the plurality of terminal electrodes may be set to not more than 200 μm, and the distance between adjacent ones of the plurality of terminal electrodes may be set to not more than 200 μm. The occupying area of the exposed portion of the ceramic in the chip main surface may be set to not less than 10% and not more than 55% of the area of the chip main surface.

Figure 1:
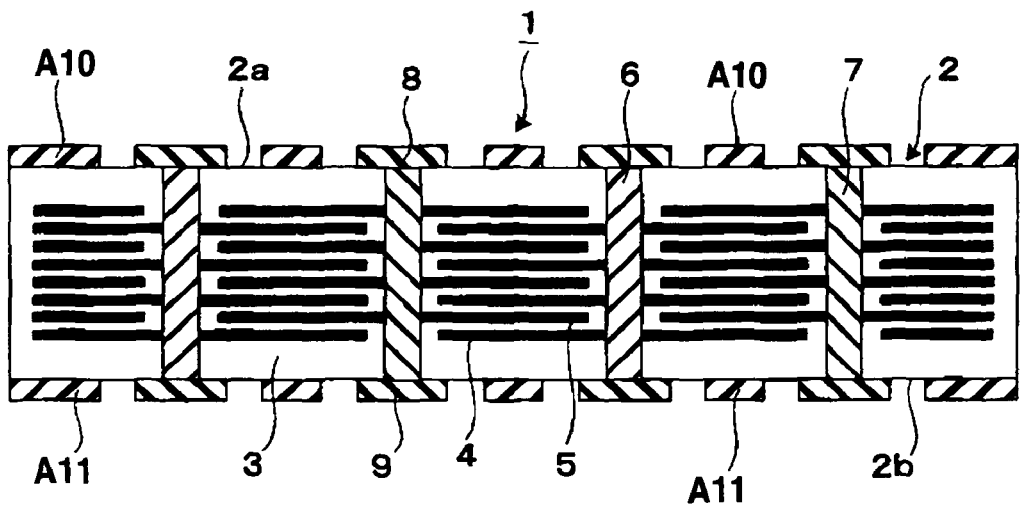
FIG. 1 is a schematic vertical cross-sectional view of a capacitor for incorporation in a wiring board in accordance with a first embodiment.

Reference numerals used to identify various structural features in the drawings include the following.
1: capacitor
3: ceramic layer
4, 5: inner electrode layers
8, 9: outer electrodes
A10, A11: dummy electrodes
A40: wiring board
A41: core board
A42, A43: buildup layers
A44-A47, A50-A52: insulating layers
10, 10A, 10B, 10C, 10', 10B': wiring boards
11, 11B, 11C: board cores
12: upper surface serving as a core main surface
31: buildup layer
33, 35: resin insulating layers serving as interlayer insulating layers
42: conductor layer
91: accommodating hole portion
92: filler
101, 101A, 101C, 101D, 101E, 101F, 101', 101C', 101D', 101E', 101F': ceramic capacitors serving as ceramic chips for embedment
102, 212: upper surfaces serving as chip main surfaces
104: ceramic sintered body
105: ceramic dielectric layer
106: side surface of the ceramic chip for embedment
111, 112: first outer terminal electrodes serving as terminal electrodes
116: metallized layer
117: copper plating layer serving as a metal layer
118: dummy metallized layer
131, 132: via conductors serving as inner conductors
141: first inner electrode layer serving as an inner conductor
142: second inner electrode layer serving as an inner conductor
201: ceramic chip serving as the ceramic chip for embedment
L1: distance (between adjacent ones of the plurality of terminal electrodes)
L2: distance (from a chip edge to each of the plurality of terminal electrodes)
L3: distance (between a dummy metallized layer and each of a plurality of terminal electrodes)

DETAILED DESCRIPTION OF THE INVENTION

First Embodiment

Figure 2:
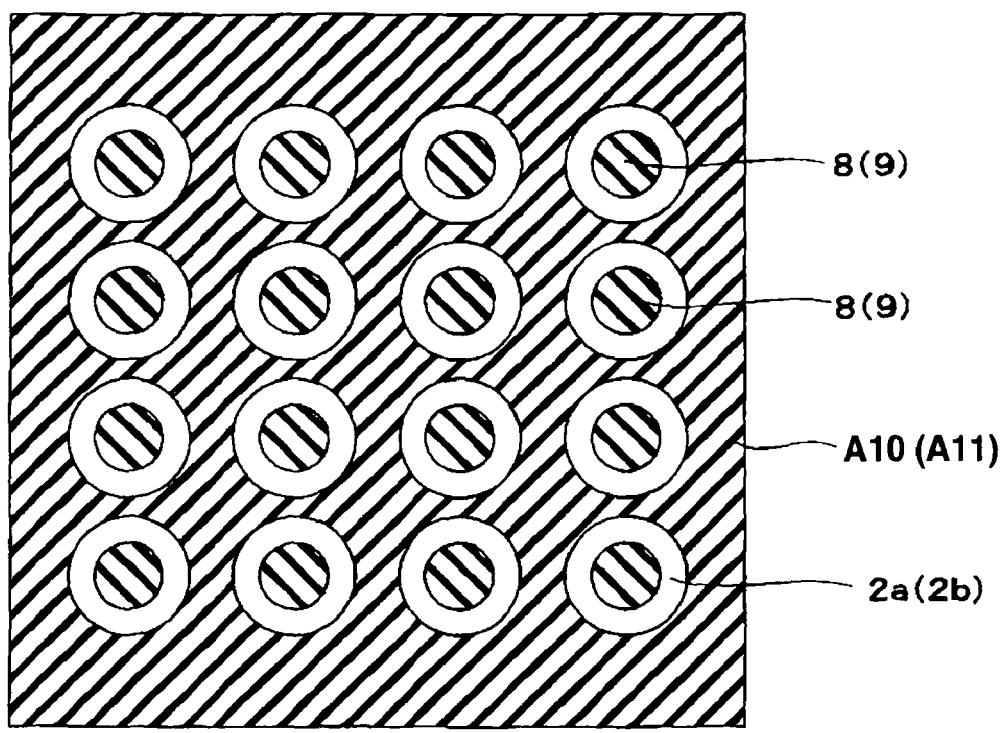
FIG. 2 is a schematic plan view of the capacitor for incorporation in a wiring board in accordance with the first embodiment.
Figure 3A:
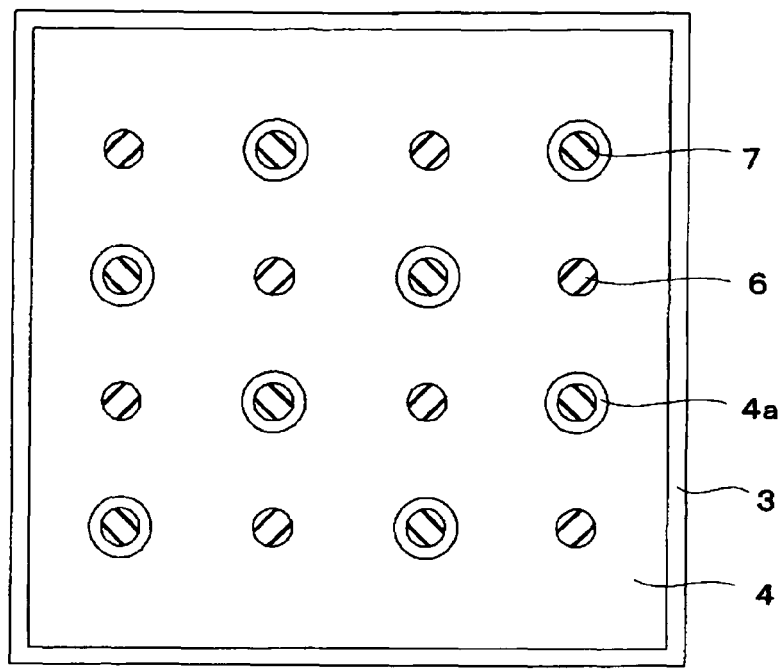
FIGS. 3A and 3B are schematic horizontal cross-sectional views of the capacitor for incorporation in a wiring board in accordance with the first embodiment.
Figure 3B:
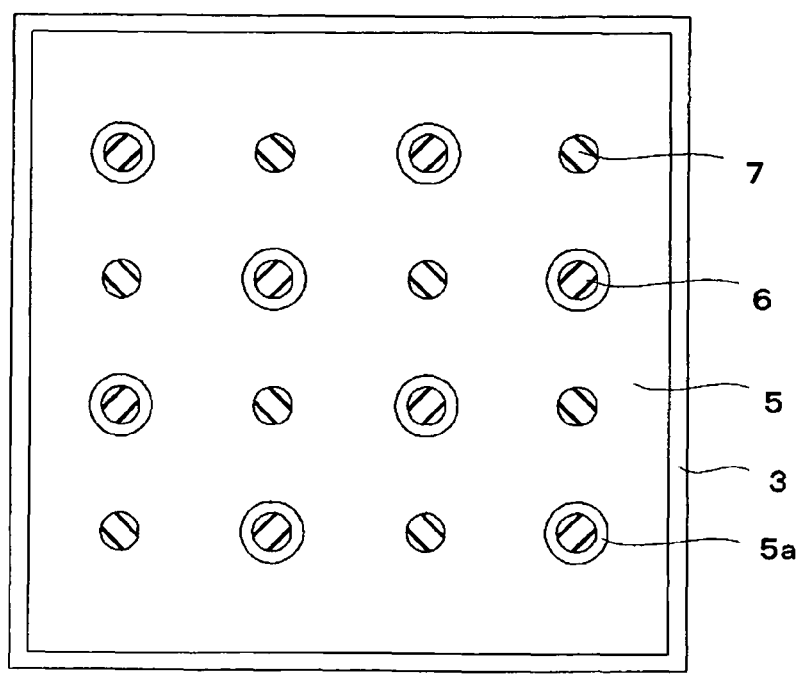

Referring now to the drawings, a description will be given of a first embodiment of the invention. FIG. 1 is a schematic vertical cross-sectional view of a capacitor for incorporation in a wiring board in accordance with this embodiment. FIG. 2 is a schematic plan view of the capacitor for incorporation in a wiring board in accordance with this embodiment. FIGS. 3A and 3B are schematic horizontal cross-sectional views of the capacitor for incorporation in a wiring board in accordance with this embodiment.

A capacitor 1 for incorporation in a wiring board (hereafter, simply the "capacitor") shown in FIGS. 1 to 3B is a laminated capacitor formed in the shape of a rectangular parallelepiped. The capacitor 1 has a capacitor body 2 constituting the core of the capacitor 1. The capacitor body 2 is comprised of a plurality of ceramic layers 3 (dielectric layers) laminated in the vertical direction, as well as pluralities of inner electrode layers 4 and 5 each disposed between adjacent ones of the ceramic layers 3.

The ceramic layers 3 are constituted of a ceramic material such as a high dielectric constant ceramic, e.g., barium titanate ($BaTiO_3$).

The inner electrode layers (first inner electrodes) 4 and the inner electrode layers (second inner electrodes) 5 are arranged alternately via the ceramic layer 3 in the laminated direction of the ceramic layers 3. The inner electrode layers 4 and the inner electrode layers 5 are electrically insulated from each other by the ceramic layer 3.

The total numbers of the inner electrode layers 4 and 5 are 10 or thereabouts. The inner electrode layers 4 and 5 are mainly constituted of an electrically conductive material such as Ni, but may contain a ceramic material similar to the ceramic material constituting the ceramic layers 3. The thickness of each of the inner electrode layers 4 and 5 is 2 μm or less, for example.

Via conductors 6 and 7 are formed in the capacitor body 2 in such a manner as to penetrate the capacitor body 2 from a first main surface 2a located in the laminated direction of the dielectric layers 3 to a second main surface 2b opposite to the first main surface 2a.

Figure 6:
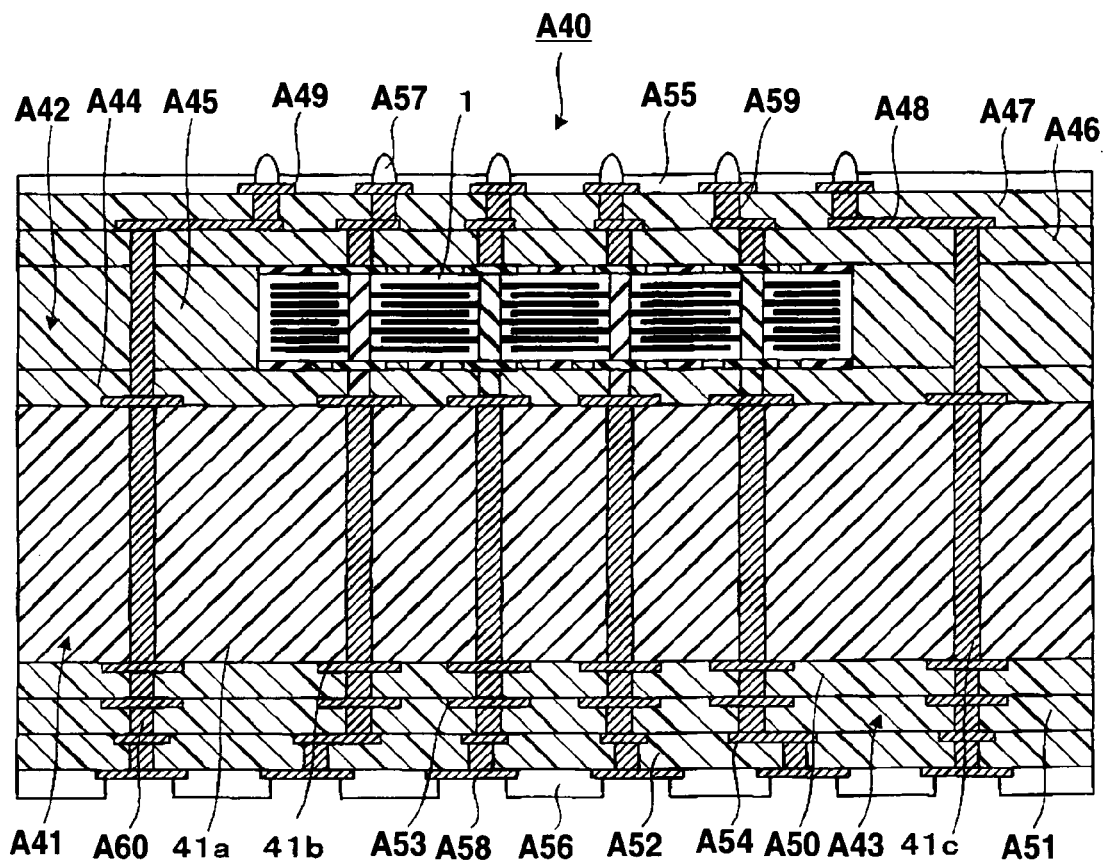
FIG. 6 is a schematic vertical cross-sectional view of a wiring board in which a capacitor for incorporation in a wiring board in accordance with the first embodiment is incorporated.

Each of the via conductors 6 and 7 has an upper surface connected to a below-described outer electrode 8, a below-described lower surface connected to an outer electrode 9, and a side surface connected to the inner electrode layers 4 or 5. It should be noted that the via conductors 6 and 7 may penetrate the outer electrode 9, as shown in FIG. 6 which will be referred to later.

The via conductors 6 and 7 are mainly constituted of an electrically conductive material such as Ni, but contain a ceramic material similar to the ceramic material constituting the ceramic layers 3. As such a ceramic material is contained in the via conductors 6 and 7, respectively, it is possible to enhance the adhesion between the ceramic layer 3 and the via conductors 6 and 7. It should be noted that such a ceramic material may not be contained in the via conductors 6 and 7.

Here, as shown in FIG. 3A, clearance holes 4a are formed in each inner electrode layer 4 in regions where the via conductors (second via conductors) 7 penetrate, and the inner electrode layer 4 and the via conductors 7 are electrically insulated. In addition, as shown in FIG. 3B, clearance holes 5a are similarly formed in each inner electrode layer 5 in regions where the via conductors (first via conductors) 6 penetrate, and the inner electrode layer 5 and the via conductors 6 are electrically insulated.

At least one or more outer electrodes 8 (first outer electrodes) are formed on the first main surface 2a of the capacitor body 2, while at least one or more outer electrodes 9 (second outer electrodes) are formed on the second main surface 2b of the capacitor body 2. The outer electrodes 8 and 9 are used as, for example, power supplying electrodes or ground connecting electrodes. Among the outer electrodes 8 and 9, there are those which are electrically connected to the inner electrode layer 4 via the via conductors 6, and those which are electrically connected to the inner electrode layer 5 via the via conductors 7.

The outer electrodes 8 and 9 are mainly constituted of an electrically conductive material such as Ni, but contain a ceramic material similar to the ceramic material constituting the ceramic layers 3. As such a ceramic material is contained in the outer electrodes 8 and 9, respectively, it is possible to enhance the adhesion between the ceramic layer 3 and the outer electrodes 8 and 9. It should be noted that such a ceramic material may not be contained in the outer electrodes 8 and 9.

The shape of the outer electrodes 8 and 9 is not particularly limited, but it is possible to cite a circular shape, a triangular shape, a rectangular shape, a rhomboidal shape, and the like. The thickness of each of the outer electrodes 8 and 9 is not more than 20 µm, for example.

In addition, at least one or more dummy electrodes A10 (first dummy electrodes) are formed on the first main surface 2a of the capacitor body 2, while at least one or more dummy electrodes A11 (second dummy electrodes) are formed on the second main surface 2b of the capacitor body 2.

The dummy electrodes A10 and A11 are respectively spaced apart from the outer electrodes 8 and 9, and are not electrically connected to the outer electrodes 8 and 9. The dummy electrodes A10 and A11 are formed substantially in the same shape, and are disposed so as to be symmetrical in the laminated direction of the ceramic layers 3. It should be noted that although in this embodiment the dummy electrodes A10 and A11 are formed in such a manner as to surround the outer electrodes 8 and 9, but the shape of the dummy electrodes A10 and A11 is not particularly limited.

The total of the area of the surface(s) of the outer electrode(s) 8 and the area of the surface(s) of the dummy electrode(s) A10 is preferably not less than 45% and not more than 90% of the area of the first main surface 2a, more preferably not less than 60% and not more than 80% thereof. The reason for setting the total of these areas in this range is that if the total of these areas becomes less than 45%, the exposed area of the ceramic layer 3 on the obverse surface of the capacitor 1 increases, making it impossible to sufficiently improve the adhesion between the capacitor 1 and an insulating layer A46 which will be described later. On the other hand, if the total of these areas exceeds 90%, the interval between the outer electrode 8 and the dummy electrode A10 becomes narrow, possibly electrically short-circuiting the outer electrode 8 and the dummy electrode A10.

Here, in a case where a plurality of outer electrodes 8 are formed on the first main surface 2a, the phrase "the area of the surface(s) of the outer electrode(s) 8" means the total area of the surfaces of all the outer electrodes 8 formed on the first main surface 2a. Also, in a case where a plurality of dummy electrodes A10 are formed on the first main surface 2a, the phrase "the area of the surface(s) of the dummy electrode(s) A10" means the total area of the surfaces of all the dummy electrodes A10 formed on the first main surface 2a.

Likewise, the total of the area of the surface(s) of the outer electrode(s) 9 and the area of the surface(s) of the dummy electrode(s) A11 is preferably not less than 45% and not more than 90% of the area of the second main surface 2b, more preferably not less than 60% and not more than 80% thereof. The reason for setting the total of these areas in this range is based on the same reason as described above. In addition, the meanings of the phrases "the area of the surface(s) of the outer electrode(s) 9" and "the area of the surface(s) of the dummy electrode(s) A11" in a case where pluralities of outer electrodes 9 and dummy electrodes A11 are formed on the second main surface 2b are similar to those described above.

The dummy electrodes A10 and A11 are mainly constituted of an electrically conductive material such as Ni, but contain a ceramic material similar to the ceramic material constituting the ceramic layers 3. As such a ceramic material is contained in the dummy electrodes A10 and A11, respectively, it is possible to enhance the adhesion between the ceramic layer 3 and the dummy electrodes A10 and A11. It should be noted that such a ceramic material may not be contained in the dummy electrodes A10 and A11. Further, the thickness of each of the dummy electrodes A10 and A11 is substantially the same as the thickness of each of the outer electrodes 8 and 9 (e.g., not more than 20 µm).

First plating films (not shown) for improving the adhesion with insulating layers A44 and A46, which will be described later, are respectively formed on the surfaces of the outer electrodes 8 and 9 and the dummy electrodes A10 and A11. The first plating films also have the function of preventing the oxidation of the outer electrodes 8 and 9 and the dummy electrodes A10 and A11. The first plating films are constituted of an electrically conductive material such as Au or Cu, and the surfaces of the first plating films are coarsened to improve the adhesion with the insulating layers A44 and A46.

Second plating films (not shown) for suppressing a decline in the adhesion between the first plating film and each of the outer electrodes 8 and 9 and between the first plating film and each of the dummy electrodes A10 and A11 are respectively formed between the first plating film and each of the outer electrodes 8 and 9 and between the first plating film and each of the dummy electrodes A10 and A11. To describe more specifically, if the ceramic material is contained in the outer electrodes 8 and 9 and the dummy electrodes A10 and A11, as described above, there is a possibility that the ceramic material is undesirably exposed on the surfaces of the outer electrodes 8 and 9 and the dummy electrodes A10 and A11, possibly causing a decline in the adhesion between the first plating film and each of the outer electrodes 8 and 9 and between the first plating film and each of the dummy electrodes A10 and A11. The second plating films are formed to suppress such a decline in adhesion. The second plating films are preferably constituted of an electrically conductive material similar to the electrically conductive material which is the principal constituent of, for example, the outer electrodes 8 and 9 and the dummy electrodes A10 and A11. It should be noted that the aforementioned second plating films may not be formed in a case where plating treatment can be directly provided to the outer electrodes 8 and 9 and the dummy electrodes A10 and A11 with the ceramic material added thereto, and the adhesive strength is high.

Figure 4A:
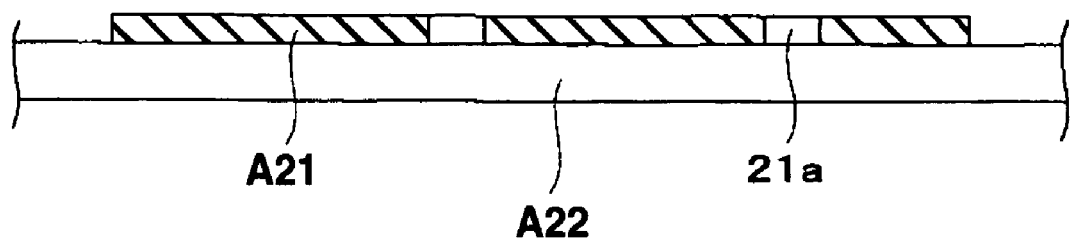
FIGS. 4A and 4B are side elevational views of a ceramic green sheet on which an inner electrode pattern in accordance with the first embodiment has been formed.
Figure 4B:
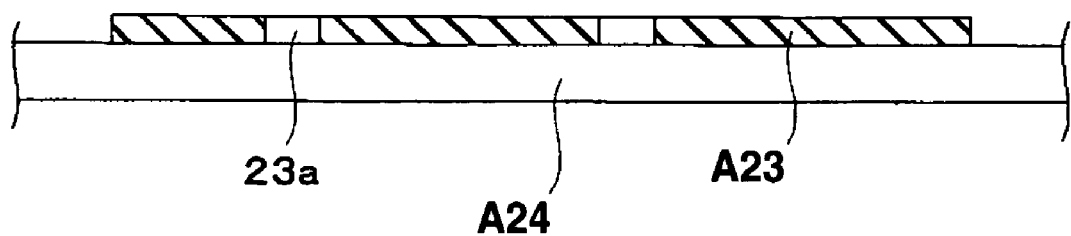
Figure 5A:
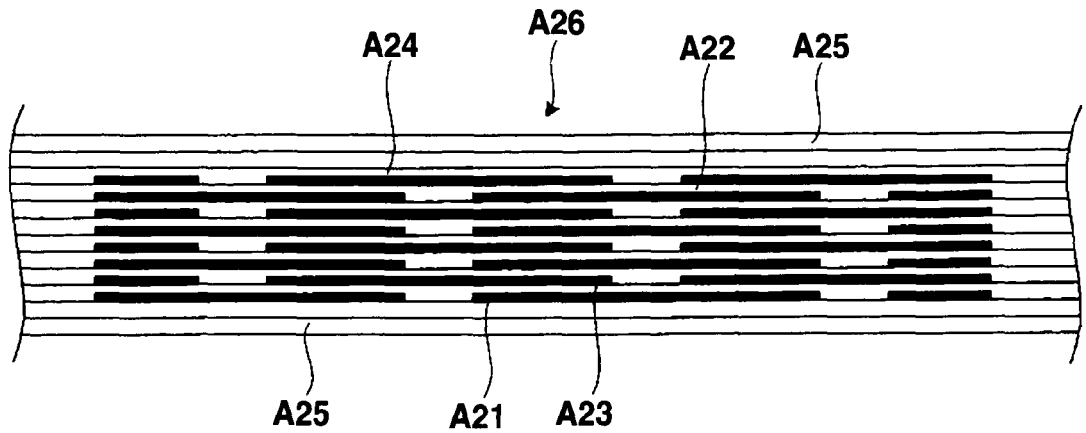
FIGS. 5A to 5C are cross-sectional views schematically illustrating the process of manufacturing the capacitor for incorporation in a wiring board in accordance with the first embodiment.
Figure 5B:
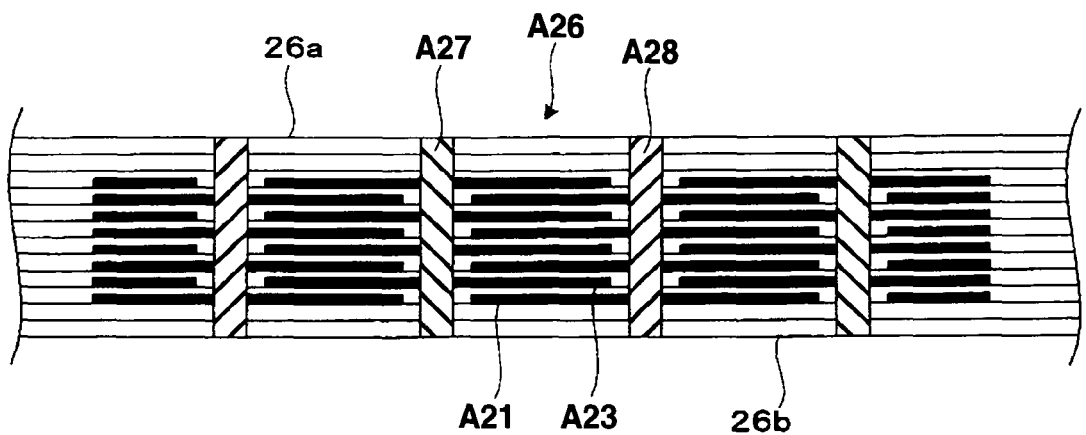
Figure 5C:
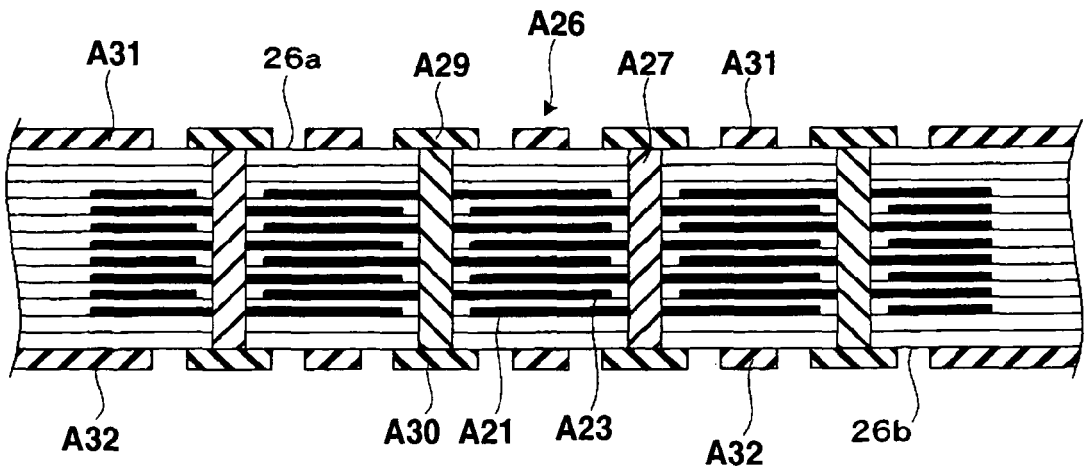

The capacitor 1 can be manufactured by the following procedure, for example. It should be noted that in this embodiment a description will be given of the process in which a plurality of capacitors 1 are manufactured at a time. FIGS. 4A and 4B are side elevational views of a ceramic green sheet on which an inner electrode pattern in accordance with this embodiment has been formed. FIGS. 5A to 5C are cross-sectional views schematically illustrating the process of manufacturing the capacitor for incorporation in a wiring board in accordance with this embodiment.

The following are first prepared: a plurality of ceramic green sheets A22 (dielectric sheets), on each of which an inner electrode pattern A21 serving as the inner electrode layer 4 after firing has been formed by such as screen printing so as to form the ceramic layer 3 after firing, and a plurality of ceramic green sheets A24 (dielectric sheets), on each of which an inner electrode pattern A23 serving as the inner electrode layer 5 after firing has been formed by such as screen printing so as to form the ceramic layer 3 after firing (FIGS. 4A and 4B). Clearance holes 21a and 23a serving as the clearance holes 4a and 5a have been formed in the inner electrode patterns A21 and A23.

After these ceramic green sheets A22 and the like are prepared, a predetermined number of ceramic green sheets on which the inner electrode pattern A21 and the like are not formed are laminated thereon to fabricate a cover layer A25. Then, the ceramic green sheets A22 each having the inner electrode pattern A21 formed thereon and the ceramic green sheets A24 each having the inner electrode pattern A23 formed thereon are alternately laminated on the cover layer A25, and the cover layer A25 formed in a similar procedure is further laminated thereon. Subsequently, the assembly thus formed is subjected to pressurization, thereby forming a laminated body A26 serving as the capacitor body 2 after firing (FIG. 5A).

After the formation of the laminated body A26, via holes penetrating from a first main surface 26a to a second main surface 26b of the laminated body A26 are formed, and conductive paste is press fitted into the via holes, thereby forming via conductive pastes A27 and A28 serving as the via conductors 6 and 7 after firing (FIG. 5B).

Subsequently, outer electrode patterns A29 and A30 connected to the via conductor pastes A27 and A28 by such as screen printing and serving as the outer electrodes 8 and 9 after firing, as well as dummy electrode patterns A31 and A32 serving as the dummy electrodes A10 and A11 after firing, are formed on the first main surface 26a and the second main surface 26b of the laminated body A26 (FIG. 5C).

The outer electrode patterns A29 and A30 and the dummy electrode patterns A31 and A32 may be formed in separate processes, but are preferably formed in the same process by using the same conductive paste in the light of efficiency.

After the formation of the outer electrode patterns A29 and A30 and the dummy electrode patterns A31 and A32, their degreasing is carried out, and firing is performed for a predetermined time at a predetermined temperature. Owing to this firing, the ceramic green sheets A22 and the like are sintered, and the inner electrode patterns A21 and the like are sintered, thereby forming the capacitor body 2. Also, the outer electrode patterns A29 and A30, the dummy electrode patterns A31 and A32, and the like are sintered, thereby forming the outer electrodes 8 and 9, the dummy electrodes A10 and A11, and the like.

After firing, the second plating films are respectively formed on the surfaces of the outer electrodes 8 and 9 and the dummy electrodes A10 and A11 by such as electroless plating, and the first plating films are further formed on the surfaces of the second plating films by such as electroless plating. Subsequently, the surfaces of the first plating films are coarsened by such as a solution. It should be noted that the aforementioned second plating films may not be formed in the case where plating treatment can be directly provided to the outer electrodes 8 and 9 and the dummy electrodes A10 and A11 with the ceramic material added thereto, and the adhesive strength is high.

After the coarsening of the surfaces of the first plating films, the adjacent capacitors 1 are cut off by such as a cutter or a laser. As a result, a plurality of capacitors 1 shown in FIG. 1 are fabricated.

The capacitor 1 is used by being incorporated in a wiring board. Hereafter, a description will be given of a wiring board incorporating the capacitor 1. FIG. 6 is a schematic vertical cross-sectional view of a wiring board in which a capacitor for incorporation in a wiring board in accordance with this embodiment is incorporated.

A wiring board A40 shown in FIG. 6 is an organic board which is formed in the shape of a rectangular parallelepiped. The wiring board A40 is mainly constituted of a polymeric material which is reinforced by using ceramic particles or fibers as fillers.

The wiring board A40 has a core board A41 (wiring board body) constituting the core of the wiring board A40. The core board A41 is comprised of a core material A41a formed of such as a glass-epoxy resin composite material, as well as wiring layers 41b which are respectively formed on both surfaces of the core material A41a, have desired patterns, and are formed of such as Cu.

A plurality of through holes are formed in the core board A41 in such a manner as to penetrate in the vertical direction of the core board A41. A through hole conductor 41c which is electrically connected to the wiring layers 41b is formed in each through hole.

Buildup layers A42 and A43 are respectively formed on the obverse surface side and the reverse surface side of the core board A41. The buildup layer A42 has the plurality of insulating layers A44 to A47 formed of a thermosetting resin such as an epoxy resin, as well as pluralities of wiring layers A48 and A49 each formed between the insulating layers A46 and A47 and formed of a conductive material such as Cu. The buildup layer A43 has pluralities of insulating layers A50 to A52 formed of a thermosetting resin such as an epoxy resin, as well as pluralities of wiring layers A53 and A54 each formed between the insulating layers A50 and A51 and formed of a conductive material such as Cu.

The capacitor 1 is disposed inside the buildup layer A42 formed on the core board A41, specifically within the thickness of the insulating layer A45, for example. The outer electrodes 8 and the dummy electrode A10 are adhered to the insulating layer A46, while the outer electrodes 9 and the dummy electrode A11 are adhered to the insulating layer A44.

The capacitor 1 can be disposed inside the buildup layer A42 in the following procedure, for example. First, the capacitor body 2 with the outer electrodes 8 and 9 and the dummy electrodes A10 and A11 formed thereon are disposed on the insulating layer A44 formed on the core board A41.

Subsequently, the insulating layer A45 is disposed on the capacitor body 2, and this assembly is subjected to pressurization while being heated. As a result, the insulating layer A45 on the capacitor body 2 flows to sides of the capacitor body 2, thereby allowing the capacitor body 2 to be disposed within the thickness of the insulating layer A45. Subsequently, the via holes are formed immediately above the wiring layer 41b in such a manner as to penetrate the insulating layers A44 and A45, the capacitor body 2, and the outer electrodes 8 and 9, and the via conductors 6 and 7 connected to the wiring layers 41b are formed in these via holes, thereby completing the capacitor 1. The via conductors 6 and 7 in this case can be formed by using, for example, via paste, which serves as the via conductors 6 and 7 after thermosetting, or plating. Subsequently, the insulating film A46 is further formed on the capacitor 1. It should be noted that although the capacitor 1 incorporated in the wiring board A40 and the capacitor 1 shown in FIG. 1 are slightly different in structure, the capacitor 1 shown in FIG. 1 may be incorporated in the wiring board A40.

The surface of the insulating layer A47 and the surface of the insulating layer A52 are respectively covered with solder resists A55 and A56 constituted of such as a photosensitive resin composition. Openings are formed in the solder resists A55 and A56, and terminals A57 for electrically connecting to a semiconductor chip (not shown) and terminals A58 for connecting to such as a main board (not shown) are exposed from these openings. The outer electrodes 8, the wiring layers 41b, and the like are electrically connected to the terminals A57 via via conductors A59 and the like, while the outer electrodes 9, the wiring layers 41b, and the like are electrically connected to the terminals A58 via via conductors A60 and the like.

In this embodiment, since the dummy electrodes A10 and A11 are respectively formed on the first main surface 2a and the second main surface 2b of the capacitor body 2, it is possible to reduce the exposed area of the ceramic layer 3 on the obverse surface and the reverse surface of the capacitor 1. In consequence, it is possible to improve the adhesion between the capacitor 1 and the insulating layers A44 and A46. Therefore, it is possible to reduce faulty conduction and improve the reliability of the wiring board A40 in the case where the capacitor 1 is incorporated in the wiring board A40. It should be noted that it is conceivable to coarsen the surface of the ceramic layer 3 without forming the dummy electrodes A10 and A11 so improve the adhesion between the capacitor 1 and the insulating layers A44 and A46, but the coarsening of the ceramic layer 3 is difficult. In addition, since the ceramic layer 3 is extremely thin, if the ceramic layer 3 is coarsened, there is a possibility of the ceramic layer 3 being destroyed, unfavorably exposing the inner electrode layers 4 and 5.

In the case where the thickness of the capacitor is very small, the mechanical strength of the capacitor declines, and warpage and swell can possibly occur due to firing. In contrast, in this embodiment, since the dummy electrodes A10 and A11 are respectively formed on the first main surface 2a and the second main surface 2b, it is possible to improve the mechanical strength of the capacitor 1 and decrease the warpage and swell occurring in the capacitor 1 due to firing.

In this embodiment, since the dummy electrode A10 and the dummy electrode A11 are formed in a substantially identical shape, and are disposed so as to be symmetrical in the laminated direction of the ceramic layers 3, it is possible to further suppress the warpage and swell occurring in the capacitor 1 due to firing. In addition, as the dummy electrodes A10 and A11 are formed, it is possible to overcome denting due to the flowing in of the insulating layer A45 into a gap portion between the ceramic layer 3 and each of the outer electrodes 8 and 9.

In this embodiment, since the capacitor 1 is disposed in the buildup layer A42 formed on the core board A41, it is possible to further shorten the distance between the capacitor 1 and the semiconductor chip. As a result, it is possible to further reduce the wiring resistance and inductance.

Second Embodiment

Figure 7:
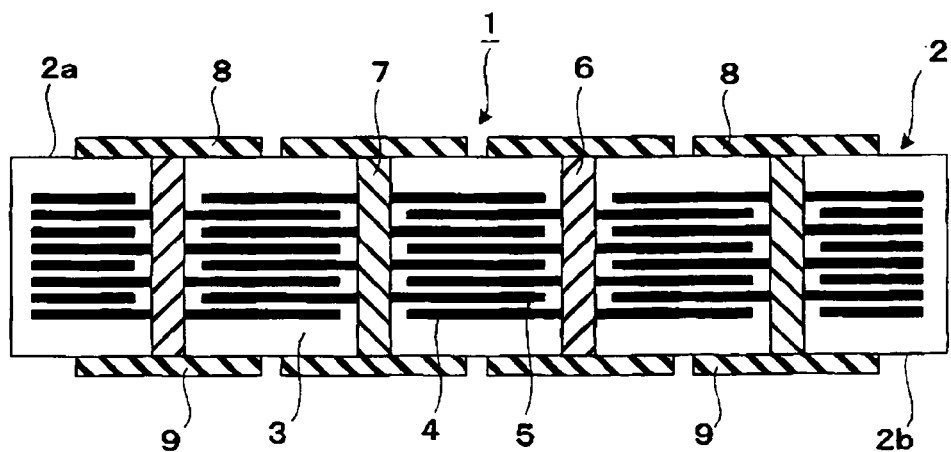
FIG. 7 is a schematic vertical cross-sectional view of the capacitor for incorporation in a wiring board in accordance with a second embodiment.
Figure 8:
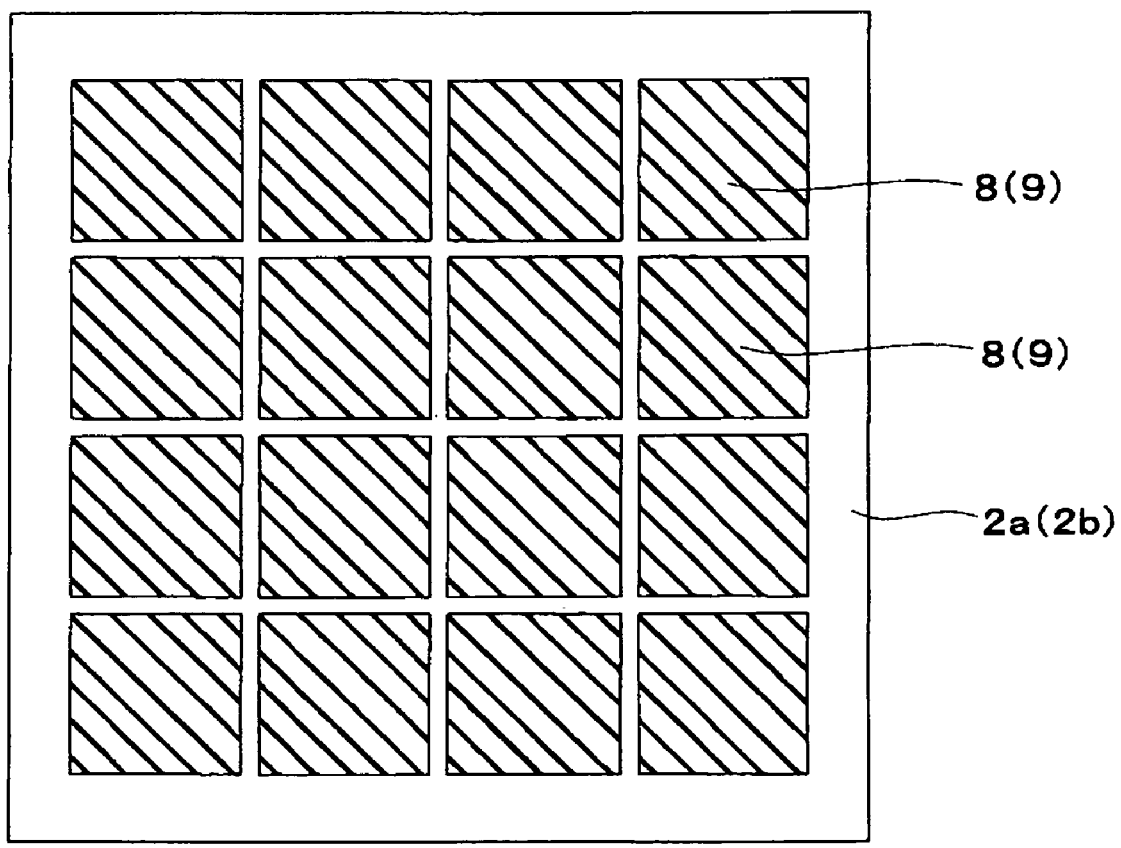
FIG. 8 is a schematic plan view of the capacitor for incorporation in a wiring board in accordance with the second embodiment.

Hereafter, a description will be given of a second embodiment of the invention with reference to the drawings. In this embodiment, a description will be given of an example in which the area of the surface(s) of the outer electrode(s) 8 is set to be not less than 45% and not more than 90% of the area of the first main surface 2a, and the area of the surface(s) of the outer electrode(s) 9 is set to be not less than 45% and not more than 90% of the area of the second main surface 2b. It should be noted that identical members to the members described in the first embodiment will be denoted by the same reference numerals, and the contents which overlap with those described in the first embodiment will be omitted except for those described below. FIG. 7 is a schematic vertical cross-sectional view of the capacitor for incorporation in a wiring board in accordance with this embodiment. FIG. 8 is a schematic plan view of the capacitor for incorporation in a wiring board in accordance with this embodiment.

As shown in FIGS. 7 and 8, in this embodiment, the dummy electrodes A10 and A11 are not formed, and the area of the surface(s) of the outer electrode(s) 8 is set to be not less than 45% and not more than 90% of the area of the first main surface 2a, while the area of the surface(s) of the outer electrode(s) 9 is set to be not less than 45% and not more than 90% of the area of the second main surface 2b.

Here, the reason that the areas of the surfaces of the outer electrodes 8 and 9 are set in these ranges is based on the same reason as the reason for setting the total of the area of the surface(s) of the outer electrode(s) 8 and the area of the surface(s) of the dummy electrode(s) A10 in the range of not less than 45% and not more than 90% of the area of the first main surface 2a. In addition, the meaning of the phrase "the areas of the surfaces of the outer electrodes 8 and 9" in a case where pluralities of outer electrodes 8 and 9 are formed is similar to that of the first embodiment.

The area of the surface(s) of the outer electrode(s) 8 is preferably set to be not less than 60% and not more than 80% of the area of the first main surface 2a, and the area of the surface(s) of the outer electrode(s) 9 is preferably set to be not less than 60% and not more than 80% of the area of the second main surface 2b. The outer electrode 8 and the outer electrode 9 are formed in a substantially identical shape, and are disposed so as to be symmetrical in the laminated direction of the ceramic layers 3.

In this embodiment, since the outer electrodes 8 of such a size are formed on the first main surface 2a, and the outer electrodes 9 of such a size are formed on the second main surface 2b, it is possible to improve the adhesion between the capacitor 1 and the insulating layers A44 and A46 in the same way as in the first embodiment. Therefore, it is possible to reduce faulty conduction and improve the reliability of the wiring board A40 in the case where the capacitor 1 is incorporated in the wiring board A40.

In this embodiment, since the outer electrodes 8 and 9 of such sizes are formed, it is possible to improve the mechanical strength of the capacitor 1 and decrease the warpage and swell occurring in the capacitor 1 due to firing. Furthermore, since the outer electrode 8 and the outer electrode 9 are formed in a substantially identical shape, and are disposed so as to be symmetrical in the laminated direction of the ceramic layers 3, it is possible to further suppress the warpage and swell occurring in the capacitor 1 due to firing in the same way as in the first embodiment.

In this embodiment, since the outer electrodes 8 and 9 of such sizes are formed, even in a case where the positions of the via conductors 6 and 7 are slightly offset from predetermined positions, the via conductors 6 and 7 can be reliably connected to the outer electrodes 8 and 9.

Third Embodiment

Referring now to the drawings, a detailed description will be given of a third embodiment of the wiring board in accordance with the invention.

Figure 9:
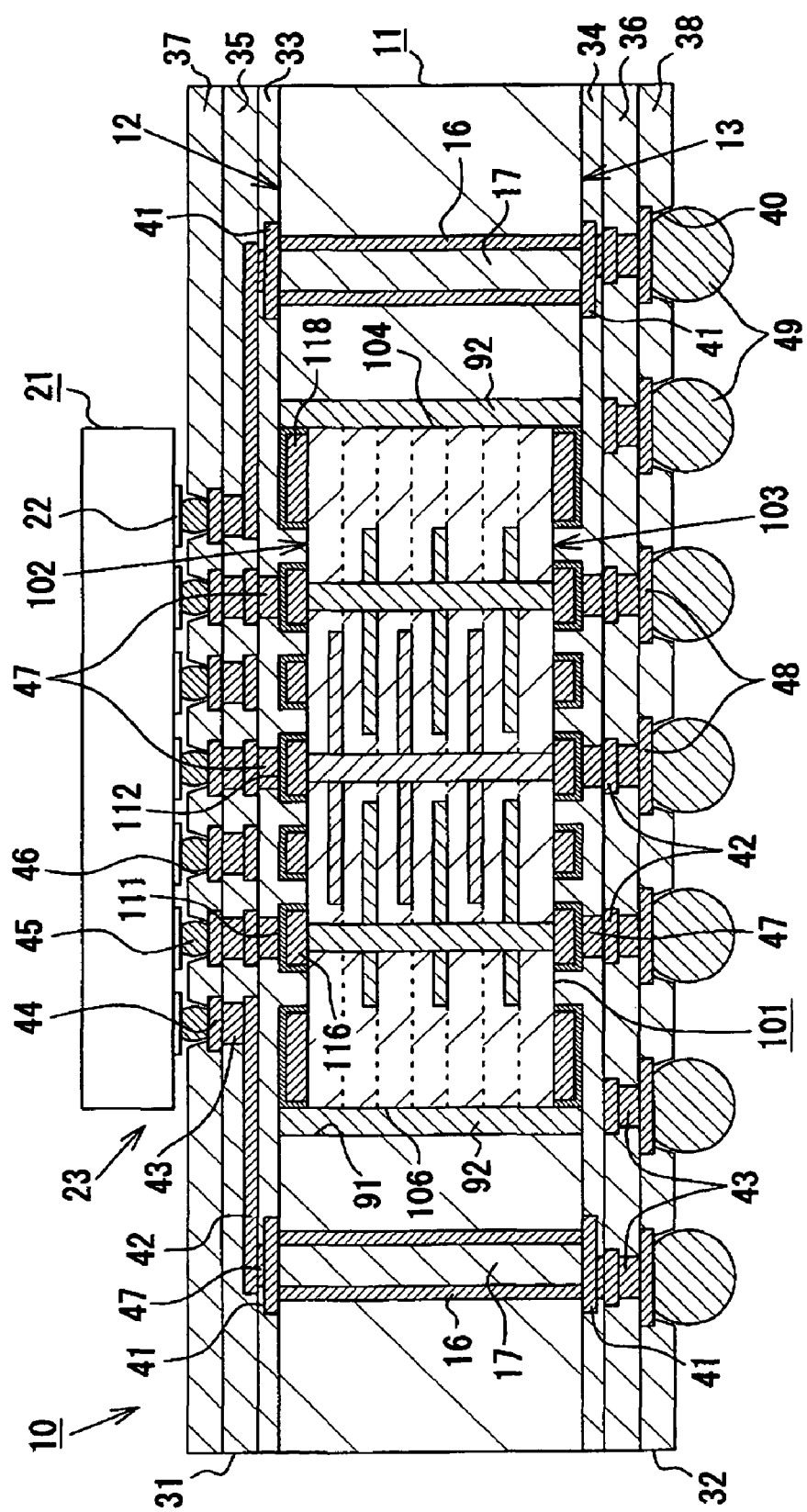
FIG. 9 is a schematic cross-sectional view illustrating the wiring board in accordance with a third embodiment of the invention.

As shown in FIG. 9, a wiring board 10 in accordance with this embodiment is comprised of a substantially rectangular plate-shaped board core 11 which is a wiring board for mounting on an IC chip and is formed of glass epoxy; a buildup layer 31 formed on an upper surface 12 (core main surface) of the board core 11; and a buildup layer 32 formed on a lower surface 13 of the board core 11. Through hole conductors 16 are formed at a plurality of portions in the board core 11. These through hole conductors 16 connect and conduct the upper surface 12 side and the lower surface 13 side of the board core 11. It should be noted that the interior of each through hole conductor 16 is filled with a closure body 17 such as an epoxy resin. Further, conductor layers 41 formed of copper are respectively pattern-formed on the upper surface 12 and the lower surface 13 of the board core 11, and each conductor layer 41 is electrically connected to the through hole conductor 16.

The buildup layer 31 formed on the upper surface 12 of the board core 11 has a structure in which two resin insulating layers 33 and 35 (so-called interlayer insulating layers) formed of an epoxy resin, as well as a conductor layer 42 formed of copper, are alternately laminated. Terminal pads 44 are formed at a plurality of portions on the obverse surface of the second resin insulating layer 35 in the form of an array. Further, the obverse surface of the resin insulating layer 35 is practically entirely covered with a solder resist 37. Opening portions 46 for exposing the terminal pads 44 are formed at predetermined portions of the solder resist 37. A plurality of solder bumps 45 are respectively disposed on the surfaces of the terminal pads 44. Each solder bump 45 is electrically connected to a surface connection terminal 22 of an IC chip 21 (semiconductor integrated circuit device). It should be noted that the terminal pads 44 and the solder bumps 45 are located within the region immediately above a ceramic capacitor 101 in the buildup layer 31 and this region constitutes a semiconductor device mounting portion 23. In addition, via conductors 43 and 47 are respectively provided in the resin insulating layers 33 and 35. Most of these via conductors 43 and 47 are disposed coaxially, and the conductor layers 41 and 42 and the terminal pads 44 are electrically connected to each other via them.

As shown in FIG. 9, the buildup layer 32 formed on the lower surface 13 of the board core 11 has a structure substantially identical to that of the above-described buildup layer 31. Namely, the buildup layer 32 has a structure in which two resin insulating layers 34 and 36 formed of an epoxy resin and the conductor layer 42 are alternately laminated. BGA pads 48, which are electrically connected to the conductor layers 42 via the via conductors 43, are formed at a plurality of portions on the lower surface of the second resin insulating layer 36 in the form of an array. Further, the lower surface of the resin insulating layer 36 is practically entirely covered with a solder resist 38. Opening portions 40 for exposing the BGA pads 48 are formed at predetermined portions of the solder resist 38. A plurality of solder bumps 49 for establishing electrical connection to an unillustrated motherboard are respectively disposed on the surfaces of the BGA pads 48. The wiring board 10 shown in FIG. 9 is mounted on an unillustrated motherboard by means of the solder bumps 49.

Figure 10:
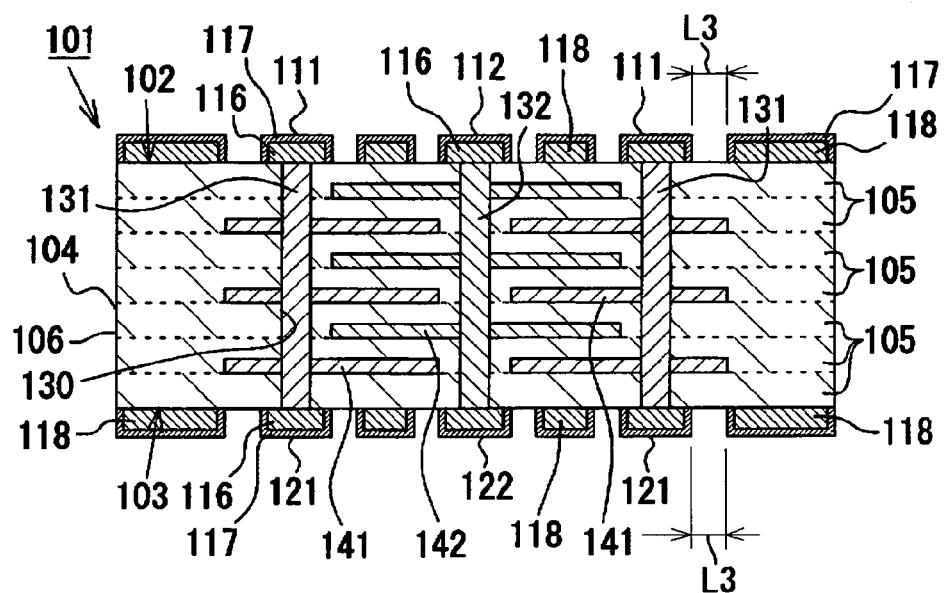
FIG. 10 is a schematic cross-sectional view illustrating a ceramic capacitor in accordance with the third embodiment.
Figure 11:
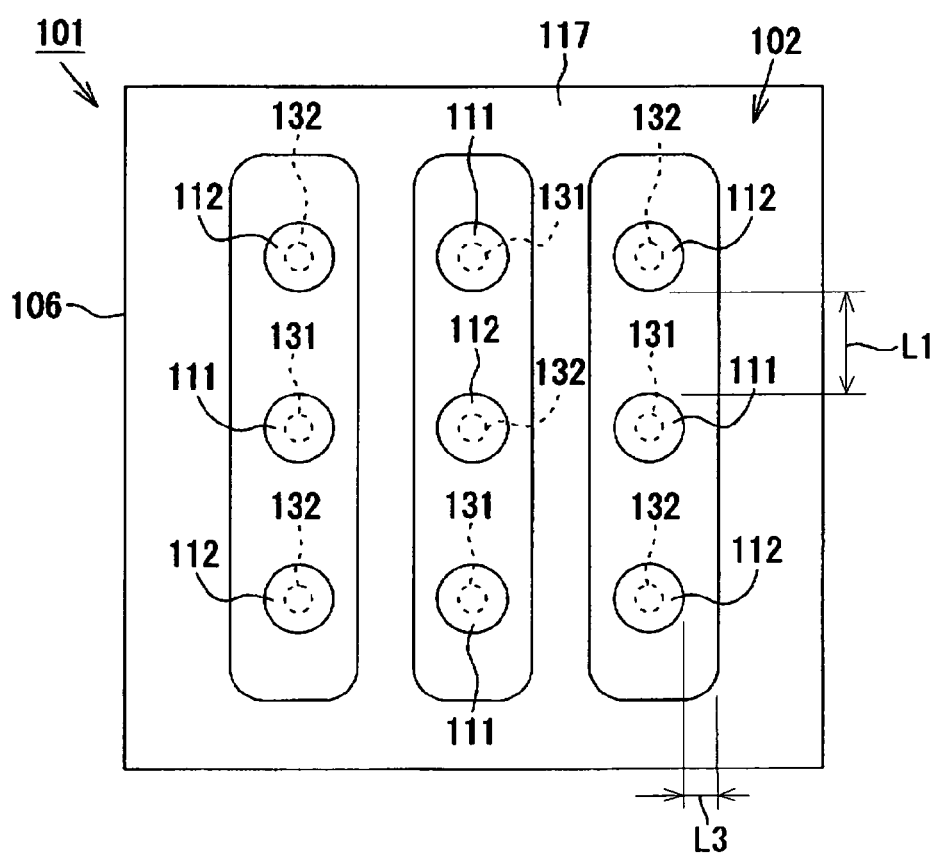
FIG. 11 is a schematic top view illustrating the ceramic capacitor in accordance with the third embodiment.

The board core 11 has a rectangular accommodating hole portion 91, as viewed in a plan view, which is open in the central portion of the upper surface 12 and in the central portion of the lower surface 13. Namely, the accommodating hole portion 91 is a through hole portion. The ceramic capacitor 101 (ceramic chip for embedment) shown in FIGS. 10 and 11 is accommodated in the accommodating hole portion 91 in an embedded state. It should be noted that the ceramic capacitor 101 is accommodated with its upper surface 102 (chip main surface) facing the same side as the upper surface 12 of the board core 11. The ceramic capacitor 101 in accordance with this embodiment has the shape of a rectangular flat plate which is 12.0 mm long, 12.0 mm wide, and 0.8 mm thick. It should be noted that the thickness of the ceramic capacitor 101 is preferably no less than 0.2 mm and not more than 1.0 mm. If the thickness of the ceramic capacitor 101 is less than 0.2 mm, the IC chip 21 on the semiconductor device mounting portion 23 cannot be reliably supported by the ceramic capacitor 101. On the other hand, if it is greater than 1.0 mm, the wiring board 10 becomes large in thickness.

In addition, a gap between the inner surface of the accommodating hole portion 91 and a side surface 106 of the ceramic capacitor 101 is filled with a filler 92 formed of a polymeric material (thermosetting resin in this embodiment). This filler 92 has the functions of fixing the ceramic capacitor 101 to the board core 11 and of allowing the deformation in the planar direction and the thicknesswise direction of the ceramic capacitor 101 and the board core 11 to be absorbed by their own resilient deformation. It should be noted that the ceramic capacitor 101 has a substantially square shape in a plan view, and each of its four corners is rounded with a radius of 0.60 mm or more (or chamfered with a taper C of 0.60 or more). As a result, when the filler 92 is deformed in consequence of a temperature change, it is possible to alleviate the concentration of stress at the corner portions of the ceramic capacitor 101, so that it is possible to prevent the occurrence of cracks in the filler 92.

As shown in FIGS. 9 to 11, the ceramic capacitor 101 in accordance with this embodiment is a so-called via array type ceramic capacitor. A ceramic sintered body 104 constituting the ceramic capacitor 101 is a plate-like piece having the upper surface 102 and a lower surface 103 (chip reverse surface). It should be noted that the aforementioned resin insulating layer 33 constituting the aforementioned buildup layer 31 is formed on the upper surface 102 of the ceramic sintered body 104, while the aforementioned resin insulating layer 34 constituting the aforementioned buildup layer 32 is formed on the lower surface 103 of the ceramic sintered body 104. The ceramic sintered body 104 has a structure in which first inner electrode layers 141 (inner conductors) and second inner electrode layers 142 (inner conductors) are alternately laminated and arranged via a ceramic dielectric layer 105. The ceramic dielectric layer 105 consists of a sintered body of barium titanate, i.e., a kind of a high dielectric constant ceramic, and functions as a dielectric (insulator) between the first inner electrode layer 141 and the second inner electrode layer 142. The first inner electrode layers 141 and the second inner electrode layers 142 are layers which are formed of nickel as a principal constituent, and are arranged alternately inside the ceramic sintered body 104.

As shown in FIG. 10, a multiplicity of via holes 130 are formed in the ceramic sintered body 104. These via holes 130 penetrate the ceramic sintered body 104 in its thicknesswise direction, and are arranged on its entire surface in the form of an array. A plurality of via conductors 131 and 132 (inner conductors) penetrating between the upper surface 102 and the lower surface 103 of the ceramic sintered body 104 are formed in the respective via holes 130 by using nickel as a principal constituent. Each first via conductor 131 penetrates the respective first inner electrode layer 141, and electrically connects them to each other. Each second via conductor 132 penetrates the respective second inner electrode layer 142, and electrically connects them to each other.

As shown in FIGS. 10 and 11, pluralities of first outer terminal electrodes 111 and 112 (terminal electrodes) are projectingly provided on the upper surface 102 of the ceramic sintered body 104. Also, pluralities of second outer terminal electrodes 121 and 122 (terminal electrodes) are projectingly provided on the lower surface 103 of the ceramic sintered body 104. The first outer terminal electrodes 111 and 112 on the upper surface 102 side are electrically connected to the aforementioned via conductors 47. Meanwhile, the second outer terminal electrodes 121 and 122 on the lower surface 103 side are electrically connected to electrodes (contacts) of an unillustrated motherboard via the via conductors 47, the conductor layers 42, the via conductors 43, the BGA pads 48, and the solder bumps 49. In addition, substantially central portions of bottom surfaces of the first outer terminal electrodes 111 and 112 are directly connected to upper surface 102-side end faces of the via conductors 131 and 132, while substantially central portions of bottom surfaces of the second outer terminal electrodes 121 and 122 are directly connected to lower surface 103-side end faces of the via conductors 131 and 132. Accordingly, the outer terminal electrodes 111 and 121 conduct with the via conductors 131 and the first inner electrode layers 141, while the inner terminal electrodes 112 and 122 conduct with the via conductors 132 and the second inner electrode layers 142.

Figure 19:
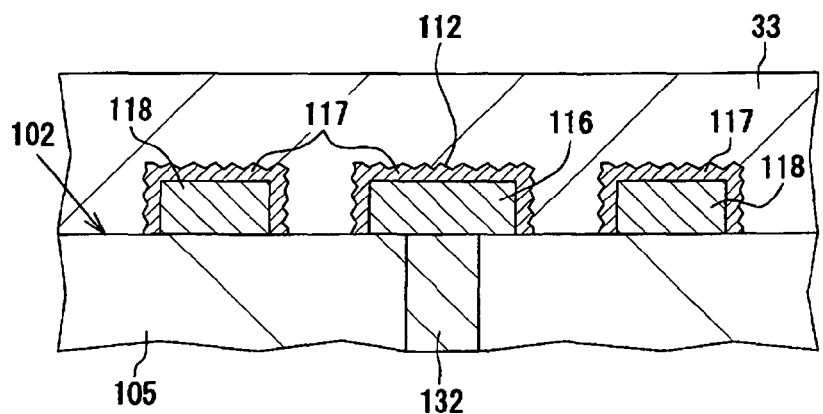
FIG. 19 is a cross-sectional view of essential portions of the wiring board.

As shown in FIG. 10, the first outer terminal electrodes 111 and 112 are constituted by metallized layers 116 formed of nickel as a principal material. The surfaces of the metallized layers 116 are entirely covered with copper plating layers 117 (metal layers). Likewise, the second outer terminal electrodes 121 and 122 are also constituted by metallized layers 116, and the surfaces of these metallized layers 116 are also covered with copper plating layers 117. Namely, the copper plating layers 117 are formed of a metal softer than the metal constituting the metallized layers 116. As shown in FIG. 19, since the surfaces of the copper plating layers 117 have been coarsened, the surfaces of the first outer terminal electrodes 111 and 112 are coarser than the upper surface 102 of the ceramic sintered body 104. Similarly, the surfaces of the second outer terminal electrodes 121 and 122 are coarser than the lower surface 103 of the ceramic sintered body 104. It should be noted that the surface roughness Ra of the copper plating layer 117 in this embodiment is set to approximately 0.5 µm. In addition, as shown in FIG. 11, the outer terminal electrodes 111, 112, 121, and 122, when viewed in a direction perpendicular to the upper surface 102 (in the thicknesswise direction of the part), are substantially circular. It should be noted that in this embodiment the diameter of each of the outer terminal electrodes 111, 112, 121, and 122 is set to approximately 500 µm, and a minimum length of the pitch is set to approximately 580 µm.

In addition, as shown in FIG. 10, dummy metallized layers 118 are respectively provided projectingly on the upper surface 102 and the lower surface 103 of the ceramic sintered body 104. The dummy metallized layer 118 is formed of nickel as a principal material, and its surfaces is entirely covered with the copper plating layer 117. Namely, a dummy surface conductor constituted by the dummy metallized layer 118 and the copper plating layer 117 has a layered structure substantially similar to that of the outer terminal electrodes 111, 112, 121, and 122. In addition, the copper plating layer 117 is formed of a metal softer than the metal constituting the metallized layers 116 and the dummy metallized layer 118. Incidentally, the dummy metallized layer 118 does not conduct with the other conductor portions. Further, as shown in FIG. 19, since the surface of the copper plating layer 117 has been coarsened, the surface of the dummy metallized layer 118 is coarser than the upper surface 102 and the lower surface 103 of the ceramic sintered body 104. In addition, as shown in FIG. 11, the outer shape of the copper plating layer 117 (dummy metallized layer 118), when viewed in the direction perpendicular to the upper surface 102 (in the thicknesswise direction of the part), is substantially rectangular, and has a shape in which a plurality of strip-like openings extending parallel to each other are provided.

In this embodiment shown in FIGS. 10 and 11, the distance L1 between adjacent ones of the plurality of terminal electrodes (the first terminal electrodes 111 and 112 or the second terminal electrodes 121 and 122) is set to not more than 200 µm (specifically, 150 µm to 200 µm or thereabouts). In addition, the distance L3 between the dummy metallized layer 118 and each of the plurality of terminal electrodes (the first terminal electrodes 111 and 112 or the second terminal electrodes 121 and 122) is set to not more than 200 µm (specifically, 150 µm to 200 µm or thereabouts). It should be noted that since the distance from a chip edge of the ceramic capacitor 101 to the dummy metallized layer 118 is set to 0 µm, an outer edge of the dummy metallized layer 118 overlaps with the chip edge.

When electric conduction is effected from the motherboard side via the second outer terminal electrodes 121 and 122 to apply a voltage across the first inner electrode layers 141 and the second inner electrode layers 142, positive charges, for example, are accumulated in the first inner electrode layers 141, while negative charges, for example, are accumulated in the second inner electrode layers 142. As a result, the ceramic capacitor 101 functions as a capacitor. In addition, in this ceramic capacitor 101, the first via conductors 131 and the second via conductors 132 are respectively disposed adjacent to each other, and are set such that the directions of current flowing through the first via conductors 131 and the second via conductors 132 become opposite to each other. A reduction of the inductance component is thereby attained.

Next, a description will be given of the method of manufacturing the wiring board 10 in accordance with this embodiment.

In a preparing step, the board core 11 and the ceramic capacitor 101 are respectively fabricated by conventionally known techniques, and are prepared in advance.

Figure 14:
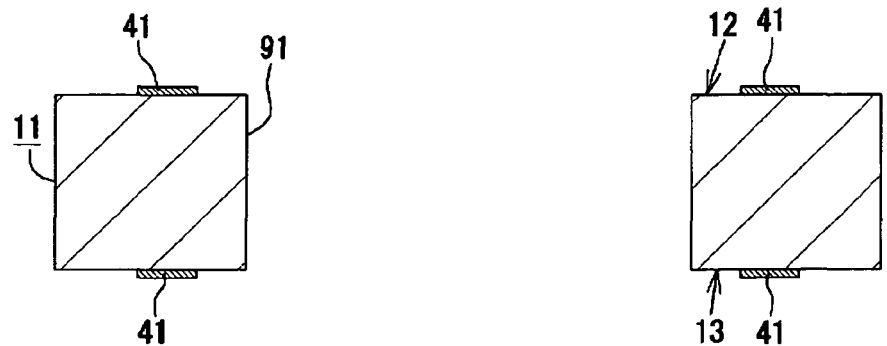
FIG. 14 is a diagram explaining a method of manufacturing a wiring board in accordance with the third embodiment.

The board core 11 is fabricated as follows. First, a copper clad laminate is prepared which is clad with copper foil on both sides of a base material which is 400 mm long, 400 mm wide, and 0.8 mm thick. It should be noted that the thickness of the base material is preferably not less than 0.2 mm and not more than 1.0 mm. Next, drilling is performed on the copper clad laminate by using a drill machine, whereby through holes (not shown) for forming the through hole conductors 16 are formed in advance at predetermined positions. Further, drilling is performed on the copper clad laminate by using a router, whereby a through hole serving as the accommodating hole portion 91 is formed in advance at a predetermined position (see FIG. 14). It should be noted that the through hole serving as the accommodating hole portion 91 is a hole which is substantially square in cross section, one side of which is 14.0 mm, and whose four corners are rounded with a radius of 0.1 to 0.2 mm or thereabouts. The through hole conductors 16 are formed by performing electroless copper plating and electrolytic copper plating in accordance with conventionally known techniques. Further, the copper foil on both surfaces of the copper clad laminate is subjected to etching so as to pattern the conductor layers 41 by the subtracting method, for example. Specifically, after electroless copper plating, electrolytic copper plating is performed by using this electroless copper plating layer as a common electrode. This electrolytic copper plating layer is further laminated with a dry film, and as exposure and development are carried out with respect to the dry film, the dry film is formed into a predetermined pattern. In this state, an unnecessary electrolytic copper plating layer, electroless copper layer, and copper foil are removed by etching. Subsequently, the board core 11 is obtained by exfoliating the dry film.

In addition, the ceramic capacitor 101 shown in FIG. 10 is fabricated as follows. Namely, ceramic green sheets are formed, and nickel paste for inner electrode layers is screen-printed on these green sheets and is allowed to dry. In consequence, first inner electrode portions and second inner electrode portions, which respectively serve as the first inner electrode layers 141 and the second inner electrode layers 142 later, are formed. Next, the green sheets each having the first inner electrode portions formed thereon and the green sheets each having the second inner electrode portions formed thereon are alternately laminated, and as a pressing force is imparted thereto in the laminated direction of the sheets, thereby integrating the green sheets and forming a green sheet laminate.

Furthermore, the via holes 130 are penetratingly formed in the green sheet laminate by using a laser processing machine, and nickel paste for via conductors is filled into the respective via holes 130 by using an unillustrated paste press-fitting and filling device. Next, paste is printed on the upper surface of the green sheet laminate, and the metallized layers 116 of the first outer terminal electrodes 111 and 112 are formed on the upper surface side of the green sheet laminate in such a manner as to cover the upper end faces of the respective conductors, while the dummy metallized layer 118 is formed on the other region of the upper surface. Also, paste is printed on the lower surface of the green sheet laminate, and the metallized layers 116 of the second outer terminal electrodes 121 and 122 are formed on the lower surface side of the green sheet laminate in such a manner as to cover the lower end faces of the respective conductors, while the dummy metallized layer 118 is formed on the other region of the lower surface.

Subsequently, the green sheet laminate is allowed to dry, and the surface terminal portions are solidified to some extent. Next, the green sheet laminate is degreased, and firing is performed at a predetermined temperature for a predetermined period of time. As a result, barium titanate and nickel in the paste are simultaneously sintered, thereby obtaining the ceramic sintered body 104.

Next, electroless copper plating (thickness: 10 μm or thereabouts) is carried out with respect to the respective outer terminal electrodes 111, 112, 121, and 122 and the dummy metallized layers 118 of the ceramic sintered body 104 thus obtained. In consequence, the copper plating layers are formed on the respective outer terminal electrodes 111, 112, 121, and 122 and the dummy metallized layers 118, thereby completing the ceramic capacitor 101. It should be noted that since the thickness of the electroless copper plating layers is 10 mm or thereabouts which is slightly thick, the thickness of copper can be secured even after undergoing the later coarsening step. It should be noted that electrolytic copper plating may be performed instead of electroless copper plating.

Figure 15:
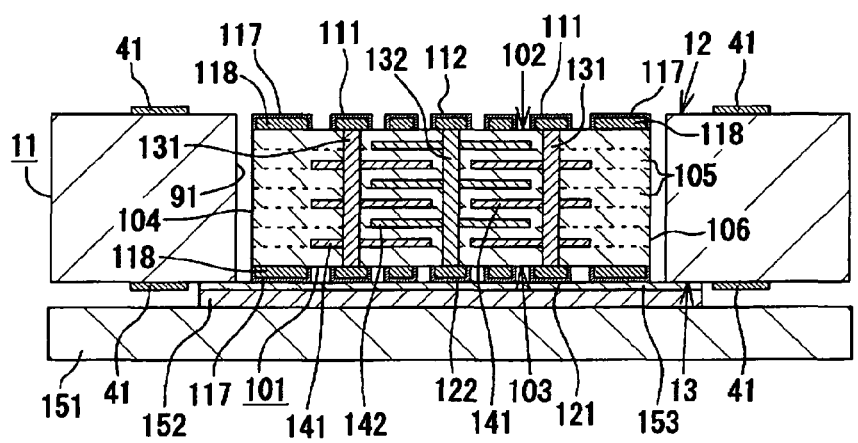
FIG. 15 is a diagram explaining the method of manufacturing a wiring board in accordance with the third embodiment.

In the subsequent fixing step, the ceramic capacitor 101 is accommodated in the accommodating hole portion 91 by using a mounting device (made by Yamaha Motor Co., Ltd.) (see FIG. 15). At this time, the lower surface 13-side opening of the accommodating hole portion 91 is sealed by an exfoliable pressure sensitive adhesive tape 152 (made by TERAOKA SEISAKUSHO CO., LTD.). This pressure sensitive adhesive tape 152 is supported by a supporting table 151. The ceramic capacitor 101 is adhered and temporarily fixed to a pressure sensitive adhesive surface 153 of such a pressure sensitive adhesive tape 152.

Figure 16:
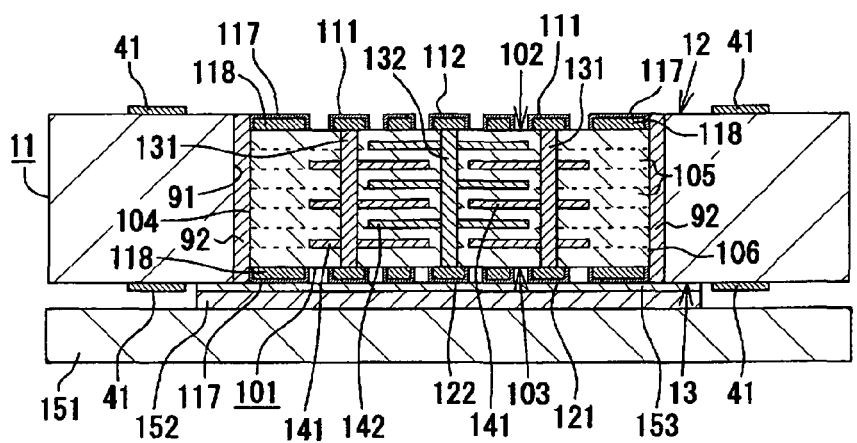
FIG. 16 is a diagram explaining the method of manufacturing a wiring board in accordance with the third embodiment.

In this state, the filler 92 made of a thermosetting resin (an underfiller made by NAMIX Co., Ltd.) is filled into gaps between the inner surfaces of the accommodating hole portion 91 and the side surfaces 106 of the ceramic capacitor 101 by using a dispenser (made by Asymtek Corporation) (see FIG. 16). Subsequently, if heat treatment is carried out, the filler 92 is cured, so that the ceramic capacitor 101 is fixed in the accommodating hole portion 91. Then, at this point of time, the pressure sensitive adhesive tape 152 is peeled off.

Figure 17:
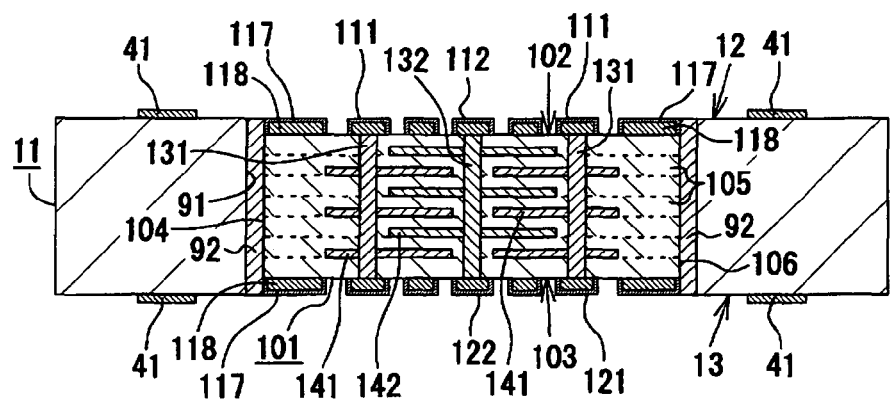
FIG. 17 is a diagram explaining the method of manufacturing a wiring board in accordance with the third embodiment.

In the coarsening step, the coarsening (CZ treatment) of the surfaces of the copper plating layers 117 on the outer terminal electrodes 111, 112, 121, and 122 and the dummy metallized layers 118 is performed (see FIGS. 17 and 19). At the same time, the coarsening of the conductor layers 41 formed on the upper surface 12 and the lower surface 13 of the board core 11 is also performed. Then, after the coarsening step is finished, a cleaning step is carried out. In addition, coupling treatment is performed with respect to the upper surface 12 and the lower surface 13 of the board core 11, as required, by using a silane coupling agent (made by Shin-Etsu Chemical Co., Ltd.).

Figure 18:
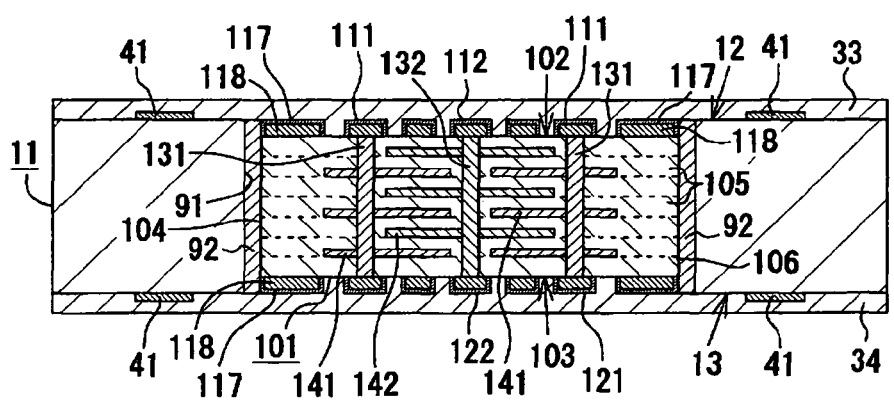
FIG. 18 is a diagram explaining the method of manufacturing a wiring board in accordance with the third embodiment.

After completion of the cleaning step, the buildup layer forming step is carried out. In the buildup layer forming step, the buildup layer 31 is formed on the upper surface 12 and the upper surface 102 in accordance with a conventionally known technique, and the buildup layer 32 is formed on the lower surface 13 and the lower surface 103 (see FIGS. 18 and 18). It should be noted that, in addition to the first outer terminal electrodes 111 and 112, the dummy metallized layer 118 is provided on the upper surface 102, and in addition to the second outer terminal electrodes 121 and 122, the dummy metallized layer 118 is provided on the lower surface 103. For this reason, the proportion of the coarsened metal portions at the bonding interface with the resin insulating layer 33 constituting the buildup layer 31 becomes large, so that the adhesive strength with respect to the resin insulating layer 33 improves. Also, the proportion of the coarsened metal portions at the bonding interface with the resin insulating layer 34 constituting the buildup layer 32 becomes large, so that the adhesive strength with respect to the resin insulating layer 34 improves. As a result, the wiring board 10 constituted by the board core 11 and the buildup layers 31 and 32 is completed.

Therefore, according to this embodiment, it is possible to obtain the following advantages.

(1) According to the wiring board 10 in accordance with this embodiment, the adhesive strength between the board core 11 and the resin insulating layer 33 constituting the buildup layer 31 improves. In addition, since irregularities on the upper surface 102 are overcome to some extent, the flatness of the surfaces of the buildup layers 31 and 32 improves, allowing the IC chip 21 to be easily mounted thereon. For these reasons, it is possible to prevent the occurrence of the lifting up or delamination of the buildup layers 31 and 32 due to thermal expansion and the like, so that it is possible to impart high reliability.

(2) In this embodiment, instead of directly coarsening the outer terminal electrodes 111, 112, 121, and 122 and the dummy metallized layers 118 which are constituted of a hard metal, the copper plating layers 117 which are softer than the same are formed, and these layers are surface-coarsened. Therefore, it is possible to obtain desired coarse surfaces relatively easily and reliably.

(3) In this embodiment, since semiconductor device mounting portion 23 of the buildup layer 31 is located in a region immediately above the ceramic capacitor 101, the semiconductor device mounting portion 23 is supported by the ceramic capacitor 101 which is highly rigid and has a small coefficient of thermal expansion. Hence, in the semiconductor device mounting portion 23, the buildup layer 31 is difficult to be deformed, so that the IC chip 21 mounted on the semiconductor device mounting portion 23 can be supported more stably. Therefore, as the IC chip 21, it is possible to use an IC chip of a large size of 10 mm square or more and a low-k (low dielectric constant) IC chip.

Furthermore, since the wiring board 10 in accordance with this embodiment has the ceramic capacitor 101, satisfactory power supply to the IC chip 21 can be attained by removing noise by the ceramic capacitor 101. Moreover, since the IC chip 21 is mounted on the semiconductor device mounting portion 23, the IC chip 21 is disposed immediately above the ceramic capacitor 101. Consequently, the wiring (capacitor connection wiring) connecting the IC chip 21 and the ceramic capacitor 101 is shortened. Therefore, the noise which enters between the IC chip 21 and the ceramic capacitor 101 can be suppressed to a very small level, so that malfunctions such as erroneous operation do not occur, and high reliability can be obtained.

(4) In this embodiment, in the coarsening step, the coarsening of the surfaces of the respective conductor layers 41 is also carried out simultaneously with the coarsening of the surfaces of the respective copper plating layers 117. As a result, since the area of the coarse surfaces of the upper surface 12 and the lower surface 13 becomes large, it is possible to obtain high adhesive strength with respect to the buildup layer 31 (or the buildup layer 32). In addition, since the coarsening of the surfaces of the conductor layers 41 and the coarsening of the surfaces of the copper plating layers 117 need not be performed separately, the wiring board 10 can be manufactured efficiently.

Figure 12:
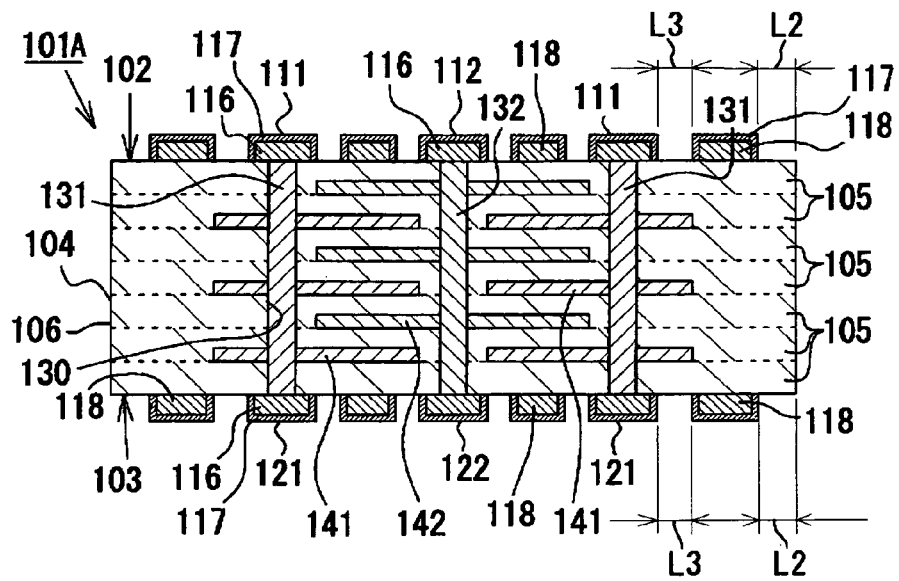
FIG. 12 is a schematic cross-sectional view illustrating the ceramic capacitor in accordance with a modification of the third embodiment.
Figure 13:
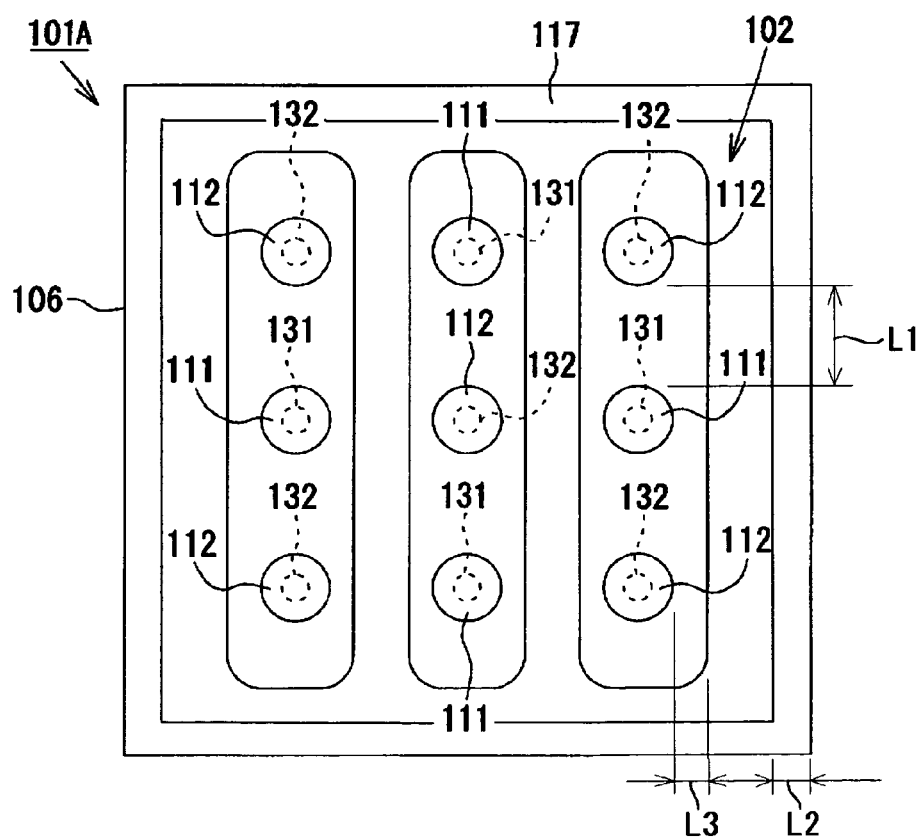
FIG. 13 is a schematic top view illustrating the ceramic capacitor in accordance with the modification of the third embodiment.

(5) Hereafter, a description will be given of a modification of this embodiment. In this modification of the embodiment shown in FIGS. 12 and 13, the distance L2 from a chip edge of a ceramic capacitor 101A to the dummy metallized layer 118 is set to not more than 200 μm (specifically 150 μm to 200 μm or thereabouts). In other words, the outer edge of the dummy metallized layer 118 does not overlap with the chip edge, so that the dummy metallized layer 118 is slightly narrower in width than the one shown in FIGS. 10 and 11. In addition, instead of the ceramic capacitor shown in FIGS. 10 and 11, the ceramic capacitor 101A having this construction may be incorporated in the board core 11

Fourth Embodiment

Referring now to the drawings, a detailed description will be given of a fourth embodiment of the wiring board in accordance with the invention.

Figure 20:
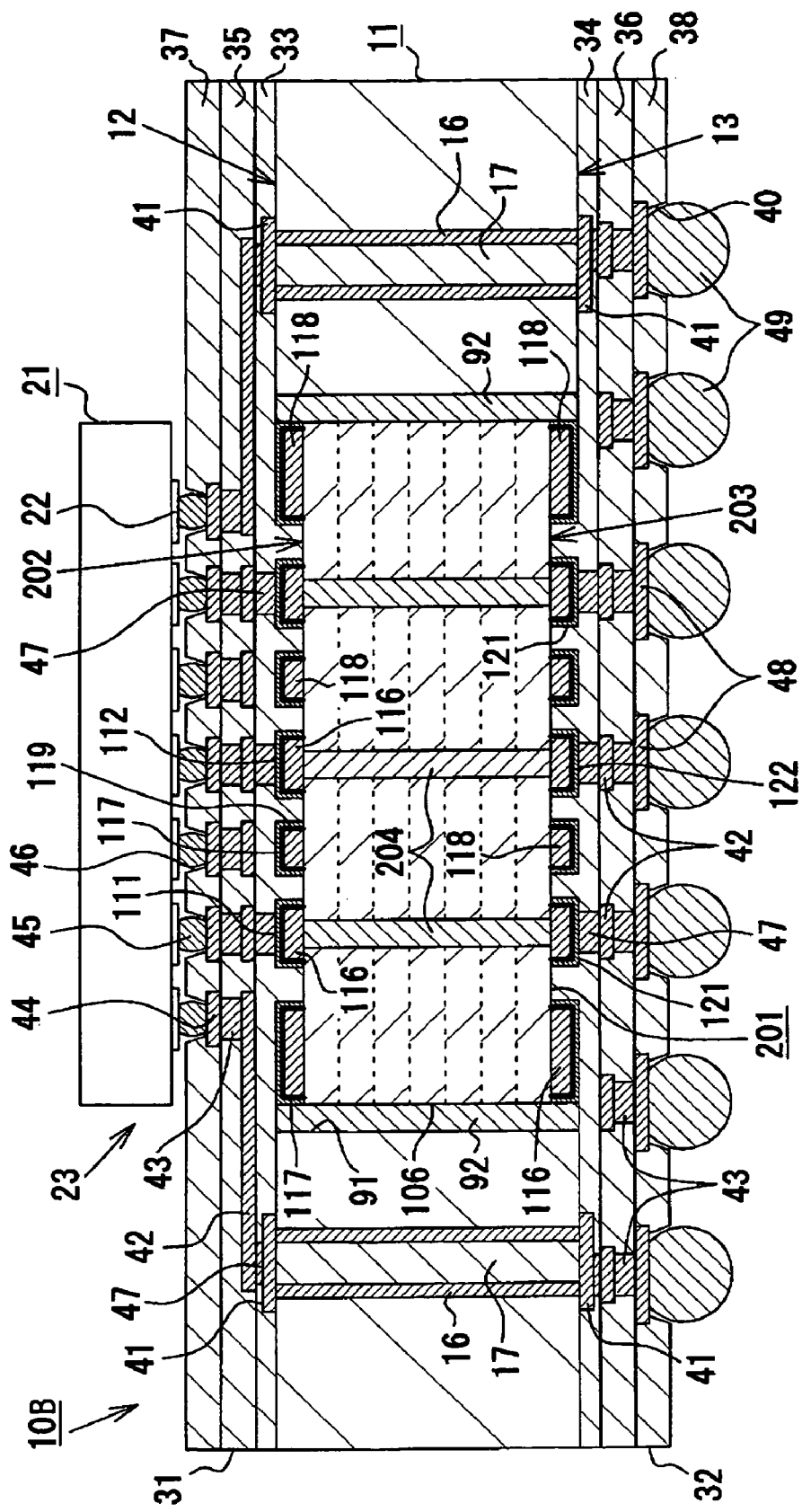
FIG. 20 is a schematic cross-sectional view illustrating the wiring board in accordance with a fourth embodiment.

As shown in FIG. 20, a wiring board 10B in accordance with this embodiment is provided with a ceramic chip 201 which does not have the function of a capacitor, instead of the ceramic capacitor 101 shown in the above-described third embodiment. A plurality of via conductors 204 penetrating an upper surface 202 (chip main surface) and a lower surface 203 are formed in the ceramic chip 201. The metallized layers 116 of the first outer terminal electrodes 111 and 112 are provided on the upper surface 202, while the metallized layers 116 of the second outer terminal electrodes 121 and 122 are provided on the lower surface 203. In addition, the dummy metallized layers 118 are respectively provided on the upper surface 202 and the lower surface 203. It should be noted that the metallized layers 116 and the dummy metallized layers 118 in this embodiment are formed of molybdenum as a principal constituent. Further, a nickel plating layer 119 and the copper plating layer 117 are sequentially laminated on the surface of each of the metallized layers 116 and the dummy metallized layers 118. Accordingly, in this embodiment, it is possible to provide the wiring board 10B which excels in the adhesive strength between the ceramic chip 201 and the interlayer insulating layers 33 and 34 constituting the buildup layers 31 and 32.

Fifth Embodiment

Referring now to the drawings, a detailed description will be given of a fifth embodiment of the wiring board in accordance with the invention.

Figure 21:
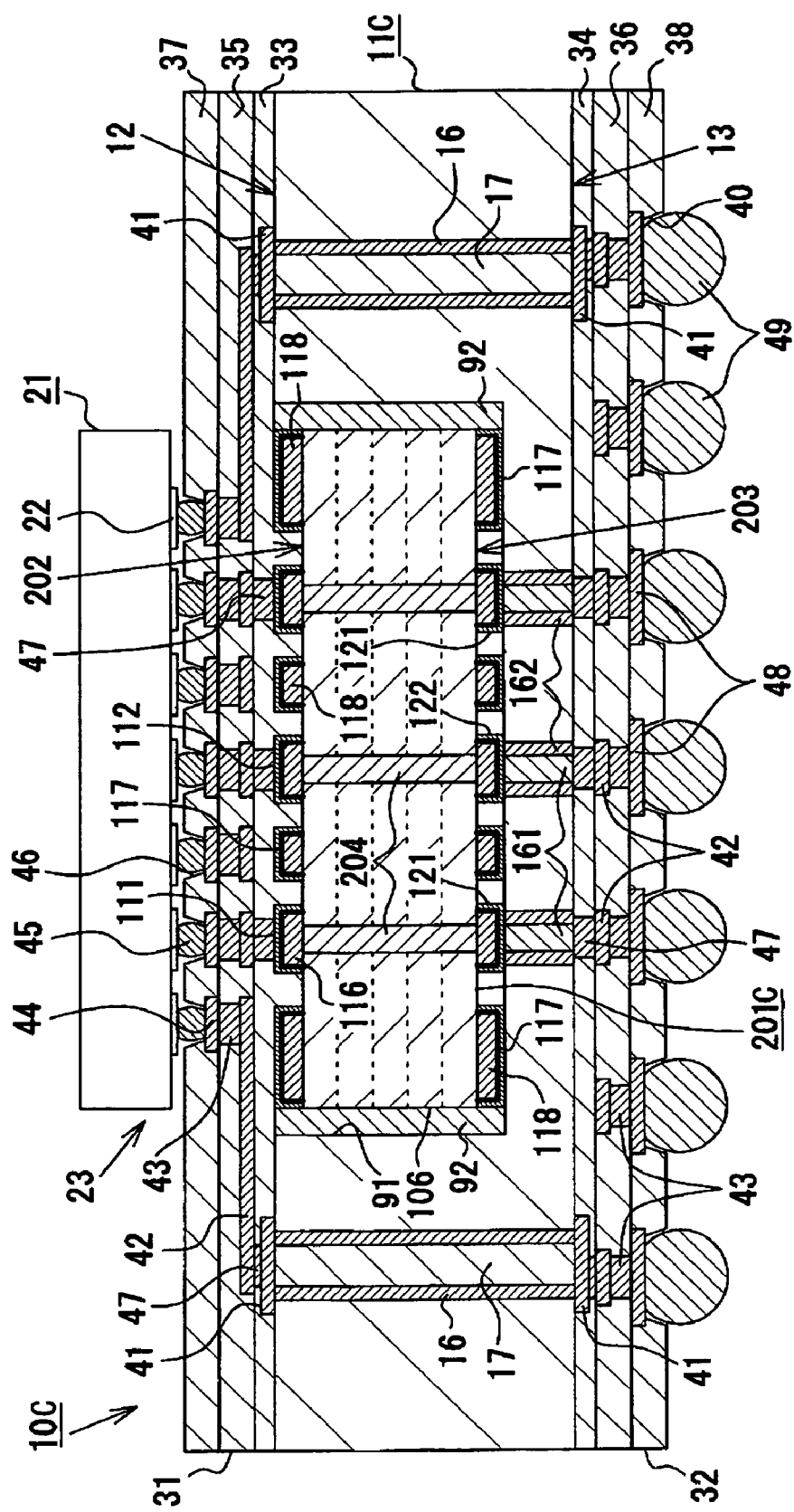
FIG. 21 is a schematic cross-sectional view illustrating the wiring board in accordance with a fifth embodiment.

As shown in FIG. 21, in a wiring board 10C in accordance with this embodiment, the accommodating hole portion 91 of a board core 11C is a bottomed recessed portion (non-through hole portion) which is open only at the upper surface 12 of the board core 11C. Accordingly, the entire resin insulating layer 34 of the buildup layer 32 abuts against the lower surface 13 of the board core 11C. In addition, a ceramic chip 201C having a construction similar to that of the above-described fourth embodiment is provided in the accommodating hole portion 91. It should be noted that the resin insulating layer 34 and the ceramic chip 201C are electrically connected to each other via a plurality of via conductors 162 penetrating the bottom surface of the accommodating hole portion 91 and the lower surface 13 of the board core 11C. The interior of each of these via conductors 162 is filled with conductor paste 161.

It should be noted that the third to fifth embodiments may be modified as follows.

In the above-described third to fifth embodiments, in the coarsening step, the coarsening of the surfaces of the conductor layers 41 is performed simultaneously with the coarsening of the surfaces of the copper plating layers 117. However, the coarsening of the conductor layers 41 may be performed separately from the coarsening of the copper plating layers 117.

In the above-described third to fifth embodiments, the outer shape of the copper plating layer 117 (dummy metallized layer 118), when viewed in the direction perpendicular to the upper surface 102, is substantially rectangular, and has a shape in which a plurality of strip-like openings extending parallel to each other are provided. However, the shape of the copper plating layer 117 (dummy metallized layer 118) may have another shape.

In the above-described third embodiment, the dummy surface conductor constituted by the dummy metallized layer 118 and the copper plating layer 117 has a substantially identical layered structure to that of the outer terminal electrodes 111, 112, 121, and 122, but the dummy surface conductor may have a different layered structure. In addition, the thickness of the dummy metallized layer 118 may be identical to or different from that of the metallized layer 116.

Instead of the filler 92 of the above-described third to fifth embodiments, a portion of the resin insulating layer 33 may be a filler. This becomes possible by effecting press lamination by using a resin film having fluidity when the resin insulating layer 33 constituting the first buildup layer 31 is formed. By so doing, even if the gaps between the inner surfaces of the accommodating hole portion 91 and the side surfaces 106 of the ceramic capacitor 101 are not filled in advance with the filler 92, the portion of the resin film enters the gaps, so that the portion of the resin film can be made to function as the filler. In addition, although in the above-described third to fifth embodiments the filler 92 is filled into the gaps by using the dispenser, the invention is not limited to the same, and the filler 92 may be printed and filled by using a printer, for example.

Figure 22:
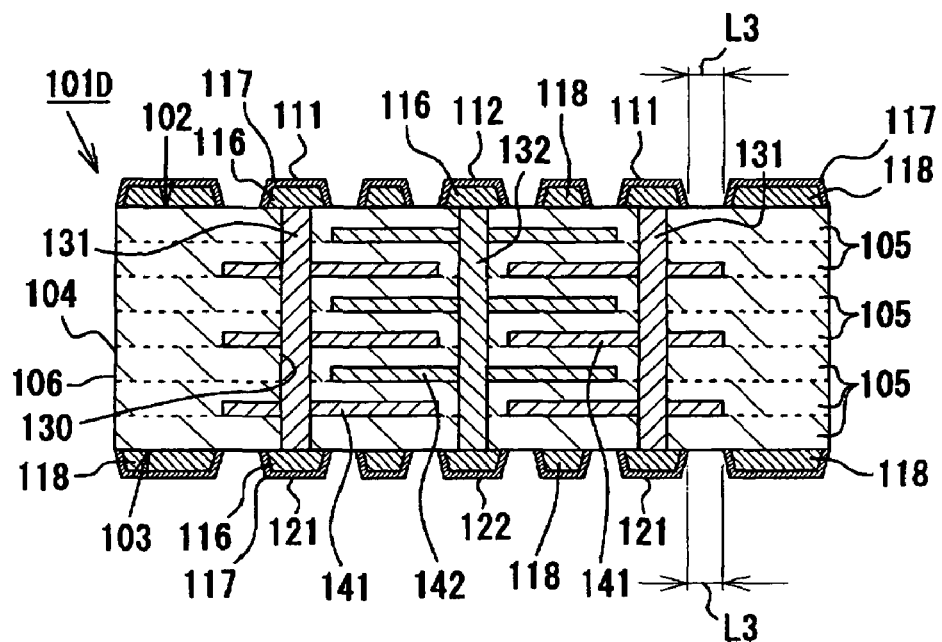
FIG. 22 is a schematic cross-sectional view illustrating a ceramic chip in accordance with another example.
Figure 23:
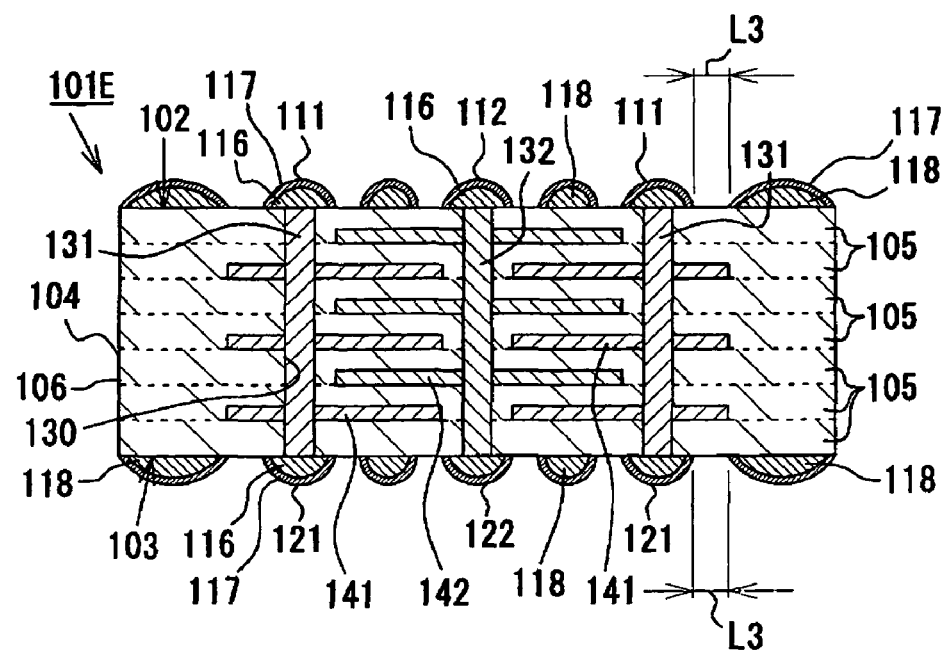
FIG. 23 is a schematic cross-sectional view illustrating the ceramic chip in accordance with still another example.

Although each of the outer terminal electrodes 111, 112, 121, and 122 and the dummy metallized layers 118 in the above-described third to fifth embodiments has a rectangular vertical cross section in which the lengths of the outer side and the inner side are equal, as shown in FIG. 10, a different shape may be adopted. For example, in a ceramic capacitor 101D in another example shown in FIG. 22, each of the outer terminal electrodes 111, 112, 121, and 122 and the dummy metallized layers 118 has a tapered vertical cross section in which the outer side is shorter than the inner side. In addition, in a ceramic capacitor 101E in still another example shown in FIG. 23, each of the outer terminal electrodes 111, 112, 121, and 122 and the dummy metallized layers 118 has a shape in which its surface is semispherical. If the electrode shapes such as those of FIGS. 22 and 23 are adopted, the resin of the resin insulating layers 33 and 34 easily flows into the recesses, thereby making it possible to easily attain improvement in the adhesion.

Although in the above-described third to fifth embodiments an example has been shown in which the ceramic chip is accommodated in the accommodating hole portion 91 of the board core 11 or 11C, it is possible to adopt a construction in which an object to be accommodated which is other than a chip and whose principal constituent is a ceramic, e.g., a chip component having a plurality of terminal electrodes, is accommodated.

Next, technical concepts which are grasped by the above-described third to fifth embodiments will be enumerated below.

(1) A wiring board comprising: a board core formed of a polymeric material as a principal constituent into a plate-like shape and having a core main surface and an accommodating hole portion which is open at the core main surface; a ceramic chip for embedment including a plate-like ceramic sintered body having a chip main surface, inner conductors formed in an interior of the ceramic sintered body, a plurality of terminal electrodes provided projectingly on the chip main surface and constituted by metallized layers conducting with the inner conductors, and a dummy metallized layer provided projectingly on the chip main surface, the ceramic chip for embedment being accommodated in the accommodating hole portion in a state in which the core main surface and the chip main surface are opposed to a same side; and a buildup layer having a structure in which an interlayer insulating layer formed of a polymeric material as a principal constituent and a conductor layer are alternately laminated on the core main surface and the chip main surface, a semiconductor device mounting portion being set on an obverse surface of the buildup layer.

(2) A wiring board according to the above-described wiring board (1) wherein a metal layer constituted of a metal softer than a metal constituting the plurality of terminal electrodes and the dummy metallized layer is formed on surfaces of the plurality of terminal electrodes and the dummy metallized layer, and the metal layer is a copper plating layer with a thickness of not less than 5 μm.

(3) A wiring board comprising: a board core formed of a polymeric material as a principal constituent into a plate-like shape and having a core main surface, a core reverse surface, and an accommodating hole portion which is open at both the core main surface and the core reverse surface; a ceramic chip for embedment including a plate-like ceramic sintered body having a chip main surface and a chip reverse surface, inner conductors formed in an interior of the ceramic sintered body, a plurality of first terminal electrodes provided projectingly on the chip main surface and constituted by metallized layers conducting with the inner conductors, a plurality of second terminal electrodes provided projectingly on the chip reverse surface and constituted by metallized layers conducting with the inner conductors, and dummy metallized layers which are respectively provided projectingly on the chip main surface and the chip reverse surface, the ceramic chip for embedment being accommodated in the accommodating hole portion in a state in which the core main surface and the chip main surface are opposed to a same side; a first buildup layer having a structure in which an interlayer insulating layer formed of a polymeric material as a principal constituent and a conductor layer are alternately laminated on the core main surface and the chip main surface, a semiconductor device mounting portion being set on an obverse surface of the first buildup layer; and a second buildup layer having a structure in which an interlayer insulating layer formed of a polymeric material as a principal constituent and a conductor layer are alternately laminated on the core reverse surface and the chip reverse surface.

(5) A ceramic chip component for embedment which is a chip component for use in a state of being embedded in a board core formed of a polymeric material as a principal constituent, comprising: a component body having a chip main surface; inner conductors formed in an interior of the component body; a plurality of terminal electrodes provided projectingly on the chip main surface and constituted by metallized layers conducting with the inner conductors, and a dummy metallized layer provided projectingly on the chip main surface.

Sixth Embodiment

Referring now to the drawings, a detailed description will be given of a sixth embodiment of the wiring board in accordance with the invention.

Figure 24:
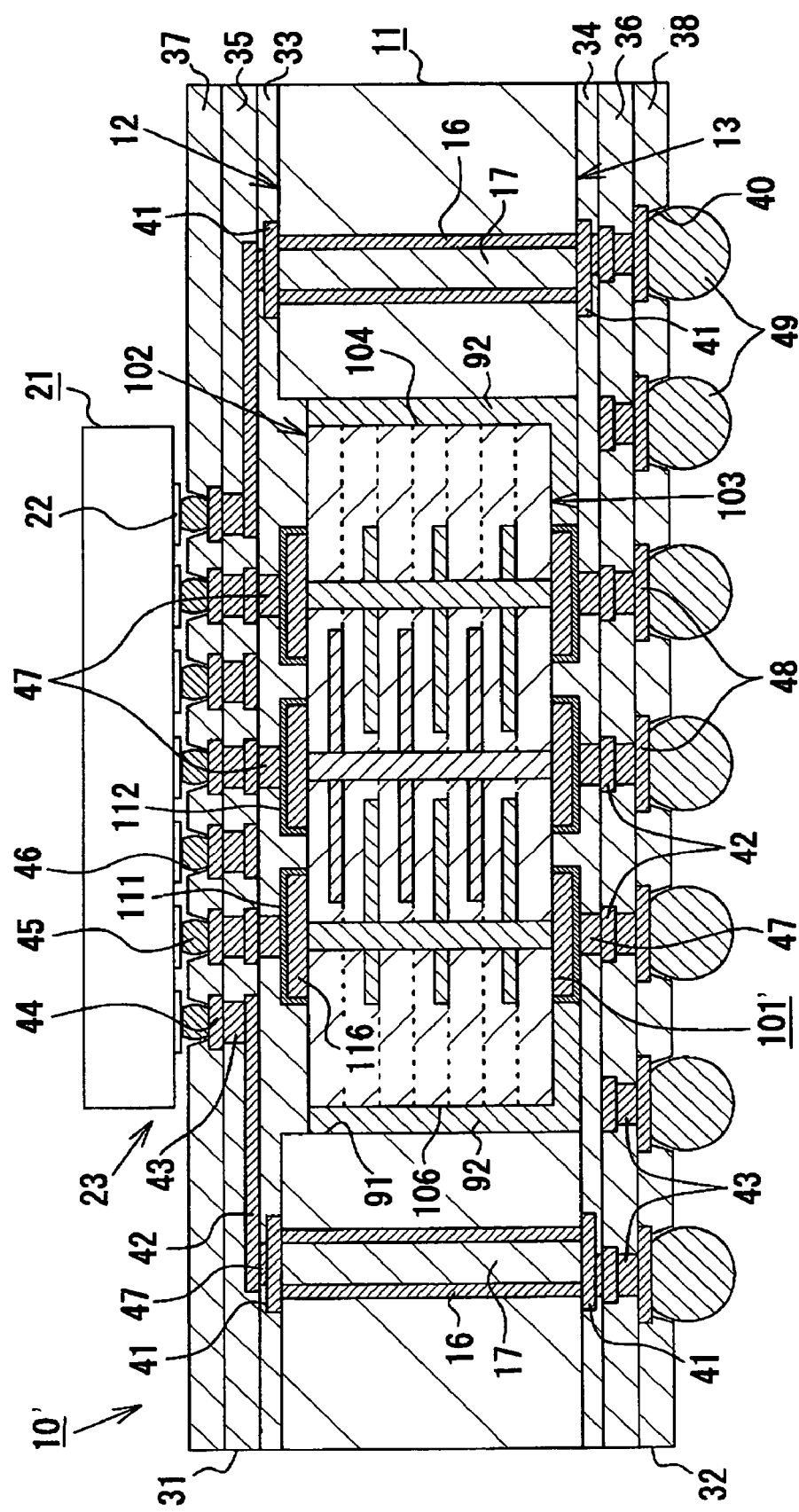
FIG. 24 is a schematic cross-sectional view illustrating the wiring board in accordance with a sixth embodiment.

As shown in FIG. 24, the wiring board 10' in accordance with this embodiment is comprised of the substantially rectangular plate-shaped board core 11 which is a wiring board for mounting on an IC chip and is formed of glass epoxy; the buildup layer 31 formed on then upper surface 12 (core main surface) of the board core 11; and the buildup layer 32 formed on the lower surface 13 of the board core 11. The through hole conductors 16 are formed at a plurality of portions in the board core 11. These through hole conductors 16 connect and conduct the upper surface 12 side and the lower surface 13 side of the board core 11. It should be noted that the interior of each through hole conductor 16 is filled with the closure body 17 such as an epoxy resin. Further, the conductor layers 41 formed of copper are respectively pattern-formed on the upper surface 12 and the lower surface 13 of the board core 11, and each conductor layer 41 is electrically connected to the through hole conductor 16.

The buildup layer 31 formed on the upper surface 12 of the board core 11 has a structure in which the two resin insulating layers 33 and 35 (so-called interlayer insulating layers) formed of an epoxy resin, as well as the conductor layer 42 formed of copper, are alternately laminated. The terminal pads 44 are formed at a plurality of portions on the obverse surface of the second resin insulating layer 35 in the form of an array. Further, the obverse surface of the resin insulating layer 35 is practically entirely covered with the solder resist 37. Opening portions 46 for exposing the terminal pads 44 are formed at predetermined portions of the solder resist 37. The plurality of solder bumps 45 are respectively disposed on the surfaces of the terminal pads 44. Each solder bump 45 is electrically connected to the surface connection terminal 22 of the IC chip 21 (semiconductor integrated circuit device). It should be noted that the terminal pads 44 and the solder bumps 45 are located within the region immediately above the ceramic capacitor 101' in the buildup layer 31, and this region constitutes the semiconductor device mounting portion 23. In addition, the via conductors 43 and 47 are respectively provided in the resin insulating layers 33 and 35. Most of these via conductors 43 and 47 are disposed coaxially, and the conductor layers 41 and 42 and the terminal pads 44 are electrically connected to each other via them.

As shown in FIG. 24, the buildup layer 32 formed on the lower surface 13 of the board core 11 has a structure substantially identical to that of the above-described buildup layer 31. Namely, the buildup layer 32 has a structure in which two resin insulating layers 34 and 36 formed of an epoxy resin and the conductor layer 42 are alternately laminated. The BGA pads 48, which are electrically connected to the conductor layers 42 via the via conductors 43, are formed at a plurality of portions on the lower surface of the second resin insulating layer 36 in the form of an array. Further, the lower surface of the resin insulating layer 36 is practically entirely covered with the solder resist 38. The opening portions 40 for exposing the BGA pads 48 are formed at predetermined portions of the solder resist 38. The plurality of solder bumps 49 for establishing electrical connection to the unillustrated motherboard are respectively disposed on the surfaces of the BGA pads 48. The wiring board 10' shown in FIG. 24 is mounted on an unillustrated motherboard by means of the solder bumps 49.

Figure 25:
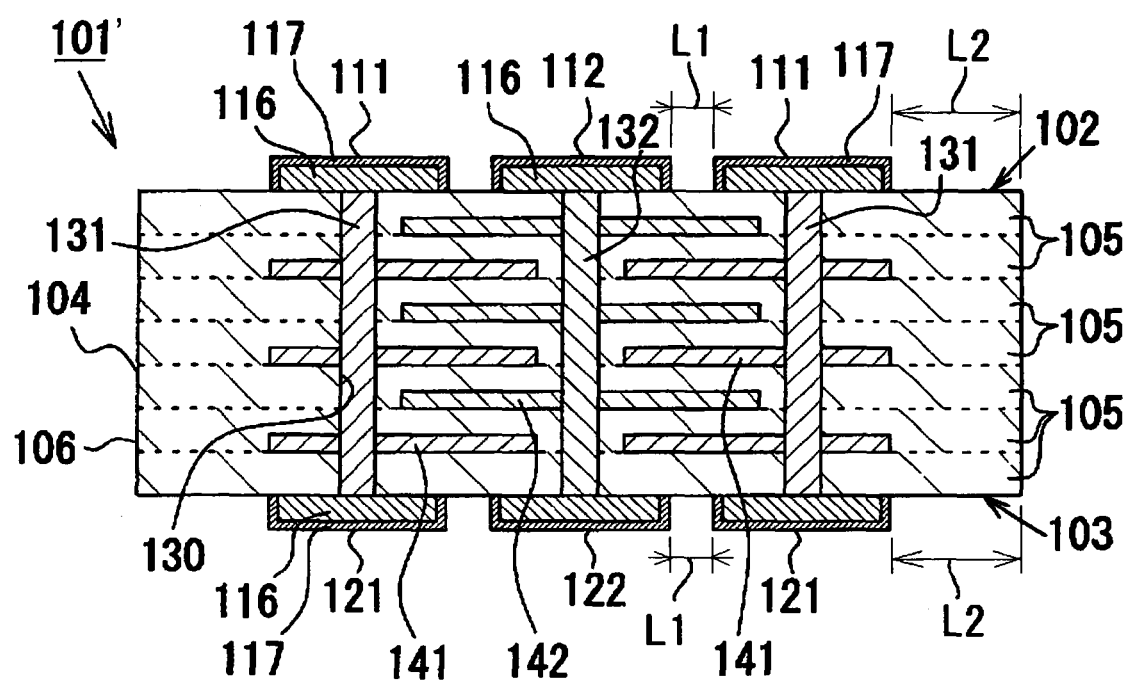
FIG. 25 is a schematic cross-sectional view illustrating the ceramic capacitor in accordance with the sixth embodiment.
Figure 26:
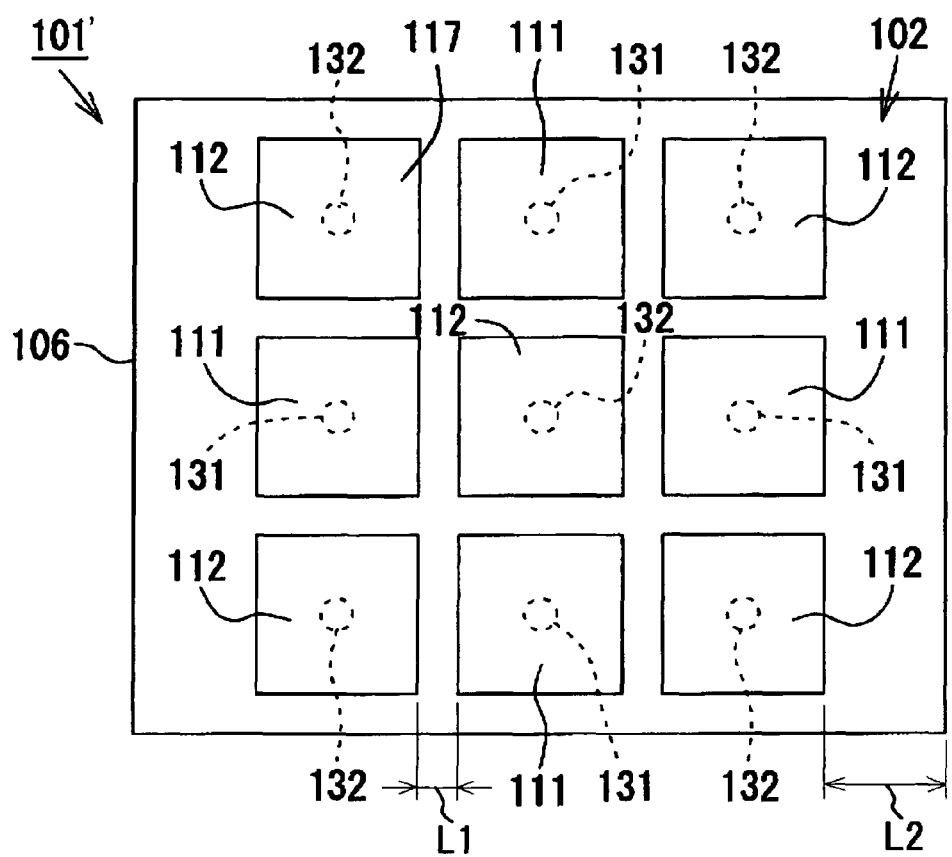
FIG. 26 is a schematic top view illustrating the ceramic capacitor in accordance with the sixth embodiment.

The board core 11 has the rectangular accommodating hole portion 91, as viewed in a plan view, which is open in the central portion of the upper surface 12 and in the central portion of the lower surface 13. Namely, the accommodating hole portion 91 is a through hole portion. The ceramic capacitor 101' (ceramic chip for embedment) shown in FIGS. 25 and 26 is accommodated in the accommodating hole portion 91 in an embedded state. It should be noted that the ceramic capacitor 101' is accommodated with its upper surface 102 (chip main surface) facing the same side as the upper surface 12 of the board core 11. The ceramic capacitor 101' in accordance with this embodiment has the shape of a rectangular flat plate which is 12.0 mm long, 12.0 mm wide, and 0.8 mm thick. It should be noted that the thickness of the ceramic capacitor 101' is preferably no less than 0.2 mm and not more than 1.0 mm. If the thickness of the ceramic capacitor 101' is less than 0.2 mm, the IC chip 21 on the semiconductor device mounting portion 23 cannot be reliably supported by the ceramic capacitor 101'. On the other hand, if it is greater than 1.0 mm, the wiring board 10' becomes large in thickness.

In addition, the gap between the inner surface of the accommodating hole portion 91 and the side surface 106 of the ceramic capacitor 101' is filled with the filler 92 formed of a polymeric material (thermosetting resin in this embodiment). This filler 92 has the functions of fixing the ceramic capacitor 101' to the board core 11 and of allowing the deformation in the planar direction and the thicknesswise direction of the ceramic capacitor 101' and the board core 11 to be absorbed by their own resilient deformation. It should be noted that the ceramic capacitor 101' has a substantially square shape in a plan view, and each of its four corners is rounded with a radius of 0.60 mm or more (or chamfered with a taper C of 0.60 or more). As a result, when the filler 92 is deformed in consequence of a temperature change, it is possible to alleviate the concentration of stress at the corner portions of the ceramic capacitor 101', so that it is possible to prevent the occurrence of cracks in the filler 92.

As shown in FIGS. 24 to 26, the ceramic capacitor 101' in accordance with this embodiment is a so-called via array type ceramic capacitor. The ceramic sintered body 104 constituting the ceramic capacitor 101' is a plate-like piece having the upper surface 102 and the lower surface 103 (chip reverse surface). It should be noted that the aforementioned resin insulating layer 33 constituting the aforementioned buildup layer 31 is formed on the upper surface 102 of the ceramic sintered body 104, while the aforementioned resin insulating layer 34 constituting the aforementioned buildup layer 32 is formed on the lower surface 103 of the ceramic sintered body 104. The ceramic sintered body 104 has a structure in which the first inner electrode layers 141 (inner conductors) and the second inner electrode layers 142 (inner conductors) are alternately laminated and arranged via the ceramic dielectric layer 105. The ceramic dielectric layer 105 consists of a sintered body of barium titanate, i.e., a kind of a high dielectric constant ceramic, and functions as a dielectric (insulator) between the first inner electrode layer 141 and the second inner electrode layer 142. The first inner electrode layers 141 and the second inner electrode layers 142 are layers which are formed of nickel as a principal constituent, and are arranged alternately inside the ceramic sintered body 104.

As shown in FIGS. 25 and 26, the multiplicity of via holes 130 are formed in the ceramic sintered body 104. These via holes 130 penetrate the ceramic sintered body 104 in its thicknesswise direction, and are arranged on its entire surface in the form of an array. The plurality of via conductors 131 and 132 (inner conductors) penetrating between the upper surface 102 and the lower surface 103 of the ceramic sintered body 104 are formed in the respective via holes 130 by using nickel as a principal constituent. Each first via conductor 131 penetrates the respective first inner electrode layer 141, and electrically connects them to each other. Each second via conductor 132 penetrates the respective second inner electrode layer 142, and electrically connects them to each other.

As shown in FIGS. 25 and 26, the pluralities of first outer terminal electrodes 111 and 112 (terminal electrodes) are projectingly provided on the upper surface 102 of the ceramic sintered body 104. These first outer terminal electrodes 111 and 112 are arranged on the entire surface of the upper surface 102 in the form of an array. The occupying area of the plurality of first outer terminal electrodes 111 and 112 is approximately 68% of the area of the upper surface 102. Meanwhile, the pluralities of second outer terminal electrodes 121 and 122 (terminal electrodes) are projectingly provided on the lower surface 103 of the ceramic sintered body 104. These second outer terminal electrodes 121 and 122 are arranged on the entire surface of the lower surface 103 in the form of an array. The occupying area of the plurality of second outer terminal electrodes 121 and 122 is approximately 68% of the area of the lower surface 103. In addition, the first outer terminal electrodes 111 and 112 on the upper surface 102 side are electrically connected to the aforementioned via conductors 47. Meanwhile, the second outer terminal electrodes 121 and 122 on the lower surface 103 side are electrically connected to electrodes (contacts) of the unillustrated motherboard via the via conductors 47, the conductor layers 42, the via conductors 43, the BGA pads 48, and the solder bumps 49. In addition, substantially central portions of bottom surfaces of the first outer terminal electrodes 111 and 112 are directly connected to upper surface 102-side end faces of the via conductors 131 and 132, while substantially central portions of bottom surfaces of the second outer terminal electrodes 121 and 122 are directly connected to lower surface 103-side end faces of the via conductors 131 and 132. Accordingly, the outer terminal electrodes 111 and 121 conduct with the via conductors 131 and the first inner electrode layers 141, while the inner terminal electrodes 112 and 122 conduct with the via conductors 132 and the second inner electrode layers 142.

Figure 32:
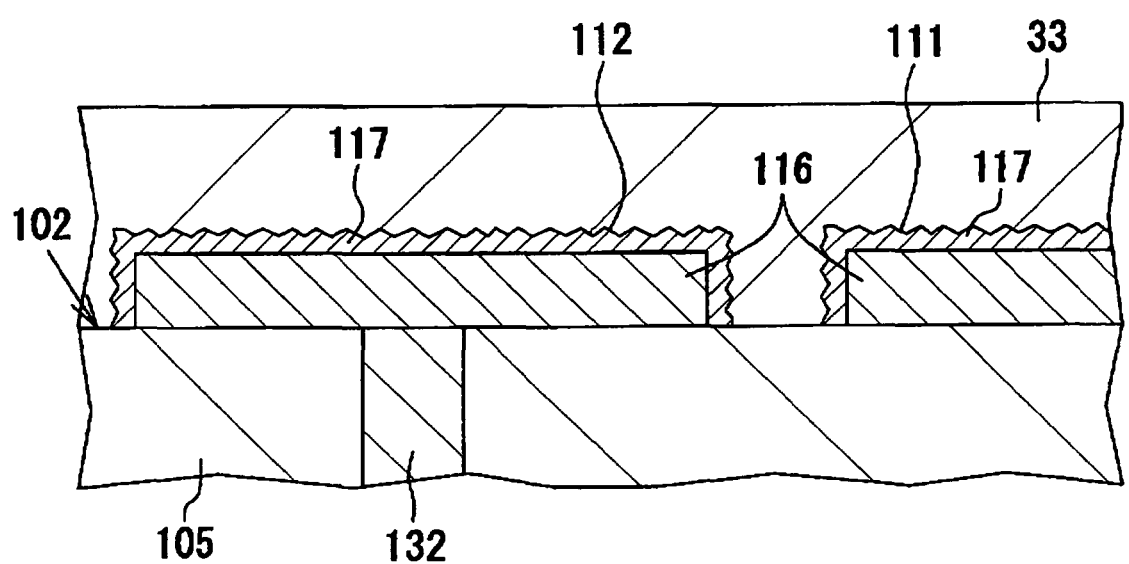
FIG. 32 is a cross-sectional view of essential portions of the wiring board in accordance with the sixth embodiment.

As shown in FIG. 25, the first outer terminal electrodes 111 and 112 are constituted by the metallized layers 116 formed of nickel as a principal material. The surfaces of the metallized layers 116 are entirely covered with the copper plating layers 117 (metal layers). Likewise, the second outer terminal electrodes 121 and 122 are also constituted by metallized layers 116, and the surfaces of these metallized layers 116 are also covered with copper plating layers 117. Namely, the copper plating layers 117 are formed of a metal softer than the metal constituting the metallized layers 116. As shown in FIG. 32, since the surfaces of the copper plating layers 117 have been coarsened, the surfaces of the first outer terminal electrodes 111 and 112 are coarser than the upper surface 102 of the ceramic sintered body 104. Similarly, the surfaces of the second outer terminal electrodes 121 and 122 are coarser than the lower surface 103 of the ceramic sintered body 104. It should be noted that the surface roughness Ra of the copper plating layer 117 in this embodiment is set to approximately 0.5 µm. In addition, as shown in FIG. 26, the outer shape of each of the outer terminal electrodes 111, 112, 121, and 122, when viewed in the direction perpendicular to the upper surface 102 (in the direction toward the chip main surface), is square. It should be noted that in this embodiment the length of one side of each of the outer terminal electrodes 111, 112, 121, and 122 is set to approximately 495 µm, and a minimum length of the pitch is set to approximately 500 µm.

In addition, in this embodiment shown in FIGS. 25 and 26, the distance L2 from a chip edge of the ceramic capacitor 101' to the terminal electrode (each of the first terminal electrodes 111 and 112 and the second terminal electrodes 121 and 122) is set to not more than 200 µm (specifically 150 µm to 200 µm or thereabouts). The distance L1 between adjacent ones of the plurality of terminal electrodes (the first terminal electrodes 111 and 112 or the second terminal electrodes 121 and 122) is set to not more than 200 µm (specifically, 150 µm to 200 µm or thereabouts).

When electric conduction is effected from the motherboard side via the second outer terminal electrodes 121 and 122 to apply a voltage across the first inner electrode layers 141 and the second inner electrode layers 142, positive charges, for example, are accumulated in the first inner electrode layers 141, while negative charges, for example, are accumulated in the second inner electrode layers 142. As a result, the ceramic capacitor 101' functions as a capacitor. In addition, in this ceramic capacitor 101', the first via conductors 131 and the second via conductors 132 are respectively disposed adjacent to each other, and are set such that the directions of current flowing through the first via conductors 131 and the second via conductors 132 become opposite to each other. A reduction of the inductance component is thereby attained.

Next, a description will be given of the method of manufacturing the wiring board 10' in accordance with this embodiment.

In the preparing step, the board core 11 and the ceramic capacitor 101' are respectively fabricated by conventionally known techniques, and are prepared in advance.

Figure 27:
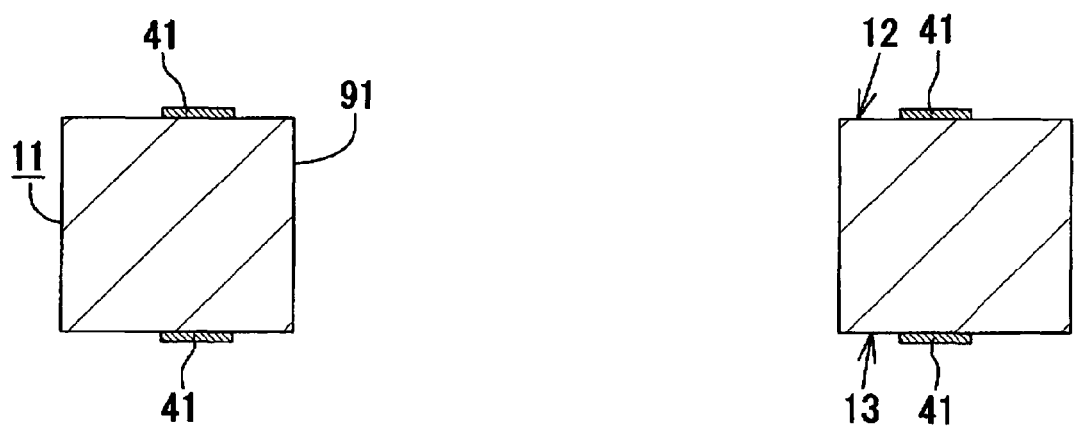
FIG. 27 is a diagram explaining the method of manufacturing a wiring board in accordance with the sixth embodiment.

The board core 11 is fabricated as follows. First, a copper clad laminate is prepared which is clad with copper foil on both sides of a base material which is 400 mm long, 400 mm wide, and 0.8 mm thick. It should be noted that the thickness of the base material is preferably not less than 0.2 mm and not more than 1.0 mm. Next, drilling is performed on the copper clad laminate by using a drill machine, whereby through holes (not shown) for forming the through hole conductors 16 are formed in advance at predetermined positions. Further, drilling is performed on the copper clad laminate by using a router, whereby a through hole serving as the accommodating hole portion 91 is formed in advance at a predetermined position (see FIG. 27). It should be noted that the through hole serving as the accommodating hole portion 91 is a hole which is substantially square in cross section, one side of which is 14.0 mm, and whose four corners are rounded with a radius of 0.1 to 0.2 mm or thereabouts. The through hole conductors 16 are formed by performing electroless copper plating and electrolytic copper plating in accordance with conventionally known techniques. Further, the copper foil on both surfaces of the copper clad laminate is subjected to etching so as to pattern the conductor layers 41 by the subtracting method, for example. Specifically, after electroless copper plating, electrolytic copper plating is performed by using this electroless copper plating layer as a common electrode. This electrolytic copper plating layer is further laminated with a dry film, and as exposure and development are carried out with respect to the dry film, the dry film is formed into a predetermined pattern. In this state, an unnecessary electrolytic copper plating layer, electroless copper layer, and copper foil are removed by etching. Subsequently, the board core 11 is obtained by exfoliating the dry film.

In addition, the ceramic capacitor 101' shown in FIG. 25 is fabricated as follows. Namely, ceramic green sheets are formed, and nickel paste for inner electrode layers is screen-printed on these green sheets and is allowed to dry. In consequence, first inner electrode portions and second inner electrode portions, which respectively serve as the first inner electrode layers 141 and the second inner electrode layers 142 later, are formed. Next, the green sheets each having the first inner electrode portions formed thereon and the green sheets each having the second inner electrode portions formed thereon are alternately laminated, and as a pressing force is imparted thereto in the laminated direction of the sheets, thereby integrating the green sheets and forming a green sheet laminate.

Furthermore, the via holes 130 are penetratingly formed in the green sheet laminate by using a laser processing machine, and nickel paste for via conductors is filled into the respective via holes 130 by using an unillustrated paste press-fitting and filling device. Next, paste is printed on the upper surface of the green sheet laminate, and the metallized layers 116 of the first outer terminal electrodes 111 and 112 are formed on the upper surface side of the green sheet laminate in such a manner as to cover the upper end faces of the respective conductors. Also, paste is printed on the lower surface of the green sheet laminate, and the metallized layers 116 of the second outer terminal electrodes 121 and 122 are formed on the lower surface side of the green sheet laminate in such a manner as to cover the lower end faces of the respective conductors.

Subsequently, the green sheet laminate is allowed to dry, and the surface terminal portions are solidified to some extent. Next, the green sheet laminate is degreased, and firing is performed at a predetermined temperature for a predetermined period of time. As a result, barium titanate and nickel in the paste are simultaneously sintered, thereby obtaining the ceramic sintered body 104.

Next, electroless copper plating (thickness: 10 μm or thereabouts) is carried out with respect to the respective outer terminal electrodes 111, 112, 121, and 122 of the ceramic sintered body 104 thus obtained. In consequence, the copper plating layers are formed on the respective outer terminal electrodes 111, 112, 121, and 122, thereby completing the ceramic capacitor 101'. It should be noted that since the thickness of the electroless copper plating layers is 10 mm or thereabouts which is slightly thick, the thickness of copper can be secured even after undergoing the later coarsening step. It should be noted that electrolytic copper plating may be performed instead of electroless copper plating.

Figure 28:
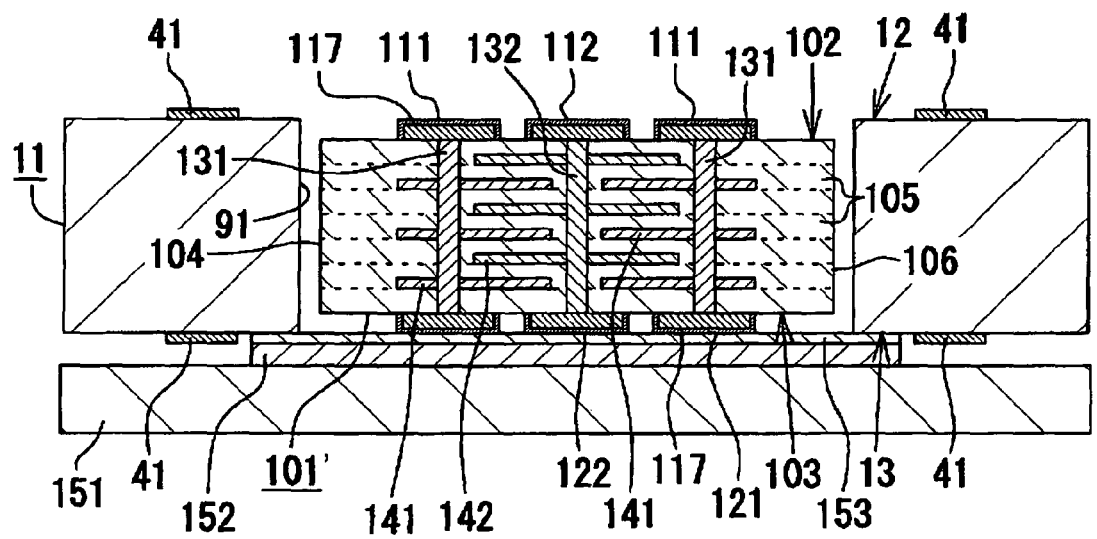
FIG. 28 is a diagram explaining the method of manufacturing a wiring board in accordance with the sixth embodiment.

In the subsequent fixing step, the ceramic capacitor 101' is accommodated in the accommodating hole portion 91 by using a mounting device (made by Yamaha Motor Co., Ltd.) (see FIG. 28). It should be noted that the lower surface 13-side opening of the accommodating hole portion 91 is sealed by the exfoliable pressure sensitive adhesive tape 152 (made by TERAOKA SEISAKUSHO CO., LTD.) in a taping step. This pressure sensitive adhesive tape 152 is supported by the supporting table 151. The ceramic capacitor 101' is adhered and temporarily fixed to the pressure sensitive adhesive surface 153 of such a pressure sensitive adhesive tape 152.

Figure 29:
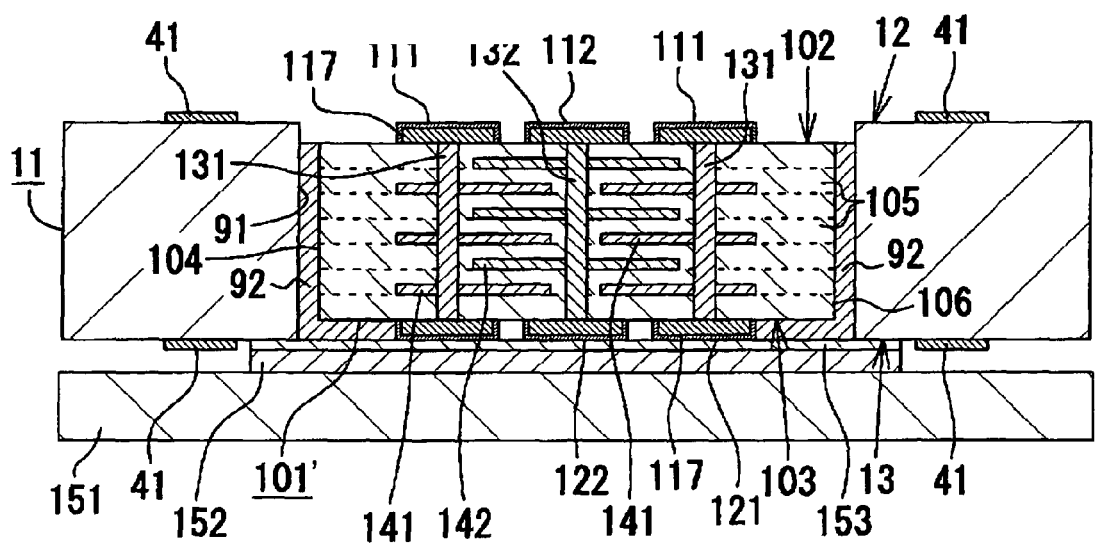
FIG. 29 is a diagram explaining the method of manufacturing a wiring board in accordance with the sixth embodiment.

In this state, the filler 92 made of a thermosetting resin (an underfiller made by NAMIX Co., Ltd.) is filled into gaps between the inner surfaces of the accommodating hole portion 91 and the side surfaces 106 of the ceramic capacitor 101' by using a dispenser (made by Asymtek Corporation) (see FIG. 29). Subsequently, if heat treatment is carried out, the filler 92 is cured, so that the ceramic capacitor 101' is fixed in the accommodating hole portion 91. Then, at this point of time, the pressure sensitive adhesive tape 152 is peeled off.

Figure 30:
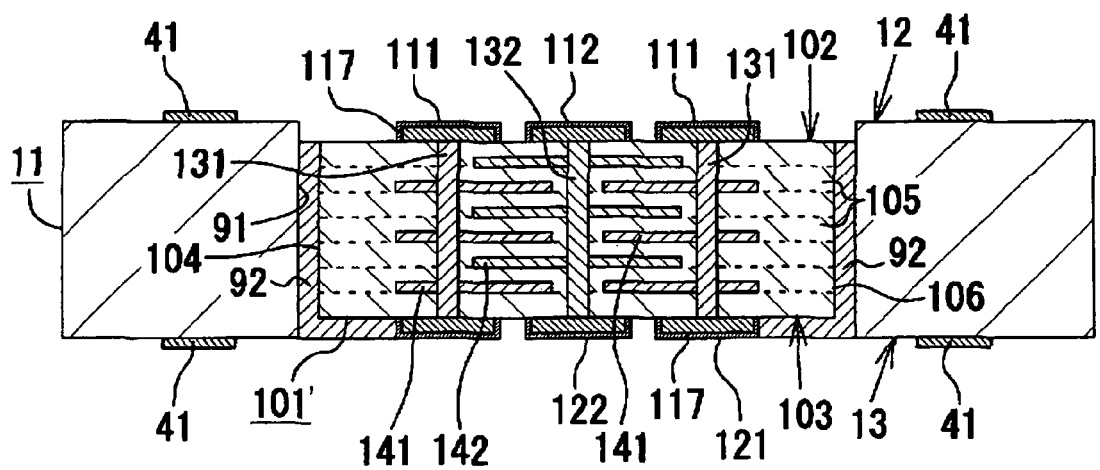
FIG. 30 is a diagram explaining the method of manufacturing a wiring board in accordance with the sixth embodiment.

In the coarsening step, the coarsening (CZ treatment) of the surfaces of the copper plating layers 117 on the outer terminal electrodes 111, 112, 121, and 122 is performed (see FIGS. 30 and 32). At the same time, the coarsening of the conductor layers 41 formed on the upper surface 12 and the lower surface 13 of the board core 11 is also performed. Then, after the coarsening step is finished, a cleaning step is carried out. In addition, coupling treatment is performed with respect to the upper surface 12 and the lower surface 13 of the board core 11, as required, by using a silane coupling agent (made by Shin-Etsu Chemical Co., Ltd.).

Figure 31:
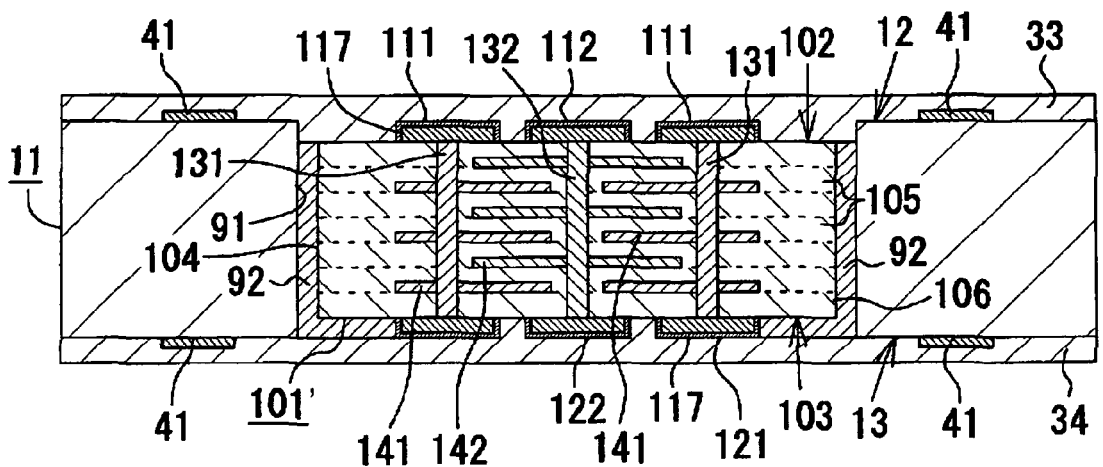
FIG. 31 is a diagram explaining the method of manufacturing a wiring board in accordance with the sixth embodiment.

After completion of the cleaning step, the buildup layer forming step is carried out. In the buildup layer forming step, the buildup layer 31 is formed on the upper surface 12 and the upper surface 102 in accordance with a conventionally known technique, and the buildup layer 32 is formed on the lower surface 13 and the lower surface 103 (see FIGS. 31 and 32). It should be noted that the occupying area of the plurality of first outer terminal electrodes 111 and 112 is set to approximately 68% of the area of the upper surface 102, while the occupying area of the plurality of second outer terminal electrodes 121 and 122 is set to approximately 68% of the area of the lower surface 103. For this reason, the proportion of the coarsened metal portions at the bonding interface with the resin insulating layer 33 constituting the buildup layer 31 becomes large, so that the adhesive strength with respect to the resin insulating layer 33 improves. Also, the proportion of the coarsened metal portions at the bonding interface with the resin insulating layer 34 constituting the buildup layer 32 becomes large, so that the adhesive strength with respect to the resin insulating layer 34 improves. As a result, the wiring board 10' constituted by the board core 11 and the buildup layers 31 and 32 is completed.

Therefore, according to this embodiment, it is possible to obtain the following advantages.

(1) According to the wiring board 10' in accordance with this embodiment, the adhesive strength between the board core 11 and the resin insulating layer 33 constituting the buildup layer 31 improves. In addition, since irregularities on the upper surface 102 are overcome to some extent, the flatness of the surfaces of the buildup layers 31 and 32 improves, allowing the IC chip 21 to be easily mounted thereon. For these reasons, it is possible to prevent the occurrence of the lifting up or delamination of the buildup layers 31 and 32 due to thermal expansion and the like, so that it is possible to impart high reliability.

(2) In this embodiment, instead of directly coarsening the outer terminal electrodes 111, 112, 121, and 122 which are constituted of a hard metal, the copper plating layers 117 which are softer than the same are formed, and these layers are surface-coarsened. Therefore, it is possible to obtain desired coarse surfaces relatively easily and reliably.

(3) In this embodiment, since semiconductor device mounting portion 23 of the buildup layer 31 is located in a region immediately above the ceramic capacitor 101', the semiconductor device mounting portion 23 is supported by the ceramic capacitor 101' which is highly rigid and has a small coefficient of thermal expansion. Hence, in the semiconductor device mounting portion 23, the buildup layer 31 is difficult to be deformed, so that the IC chip 21 mounted on the semiconductor device mounting portion 23 can be supported more stably. Therefore, as the IC chip 21, it is possible to use an IC chip of a large size of 10 mm square or more and a low-k (low dielectric constant) IC chip.

Furthermore, since the wiring board 10' in accordance with this embodiment has the ceramic capacitor 101', satisfactory power supply to the IC chip 21 can be attained by removing noise by the ceramic capacitor 101'. Moreover, since the IC chip 21 is mounted on the semiconductor device mounting portion 23, the IC chip 21 is disposed immediately above the ceramic capacitor 101'. Consequently, the wiring (capacitor connection wiring) connecting the IC chip 21 and the ceramic capacitor 101' is shortened. Therefore, the noise which enters between the IC chip 21 and the ceramic capacitor 101' can be suppressed to a very small level, so that malfunctions such as erroneous operation do not occur, and high reliability can be obtained.

(4) In this embodiment, in the coarsening step, the coarsening of the surfaces of the respective conductor layers 41 is also carried out simultaneously with the coarsening of the surfaces of the respective copper plating layers 117. As a result, since the area of the coarse surfaces of the upper surface 12 and the lower surface 13 becomes large, it is possible to obtain high adhesive strength with respect to the buildup layer 31 (or the buildup layer 32). In addition, since the coarsening of the surfaces of the conductor layers 41 and the coarsening of the surfaces of the copper plating layers 117 need not be performed separately, the wiring board 10' can be manufactured efficiently.

Seventh Embodiment

Referring now to the drawings, a detailed description will be given of a seventh embodiment of the wiring board in accordance with the invention.

Figure 33:
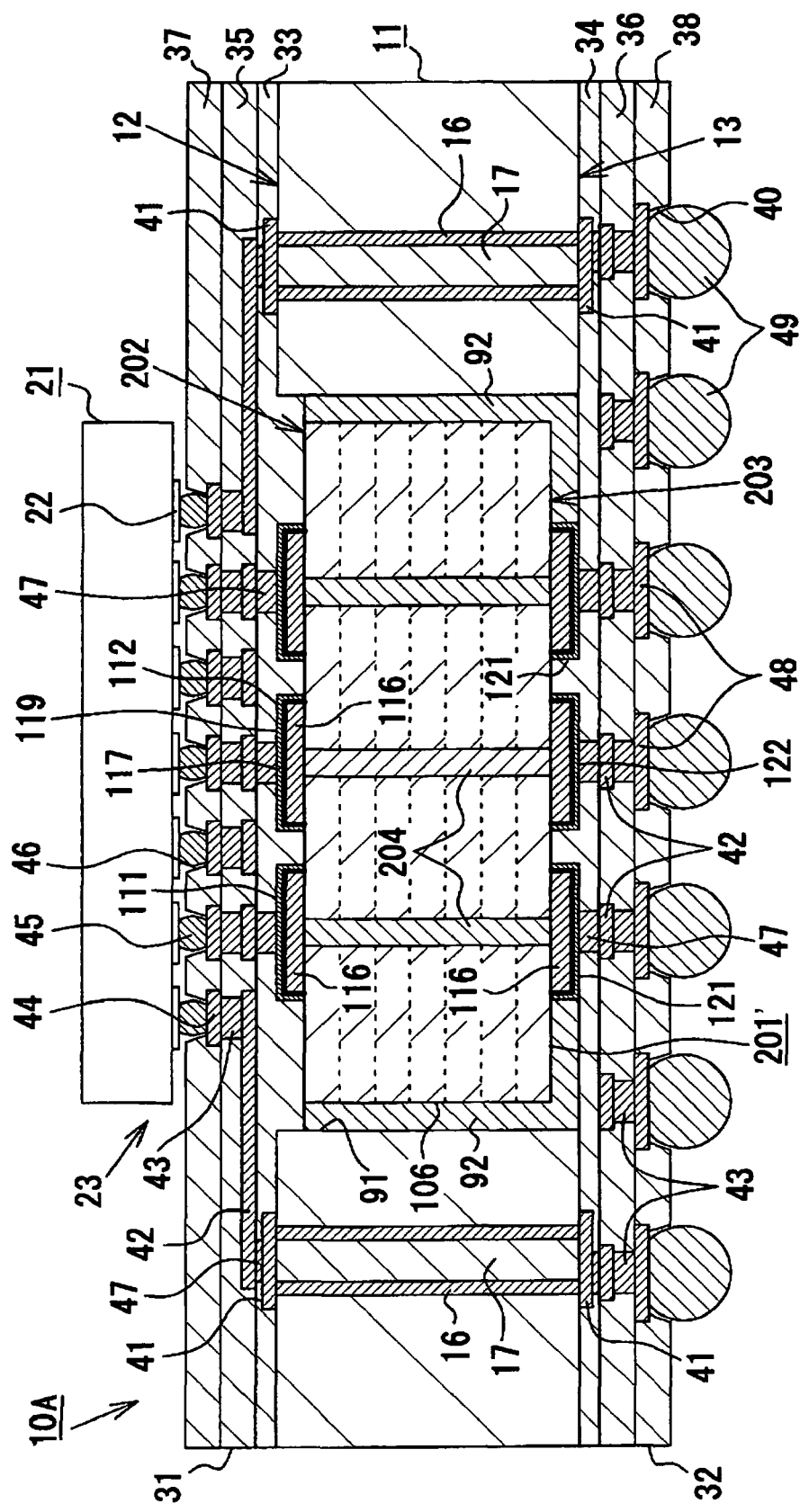
FIG. 33 is a schematic cross-sectional view illustrating the wiring board in accordance with a seventh embodiment.

As shown in FIG. 33, a wiring board 10A in accordance with this embodiment is provided with the ceramic chip 201' which does not have the function of a capacitor, instead of the ceramic capacitor 101' shown in the above-described sixth embodiment. The plurality of via conductors 204 penetrating the upper surface 202 (chip main surface) and the lower surface 203 are formed in the ceramic chip 201'. The metallized layers 116 of the first outer terminal electrodes 111 and 112 are provided on the upper surface 202, while the metallized layers 116 of the second outer terminal electrodes 121 and 122 are provided on the lower surface 203. It should be noted that the metallized layers 116 in this embodiment are formed of molybdenum as a principal constituent. Further, the nickel plating layer 119 and the copper plating layer 117 are sequentially laminated on the surface of each of the metallized layers 116. Accordingly, in this embodiment, it is possible to provide the wiring board 10A which excels in the adhesive strength between the ceramic chip 201' and the interlayer insulating layers 33 and 34 constituting the buildup layers 31 and 32.

Eighth Embodiment

Referring now to the drawings, a detailed description will be given of an eighth embodiment of the wiring board in accordance with the invention.

Figure 34:
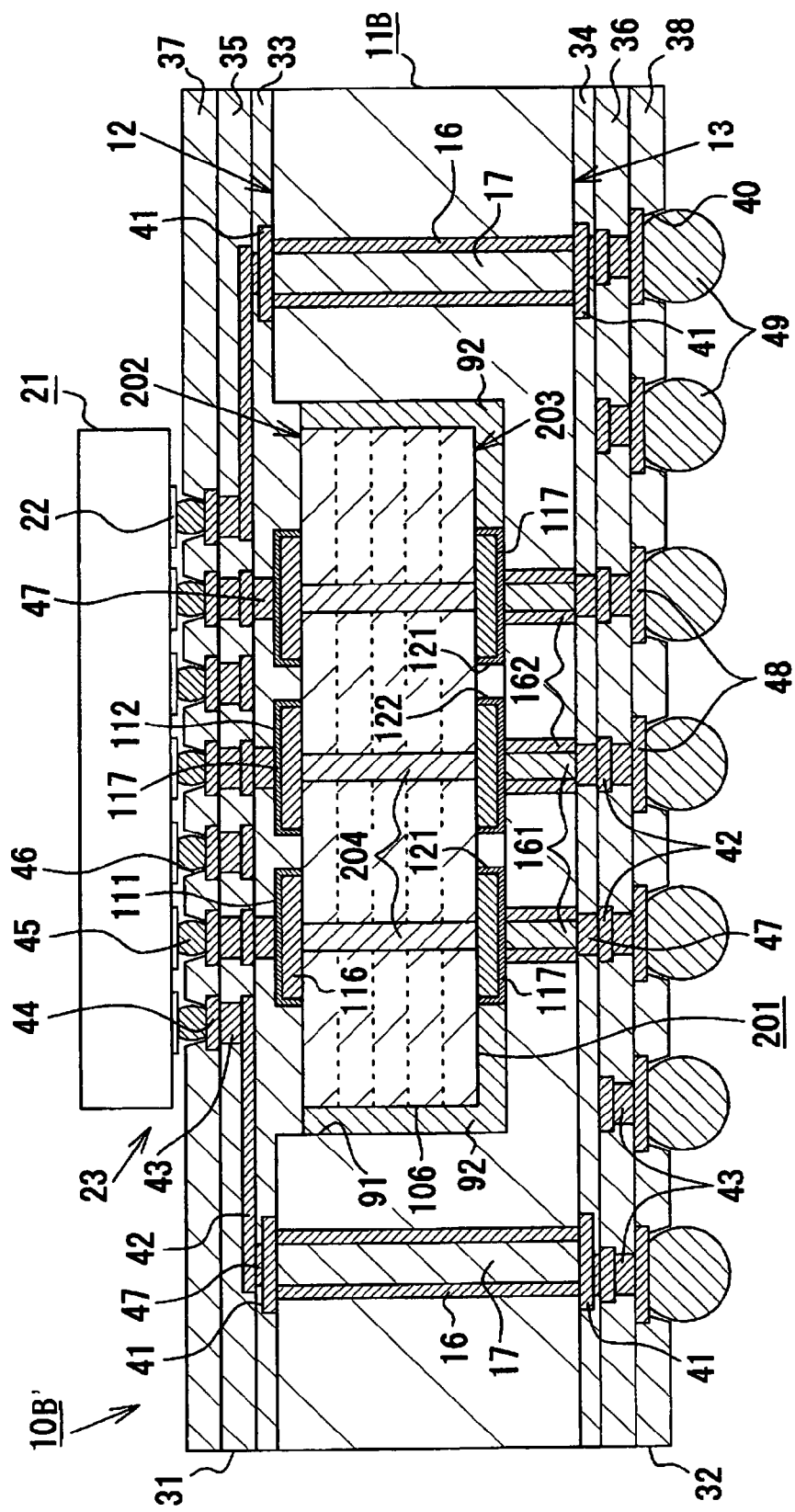
FIG. 34 is a schematic cross-sectional view illustrating the wiring board in accordance with an eighth embodiment.

As shown in FIG. 34, in the wiring board 10B' in accordance with this embodiment, the accommodating hole portion 91 of a board core 11B is a bottomed recessed portion (non-through hole portion) which is open only at the upper surface 12 of the board core 11B. Accordingly, the entire resin insulating layer 34 of the buildup layer 32 abuts against the lower surface 13 of the board core 11B. In addition, the ceramic chip 201 having a construction similar to that of the above-described seventh embodiment is provided in the accommodating hole portion 91. It should be noted that the resin insulating layer 34 and the ceramic chip 201 are electrically connected to each other via the plurality of via conductors 162 penetrating the bottom surface of the accommodating hole portion 91 and the lower surface 13 of the board core 11B. The interior of each of these via conductors 162 is filled with the conductor paste 161.

It should be noted that the sixth to eighth embodiments may be modified as follows.

In the above-described sixth to eighth embodiments, in the coarsening step, the coarsening of the surfaces of the conductor layers 41 is performed simultaneously with the coarsening of the surfaces of the copper plating layers 117. However, the coarsening of the conductor layers 41 may be performed separately from the coarsening of the copper plating layers 117.

Figure 35:
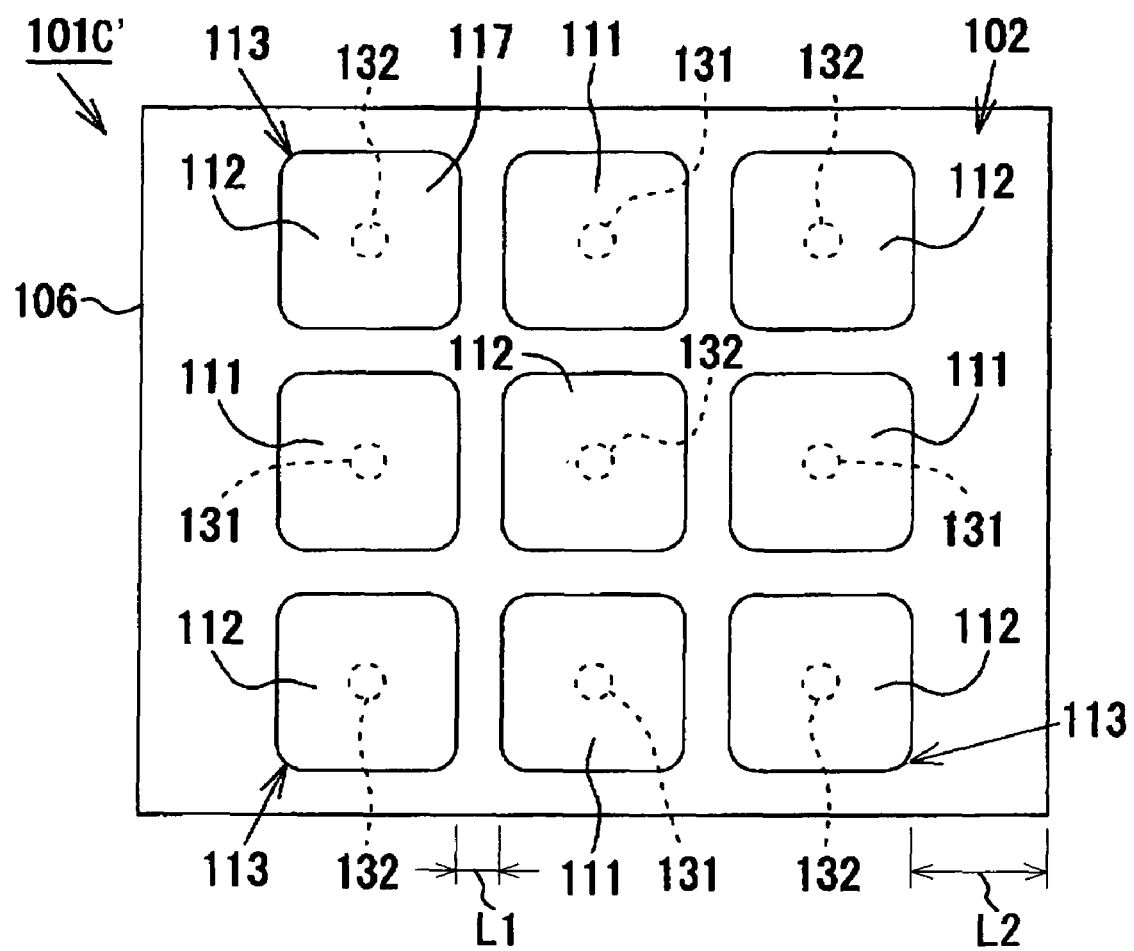
FIG. 35 is a schematic top view illustrating the ceramic capacitor in accordance with a further example.

In the above-described sixth to eighth embodiments, the outer shape of each of the outer terminal electrodes 111, 112, 121, and 122, when viewed in the direction perpendicular to the upper surface 102, is square. However, the outer shape of each of the outer terminal electrodes 111, 112, 121, and 122 may be a shape other than the square. For example, as in a ceramic capacitor 101C' in accordance with a further example shown in FIG. 35, the outer shape of each of the outer terminal electrodes 111, 112, 121, and 122 may be a substantially square shape having four rounded corners 113. If the construction is thus provided, when the resin insulating layers 33 and 34 constituting the buildup layers 31 and 32 are deformed, it is possible to alleviate the concentration of stress at the corner portions of the outer terminal electrodes 111, 112, 121, and 122. Hence, it is possible to prevent the occurrence of cracks in the resin insulating layers 33 and 34, and prevent the exfoliation of the resin insulating layers 33 and 34 ascribable to the cracks.

Figure 36:
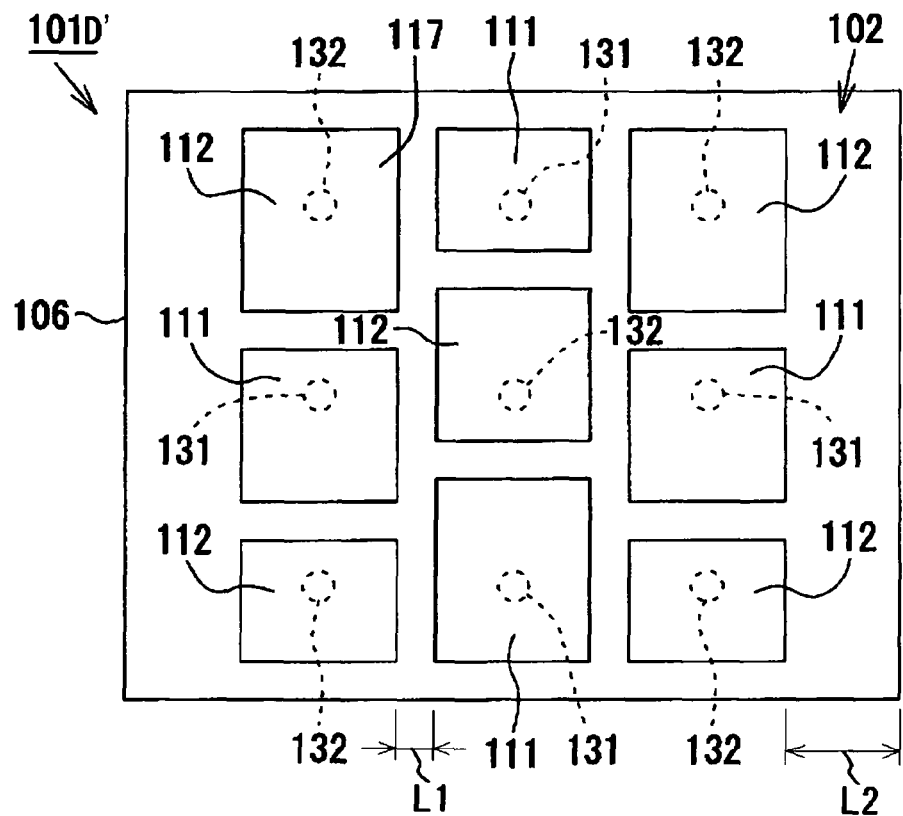
FIG. 36 is a schematic top view illustrating the ceramic capacitor in accordance with a still further example.

In the above-described sixth to eighth embodiments, the areas and shapes of the respective outer terminal electrodes 111, 112, 121, and 122 are uniform, but the areas and shapes of the respective outer terminal electrodes 111, 112, 121, and 122 may be nonuniform, as in a ceramic capacitor 101D' in accordance with a still further example shown in FIG. 36.

Instead of the filler 92 of the above-described sixth to eighth embodiments, a portion of the resin insulating layer 33 may be a filler. This becomes possible by effecting press lamination by using a resin film having fluidity when the resin insulating layer 33 constituting the first buildup layer 31 is formed. By so doing, even if the gaps between the inner surfaces of the accommodating hole portion 91 and the side surfaces 106 of the ceramic capacitor 101' are not filled in advance with the filler 92, the portion of the resin film enters the gaps, so that the portion of the resin film can be made to function as the filler. In addition, although in the above-described sixth to eighth embodiments the filler 92 is filled into the gaps by using the dispenser, the invention is not limited to the same, and the filler 92 may be printed and filled by using a printer, for example.

Figure 37:
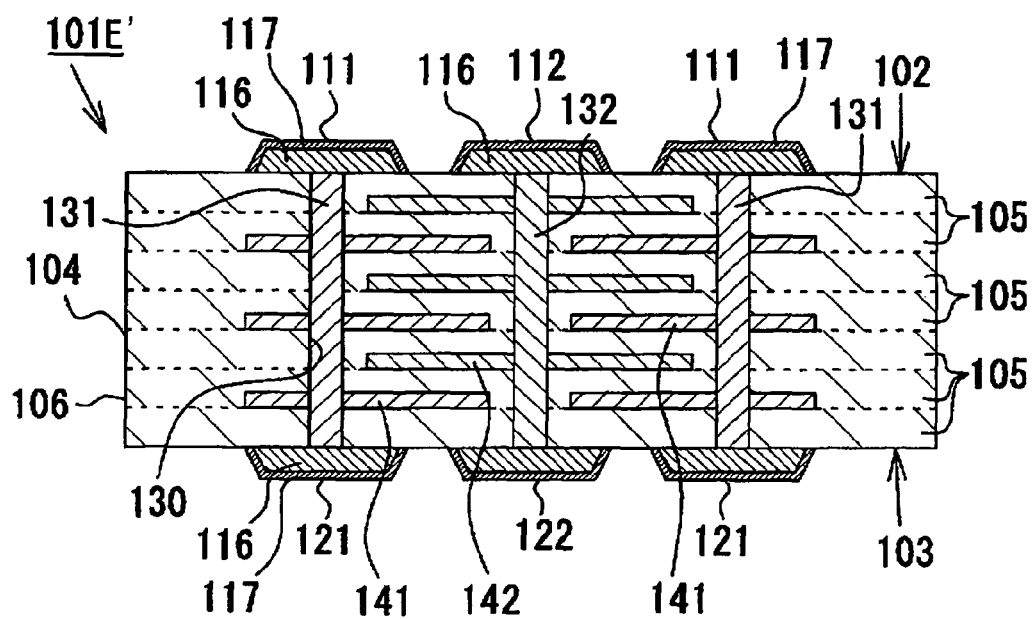
FIG. 37 is a schematic cross-sectional view illustrating the ceramic capacitor in accordance with a further example.
Figure 38:
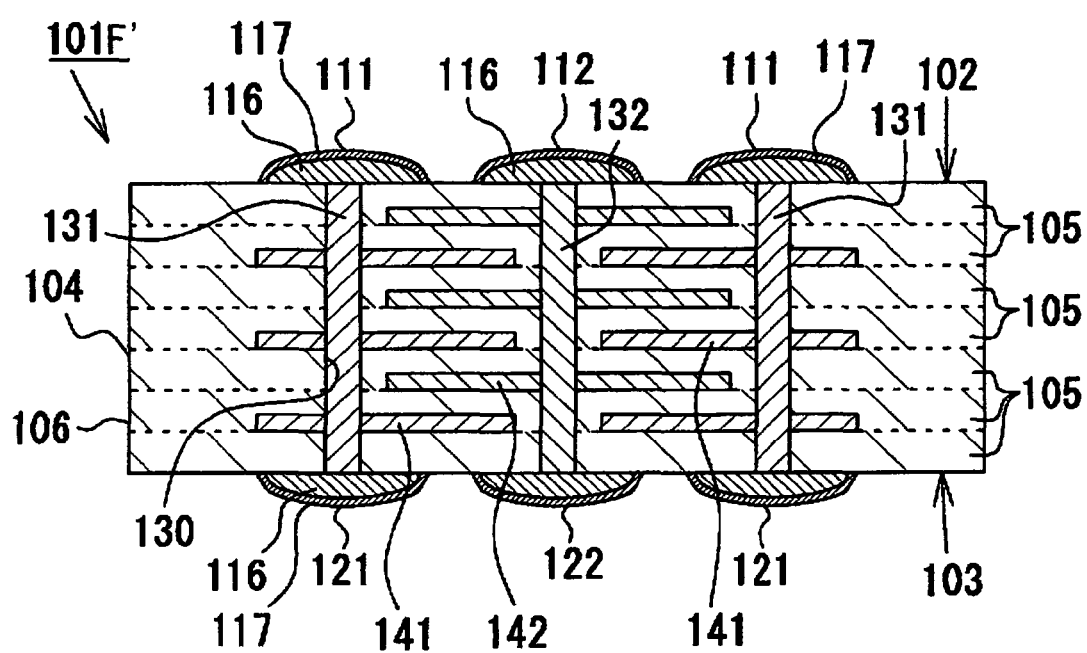
FIG. 38 is a schematic cross-sectional view illustrating the ceramic capacitor in accordance with a further example.

Although each of the outer terminal electrodes 111, 112, 121, and 122 in the above-described sixth to eighth embodiments has a rectangular vertical cross section in which the lengths of the outer side and the inner side are equal, as shown in FIG. 25, a different shape may be adopted. For example, in the ceramic capacitor 101E' in a further example shown in FIG. 37, each of the outer terminal electrodes 111, 112, 121, and 122 has a tapered vertical cross section in which the outer side is shorter than the inner side. In addition, in a ceramic capacitor 101F' in a further example shown in FIG. 38, each of the outer terminal electrodes 111, 112, 121, and 122 has a shape in which its surface is semispherical. If the electrode shapes such as those of FIGS. 37 and 38 are adopted, the resin of the resin insulating layers 33 and 34 easily flows into the recesses, thereby making it possible to easily attain improvement in the adhesion.

Although in the above-described sixth to eighth embodiments an example has been shown in which the ceramic chip is accommodated in the accommodating hole portion 91 of the board core 11, it is possible to adopt a construction in which an object to be accommodated which is other than a chip and whose principal constituent is a ceramic, e.g., a chip component having a plurality of terminal electrodes, is accommodated.

Next, technical concepts which are grasped by the above-described sixth to eighth embodiments will be enumerated below.

(1) A wiring board comprising: a board core formed of a polymeric material as a principal constituent into a plate-like shape and having a core main surface and an accommodating hole portion which is open at the core main surface; a ceramic chip for embedment including a plate-like ceramic sintered body having a chip main surface, inner conductors formed in an interior of the ceramic sintered body, and a plurality of terminal electrodes provided projectingly on the chip main surface and constituted by metallized layers conducting with the inner conductors, the ceramic chip for embedment being accommodated in the accommodating hole portion in a state in which the core main surface and the chip main surface are opposed to a same side; and a buildup layer having a structure in which an interlayer insulating layer formed of a polymeric material as a principal constituent and a conductor layer are alternately laminated on the core main surface and the chip main surface, a semiconductor device mounting portion being set on an obverse surface of the buildup layer, wherein the occupying area of the plurality of terminal electrodes which are present on the chip main surface is not less than 45% and not more than 90% of the area of the chip main surface.

(2) A wiring board according to the above-described wiring board (1) wherein a metal layer constituted of a metal softer than a metal constituting the plurality of terminal electrodes is formed on the plurality of terminal electrodes, and the metal layer is a copper plating layer with a thickness of not less than 5 μm.

(3) A wiring board comprising: a board core formed of a polymeric material as a principal constituent into a plate-like shape and having a core main surface, a core reverse surface, and an accommodating hole portion which is open at both the core main surface and the core reverse surface; a ceramic chip for embedment including a plate-like ceramic sintered body having a chip main surface and a chip reverse surface, inner conductors formed in an interior of the ceramic sintered body, a plurality of first terminal electrodes provided projectingly on the chip main surface and constituted by metallized layers conducting with the inner conductors, and a plurality of second terminal electrodes provided projectingly on the chip reverse surface and constituted by metallized layers conducting with the inner conductors, the ceramic chip for embedment being accommodated in the accommodating hole portion in a state in which the core main surface and the chip main surface are opposed to a same side; a first buildup layer having a structure in which an interlayer insulating layer formed of a polymeric material as a principal constituent and a conductor layer are alternately laminated on the core main surface and the chip main surface, a semiconductor device mounting portion being set on an obverse surface of the first buildup layer; and a second buildup layer having a structure in which an interlayer insulating layer formed of a polymeric material as a principal constituent and a conductor layer are alternately laminated on the core reverse surface and the chip reverse surface, wherein the occupying area of the plurality of terminal electrodes which are present on the chip main surface is not less than 45% and not more than 90% of the area of the chip main surface.

(4) A wiring board comprising: a board core having a core main surface and an accommodating hole portion which is open at the core main surface; a ceramic chip for embedment including a ceramic sintered body having a chip main surface, inner conductors formed in an interior of the ceramic sintered body, and a plurality of terminal electrodes provided projectingly on the chip main surface and constituted by metallized layers conducting with the inner conductors, the ceramic chip for embedment being accommodated in the accommodating hole portion in a state in which the core main surface and the chip main surface are opposed to a same side; a buildup layer in which an interlayer insulating layer and a conductor layer are alternately laminated on the core main surface and the chip main surface, wherein the ceramic chip for embedment is a ceramic capacitor of a structure in which first inner electrode layers and second inner electrode layers are alternately laminated and arranged via a ceramic dielectric layer, wherein the plurality of terminal electrodes consist of a group of first terminal electrodes conducting with the first inner electrode layers and a group of second terminal electrodes conducting with the second inner electrode layers, wherein the occupying area of the group of first terminal electrodes which are present on the chip main surface and the occupying area of the group of second terminal electrodes which are present on the chip main surface are equal, and wherein the occupying area of the group of first terminal electrodes and the group of second terminal electrodes which are present on the chip main surface is not less than 45% and not more than 90% of the area of the chip main surface.

(5) A method of manufacturing a wiring board, comprising the steps of preparing a board core having a core main surface and an accommodating hole portion which is open at the core main surface, and a ceramic chip for embedment having a metal layer formed on each of the plurality of terminal electrodes which are set such that an occupying area thereof becomes not less than 45% and not more than 90% of the area of the chip main surface; fixing the ceramic chip for embedment by accommodating the ceramic chip for embedment in the accommodating hole portion and by filling a gap between an inner surface of the accommodating hole portion and a side surface of the ceramic chip for embedment with a filler in this state; coarsening a surface of the metal layer; and forming the buildup layer on the core main surface and the chip main surface after the coarsening step, wherein, in the coarsening step, the metal layer is coarsened together with the conductor layers formed on the core main surface of the board core after the fixing step.

(6) A ceramic chip component for embedment which is a chip component for use in a state of being embedded in a board core formed of a polymeric material as a principal constituent, comprising: a plate-like component body having a chip main surface; inner conductors formed in an interior of the component body; and a plurality of terminal electrodes provided projectingly on the chip main surface and conducting with the inner conductors, wherein an occupying area of the plurality of terminal electrodes which are present on the chip main surface is not less than 45% and not more than 90% of an area of the chip main surface.

The present invention is not limited to the above-described contents of the embodiments, and the structure and materials, the arrangement of the respective members, and the like may be modified, as required, within the scope that does not depart from the gist of the invention.

This application is based on Japanese Patent Application JP 2005-228936, filed Aug. 5, 2005, Japanese Patent Application JP 2005-228937, filed Aug. 5, 2005, Japanese Patent Application JP 2005-267592, filed Sep. 14, 2005, Japanese Patent Application JP 2006-145724, filed May 25, 2006, and Japanese Patent Application JP 2006-145725, filed May 25, 2006, the entire contents of which are hereby incorporated by reference, the same as if set forth at length.

What is claimed is:

1. Capacitor comprising: a capacitor body including a plurality of laminated dielectric layers, a plurality of inner electrode layers which are respectively disposed between mutually adjacent ones of the dielectric layers, a first main surface located in a laminated direction of the dielectric layers, and a second main surface opposite to the first main surface;
   a first outer electrode formed on the first main surface of the capacitor body and electrically connected to the inner electrode layers;
   a second outer electrode formed on the second main surface of the capacitor body and electrically connected to the inner electrode layers;
   a first dummy electrode formed on the first main surface of the capacitor body and which is not in contact with the inner electrode layers; and
   a second dummy electrode formed on the second main surface of the capacitor body and which is not in contact with the inner electrode layers.

2. The capacitor according to claim 1, wherein a shape of the first dummy electrode and a shape of the second dummy electrode are substantially identical, and the first dummy electrode and the second dummy electrode are disposed so as to be symmetrical in the laminated direction.

3. The capacitor according to claim 1, wherein the first dummy electrode is spaced apart from the first outer electrode, and the second dummy electrode is spaced apart from the second outer electrode.

4. The capacitor according to claim 1, wherein a total of an area of a surface of the first outer electrode and an area of a surface of the first dummy electrode is not less than 45% and not more than 90% of an area of the first main surface, and a total of an area of a surface of the second outer electrode and an area of a surface of the second dummy electrode is not less than 45% and not more than 90% of an area of the second main surface.

5. A wiring board comprising: a wiring board body; a buildup layer which is formed on the wiring board body and on which a plurality of insulating layers and a plurality of wiring layers are alternately formed; and the capacitor according to claim 1.

6. The wiring board according to claim 5, wherein the capacitor is disposed within the thickness of the insulating layers.

7. A plurality of first outer electrodes, including the first outer electrode, formed on the first main surface of the capacitor body and each of the plurality of first outer electrodes electrically connected to the inner electrode layers;
a plurality of second outer electrodes, including the second outer electrode, formed on the second main surface of the capacitor body and each of the plurality of second outer electrodes electrically connected to the inner electrode layers;
a plurality of first dummy electrodes, including the first dummy electrode, formed on the first main surface of the capacitor body; and which are not in contact with the inner electrode layers; and
a plurality of second dummy electrodes, including the second dummy electrode, formed on the second main surface of the capacitor body and which are not in contact with the inner electrode layers,
wherein each of the plurality of first outer electrodes is disposed adjacent to one of the plurality of first dummy electrodes such that at least one of the plurality of first dummy electrodes is disposed between two of the plurality of first outer electrodes, and
each of the plurality of second outer electrodes is disposed adjacent to one of the plurality of second dummy electrodes such that at least one of the plurality of second dummy electrodes is disposed between two of the plurality of second outer electrodes.

8. The capacitor according to claim 7, wherein a shape of the first dummy electrode and a shape of the second dummy electrode are substantially identical, and the first dummy electrode and the second dummy electrode are disposed so as to be symmetrical in the laminated direction.

9. The capacitor according to claim 1, wherein the first main surface is an upper outer surface of the capacitor body and the second main surface is a lower outer surface of the capacitor body.

10. The capacitor according to claim 1, wherein the first dummy electrode and the second dummy electrode are formed above the first main surface and the second main surface, respectively, and the first and second main surfaces are orthogonal to the laminated direction of the capacitor.

11. A wiring board comprising: a board core having a core main surface and an accommodating hole portion which is open at the core main surface;
a ceramic chip for embedment including a ceramic sintered body having a chip main surface, inner conductors formed in an interior of the ceramic sintered body, a plurality of terminal electrodes provided projecting on the chip main surface and a bottom surface and constituted by metalized layers conducting with the inner conductors, and dummy metalized layers provided projecting on the chip main surface and the bottom surface and which are not in contact with the inner conductors respectively, the ceramic chip for embedment being accommodated in the accommodating hole portion of the board core in a state in which the core main surface and the chip main surface are opposed to a same side; and
a buildup layer having a structure in which an interlayer insulating layer and a conductor layer are alternately laminated on the core main surface and the chip main surface.

12. The wiring board according to claim 11, wherein surfaces of the plurality of terminal electrodes and the dummy metallized layer are coarser than the chip main surface of the ceramic sintered body.

13. The wiring board according to claim 11, wherein a metal layer constituted of a metal softer than a metal constituting the plurality of terminal electrodes and the dummy metallized layer is formed on a surface of each of the plurality of terminal electrodes and the dummy metallized layer, and the surface roughness Ra of the metal layer is not less than 0.2 μm.

14. The wiring board according to claim 13, wherein the metal layer is a copper plating layer.

15. The wiring board according to claim 11, wherein the ceramic chip for embedment is a ceramic capacitor having a structure in which first inner electrode layers and second inner electrode layers are alternately laminated and arranged via a ceramic dielectric layer.

16. The wiring board according to claim 11, wherein a distance between adjacent ones of the plurality of terminal electrodes is not more than 200 μm.

17. The wiring board according to claim 11, wherein a distance between each of the plurality of terminal electrodes and the dummy metallized layer is not more than 200 μm.

18. The wiring board according to claim 11, wherein recessed portions which are respectively formed between the adjacent ones of the plurality of terminal electrodes and between each of the plurality of terminal electrodes and the dummy metallized layer on the chip main surface are filled by the interlayer insulating layer.

19. A method of manufacturing the wiring board according to claim 11, comprising the steps of: preparing the board core having the accommodating hole portion and the ceramic chip for embedment with the metal layer formed on each of the plurality of terminal electrodes and the dummy metallized layer; fixing the ceramic chip for embedment by accommodating the ceramic chip for embedment in the accommodating hole portion and by filling a gap between an inner surface of the accommodating hole portion and a side surface of the ceramic chip for embedment with a filler in this state; coarsening a surface of the metal layer; and forming the buildup layer on the core main surface and the chip main surface after the coarsening step.

20. The wiring board according to claim 11, wherein the ceramic chip further comprises a plurality of dummy metallized layers provided projectingly on the chip main surface and spaced apart from the terminal electrodes, and each of the plurality of terminal electrodes is disposed adjacent to one of the plurality of dummy metallized layers such that at least one of the plurality of dummy metallized layers is disposed between two of the plurality of terminal electrodes.

21. The wiring board according to claim 11, wherein the ceramic chip is fixed to the board core by a resin filler to be filled into gaps between the inner surfaces of the accommodating hole portion and the side surfaces of the ceramic chip, and the interlayer insulating layer is brought into contact with both of the core main surface and the chip main surface.

22. The wiring board according to claim 21, wherein the dummy metallized layer is a one-piece integral member of a shape having at least one opening portion, and is formed so as to surround the plurality of terminal electrodes.

23. The wiring board according to claim 22, wherein the plurality of terminal electrodes and the dummy metallized layer are constituted by metallized layers constituted of sintered metal formed of nickel as a principal constituent, and a copper plating layer constituted of copper plating that is softer than nickel constituting the metallized layers, a surface of the copper plating layer being coarsened and covering the metallized layers.

24. The wiring board according to claim 23, wherein recessed portions which are respectively formed above the chip main surface between the adjacent ones of the plurality of terminal electrodes and between each of the plurality of terminal electrodes and the dummy metallized layer on the chip main surface, and a coarse surface of the copper plating layer, are filled by the interlayer insulating layer.

25. A ceramic chip for embedment which is a ceramic chip for use in a state of being embedded in a board core formed of a polymeric material as a principal constituent, comprising:
    a plate-like ceramic sintered body having a chip main surface;
inner conductors formed in an interior of the ceramic sintered body;
    a plurality of terminal electrodes provided projecting on the chip main surface and constituted by metalized layers conducting with the inner conductors; and
    first and second dummy metalized layers provided projecting on the chip main surface and a bottom surface and which are not in contact with the inner conductors.

26. The ceramic capacitor for embedment according to claim 25, wherein surfaces of the plurality of terminal electrodes and the dummy metallized layer are coarser than the chip main surface of the ceramic sintered body.

27. The ceramic capacitor for embedment according to claim 25, wherein a metal layer constituted of a metal softer than a metal constituting the plurality of terminal electrodes and the dummy metallized layer is formed on a surface of each of the plurality of terminal electrodes and the dummy metallized layer, and the surface roughness Ra of the metal layer is not less than 0.2 µm.

28. The ceramic capacitor for embedment according to claim 27, wherein the metal layer is a copper plating layer.

29. The ceramic capacitor for embedment according to claim 25, wherein the ceramic capacitor has a structure in which first inner electrode layers and second inner electrode layers are alternately laminated and arranged via a ceramic dielectric layer.

30. The ceramic capacitor for embedment according to claim 25, wherein a distance between adjacent ones of the plurality of terminal electrodes is not more than 200 µm.

31. The ceramic chip for embedment according to claim 25, wherein a distance between each of the plurality of terminal electrodes and the dummy metallized layer is not more than 200 µm.

32. The ceramic chip according to claim 25, further comprising a plurality of dummy metallized layers provided projectingly on the chip main surface and spaced apart from the terminal electrodes, and each of the plurality of terminal electrodes is disposed adjacent to one of the plurality of dummy metallized layers such that at least one of the plurality of dummy metallized layers is disposed between two of the plurality of terminal electrodes.

33. The ceramic chip according to claim 25, wherein the ceramic chip is accommodated in an accommodating hole portion of a board core having a core main surface and the accommodating hole portion that is opened on the core main surface, being fixed to the board core by a resin filler to be filled into gaps between inner surfaces of the accommodating hole portion and chip side surfaces, and being provided with a buildup layer having a structure in which an interlayer insulating layer and a conductor layer are alternately laminated on the core main surface and the chip main surface, the interlayer insulating layer being brought into contact with both of the core main surface and the chip main surface,
    the dummy metallized layer is a one-piece integral member of a shape having at least one opening portion, and is formed so as to surround the plurality of terminal electrodes,
    the plurality of terminal electrodes and the dummy metallized layer are constituted by metallized layers constituted of sintered metal formed of nickel as a principal constituent, and a copper plating layer constituted of copper plating that is softer than nickel constituting the metallized layers, a surface of the copper plating layer being coarsened and covering the metallized layer, and
    the ceramic chip for embedment is used in a state in which recessed portions which are respectively formed above the chip main surface between the adjacent ones of the plurality of terminal electrodes and between each of the plurality of terminal electrodes and the dummy metallized layer on the chip main surface are filled by the interlayer insulating layer, and in a state in which a coarse surface is formed on the copper plating layer and the coarse surface is filled by the interlayer insulating layer.

34. A wiring board comprising: a board core having a core main surface and an accommodating hole portion which is open at the core main surface; a ceramic chip for embedment including a ceramic sintered body having a chip main surface, inner conductors formed in an interior of the ceramic sintered body, and a plurality of terminal electrodes provided projectingly on the chip main surface and constituted by metallized layers conducting with the inner conductors, the ceramic chip for embedment being accommodated in the accommodating hole portion in a state in which the core main surface and the chip main surface are opposed to a same side; and a buildup layer in which an interlayer insulating layer and a conductor layer are alternately laminated on the core main surface and the chip main surface, wherein an occupying area of the plurality of terminal electrodes which are present on the chip main surface is not less than 45% and not more than 90% of an area of the chip main surface.

35. The wiring board according to claim 34, wherein surfaces of the plurality of terminal electrodes are coarser than the chip main surface of the ceramic sintered body.

36. The wiring board according to claim 35, wherein a metal layer constituted of a metal softer than a metal constituting the plurality of terminal electrodes is formed on a surface of each of the plurality of terminal electrodes, and the surface roughness Ra of the metal layer is not less than 0.2 µm.

37. The wiring board according to claim 36, wherein the metal layer is a copper plating layer.

38. The wiring board according to claim 34, wherein an outer shape of each of the plurality of terminal electrodes, as viewed in a direction toward the chip main surface, is substantially rectangular.

39. The wiring board according to claim 34, wherein the ceramic chip for embedment is a ceramic capacitor having a structure in which first inner electrode layers and second inner electrode layers are alternately laminated and arranged via a ceramic dielectric layer.

40. The wiring board according to claim 34, wherein a distance from a chip edge of the ceramic capacitor to each of the plurality of terminal electrodes is not more than 200 μm.

41. The wiring board according to claim 34, wherein a distance between adjacent ones of the plurality of terminal electrodes is not more than 200 μm.

42. The wiring board according to claim 34, wherein an occupying area of an exposed portion of a ceramic in the chip main surface is not less than 10% and not more than 55% of an area of the chip main surface.

43. The wiring board according to claim 34, wherein recessed portions which are respectively formed between the adjacent ones of the plurality of terminal electrodes on the chip main surface are filled by the interlayer insulating layer.

44. A method of manufacturing the wiring board according to claim 34, comprising the steps of: preparing the board core having the accommodating hole portion and the ceramic chip for embedment with the metal layer formed on each of the plurality of terminal electrodes which are set such that an occupying area thereof becomes not less than 45% and not more than 90% of the area of the chip main surface; fixing the ceramic chip for embedment by accommodating the ceramic chip for embedment in the accommodating hole portion and by filling a gap between an inner surface of the accommodating hole portion and a side surface of the ceramic chip for embedment with a filler in this state; coarsening a surface of the metal layer; and forming the buildup layer on the core main surface and the chip main surface after the coarsening step.

* * * * *